US010431619B2

(12) United States Patent
Masagaki et al.

(10) Patent No.: US 10,431,619 B2
(45) Date of Patent: Oct. 1, 2019

(54) SOLID-STATE IMAGE PICKUP DEVICE HAVING A PIXEL SEPARATION WALL

(71) Applicant: SONY CORPORATION, Tokyo (JP)

(72) Inventors: Atsushi Masagaki, Kanagawa (JP); Yusuke Tanaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/559,541

(22) PCT Filed: Jan. 13, 2017

(86) PCT No.: PCT/JP2017/000923
§ 371 (c)(1),
(2) Date: Sep. 19, 2017

(87) PCT Pub. No.: WO2017/130723
PCT Pub. Date: Aug. 3, 2017

(65) Prior Publication Data
US 2018/0350856 A1    Dec. 6, 2018

(30) Foreign Application Priority Data
Jan. 27, 2016   (JP) ................................. 2016-013613

(51) Int. Cl.
*H01L 27/146*  (2006.01)
*G02B 7/34*  (2006.01)
(Continued)

(52) U.S. Cl.
CPC ............ *H01L 27/1463* (2013.01); *G02B 7/34* (2013.01); *H01L 21/76* (2013.01);
(Continued)

(58) Field of Classification Search
CPC ......... H01L 27/14605; H01L 27/14607; H01L 27/14621; H01L 27/14627; H01L 27/1463; H01L 27/1464; H01L 27/14641
See application file for complete search history.

(56) References Cited

U.S. PATENT DOCUMENTS

2009/0256226 A1   10/2009   Tatani et al.
2010/0225793 A1   9/2010   Matsuda et al.
(Continued)

FOREIGN PATENT DOCUMENTS

JP   2000-292685    10/2000
JP   2006-086226 A   3/2006
(Continued)

OTHER PUBLICATIONS

International Search Report prepared by the Japan Patent Office dated Feb. 16, 2017, for International Application No. PCT/JP2017/000923.
(Continued)

*Primary Examiner* — Hoai V Pham
(74) *Attorney, Agent, or Firm* — Sheridan Ross P.C.

(57) ABSTRACT

The present disclosure relates to a solid-state image pickup device and an electronic apparatus that are capable of preventing leakage of charges between adjacent pixels. A plurality of pixels perform photoelectric conversion on light incident from a back surface via different on-chip lenses for each pixel. A pixel separation wall is formed between pixels adjacent to each other, and includes a front-side trench formed from a front surface and a backside trench formed from the back surface. A wiring layer is provided on the front surface. The present disclosure is applicable to, for example, a backside illuminated CMOS image sensor.

22 Claims, 42 Drawing Sheets

(51) Int. Cl.
*H01L 21/76* (2006.01)
*H04N 5/3745* (2011.01)
*H04N 5/359* (2011.01)
*H04N 5/374* (2011.01)

(52) U.S. Cl.
CPC .. *H01L 27/14605* (2013.01); *H01L 27/14607* (2013.01); *H01L 27/14621* (2013.01); *H01L 27/14627* (2013.01); *H01L 27/14641* (2013.01); *H01L 27/1464* (2013.01); *H01L 27/14612* (2013.01); *H04N 5/359* (2013.01); *H04N 5/374* (2013.01); *H04N 5/37457* (2013.01)

(56) References Cited

U.S. PATENT DOCUMENTS

| | | |
|---|---|---|
| 2011/0079866 A1 | 4/2011 | Nishizawa et al. |
| 2012/0009720 A1 | 1/2012 | Shim et al. |
| 2013/0083225 A1 | 4/2013 | Minowa et al. |
| 2014/0054662 A1 | 2/2014 | Yanagita et al. |
| 2014/0160335 A1 | 6/2014 | Shimotsusa |
| 2015/0243694 A1 | 8/2015 | Ihara |
| 2015/0373255 A1 | 12/2015 | Kim et al. |
| 2016/0234449 A1 | 8/2016 | Ishiwata |
| 2018/0240847 A1* | 8/2018 | Ota ................. H01L 21/76898 |

FOREIGN PATENT DOCUMENTS

| | | |
|---|---|---|
| JP | 2009-272597 A | 11/2009 |
| JP | 2010-239117 A | 10/2010 |
| JP | 2010-258157 A | 11/2010 |
| JP | 2011-082253 A | 4/2011 |
| JP | 2012-015160 A | 1/2012 |
| JP | 2013-080797 A | 5/2013 |
| JP | 2013-175494 A | 9/2013 |
| JP | 2014-116472 | 6/2014 |
| JP | 2015-023259 A | 2/2015 |
| JP | 2015-065269 A | 4/2015 |

OTHER PUBLICATIONS

Extended European Search Report for European Patent Application No. 17743954.4, dated Jul. 30, 2019, 8 pages.

* cited by examiner

SOLID-STATE IMAGE PICKUP DEVICE HAVING A PIXEL SEPARATION WALL

CROSS REFERENCE TO RELATED APPLICATIONS

This application is a national stage application under 35 U.S.C. 371 and claims the benefit of PCT Application No. PCT/JP2017/000923 having an international filing date of 13 Jan. 2017, which designated the United States, which PCT application claimed the benefit of Japanese Patent Application No. 2016-013613 filed 27 Jan. 2016, the disclosures of which are incorporated herein by reference in their entirety.

TECHNICAL FIELD

The present disclosure relates to a solid-state image pickup device and an electronic apparatus, and particularly to a solid-state image pickup device and an electronic apparatus that are capable of preventing leakage of charges between adjacent pixels.

BACKGROUND ART

In the past, solid-state image pickup devices such as a CCD (Charge Coupled Device) image sensor and a CMOS (Complementary Metal Oxide Semiconductor) image sensor are used in an electronic apparatus having an imaging function such as a digital still camera and a digital video camera. The solid-state image pickup device has a pixel in which a photodiode (photoelectric conversion device) that performs photoelectric conversion and a transistor are combined, and an image is constructed on the basis of pixel signals output from a plurality of pixels arranged in a plane.

For example, in the solid-state image pickup device, charges stored in the photodiode (PD) are transferred to an FD (floating diffusion) portion having a predetermined capacitance provided at a connection portion between the PD and a gate electrode of an amplification transistor. Then, a pixel signal corresponding to the amount of charges stored in the FD portion is read from the pixel, is subjected to AD conversion by an AD (Analog Digital) conversion circuit having a comparator, and output.

Further, in recent years, a technology of detecting a phase by using a part of pixels of a CMOS image sensor to improve the AF (autofocus) speed, so-called image plane phase difference AF, has become widespread. Examples of a system of the image plane phase difference AF include a PD division system (see, for example, Patent Literature 1). In the PD division system, the PD of the pixel is divided into a plurality of parts, phase information is generated on the basis of pixel signals acquired by each of the divided PDs, and distance measurement is performed on the basis of the phase information.

CITATION LIST

Patent Literature

Patent Literature 1: Japanese Patent Application Laid-open No. 2000-292685

DISCLOSURE OF INVENTION

Technical Problem

Meanwhile, when intense light enters a pixel, a phenomenon called color mixture in which charges stored in the PD of the pixel saturate, overflow, and leak to the adjacent pixel occurs in some cases. Since the amount of charges corresponding to the pixel signal read from the adjacent pixel is larger than the original amount of charges when leakage color mixture occurs, which leads to degradation of imaging characteristics.

The present disclosure has been made in view of the above circumstances to prevent leakage of charges between adjacent pixels.

Solution to Problem

A solid-state image pickup device according to a first aspect of the present disclosure is a solid-state image pickup device, including: a plurality of pixels that perform photoelectric conversion on light, the light entering the respective pixels from a back surface of the solid-state image pickup device via different lenses for each pixel; a pixel separation wall formed between the pixels adjacent to each other; and a wiring layer provided on a front surface of the solid-state image pickup device, in which the pixel separation wall includes a front-side trench formed from the front surface and a backside trench formed from the back surface.

In the first aspect of the present disclosure, a plurality of pixels that perform photoelectric conversion on light, the light entering the respective pixels from a back surface of the solid-state image pickup device via different lenses for each pixel; a pixel separation wall formed between the pixels adjacent to each other; and a wiring layer provided on a front surface of the solid-state image pickup device are provided, in which the pixel separation wall includes a front-side trench formed from the front surface and a backside trench formed from the back surface.

An electronic apparatus according to a second aspect of the present disclosure is an electronic apparatus, including: a solid-state image pickup device including a plurality of pixels that perform photoelectric conversion on light, the light entering the respective pixels from a back surface of the solid-state image pickup device via different lenses for each pixel, a pixel separation wall formed between the pixels adjacent to each other, and a wiring layer provided on a front surface of the solid-state image pickup device, in which the pixel separation wall includes a front-side trench formed from the front surface and a backside trench formed from the back surface.

In the second aspect of the present disclosure, a solid-state image pickup device including a plurality of pixels that perform photoelectric conversion on light, the light entering the respective pixels from a back surface of the solid-state image pickup device via different lenses for each pixel, a pixel separation wall formed between the pixels adjacent to each other, and a wiring layer provided on a front surface of the solid-state image pickup device is provided in which the pixel separation wall includes a front-side trench formed from the front surface and a backside trench formed from the back surface.

Advantageous Effects of Invention

In accordance with the first aspect and the second aspect of the present disclosure, it is possible to pick up an image. Further, in accordance with the first aspect and the second aspect of the present disclosure, it is possible to prevent leakage of charges between adjacent pixels.

It should be noted that the effect described here is not necessarily limitative and may be any effect described in the present disclosure.

MODE(S) FOR CARRYING OUT THE INVENTION

Hereinafter, embodiments for carrying out the present disclosure (hereinafter, referred to as "embodiments") will be described. Note that description will be made in the following order.

1. First Embodiment: CMOS Image Sensor (FIG. 1 to FIG. 6)

2. Second Embodiment: CMOS Image Sensor (FIG. 7 to FIG. 14)

3. Third Embodiment: CMOS Image Sensor (FIG. 15 to FIG. 40)

Figure 41:
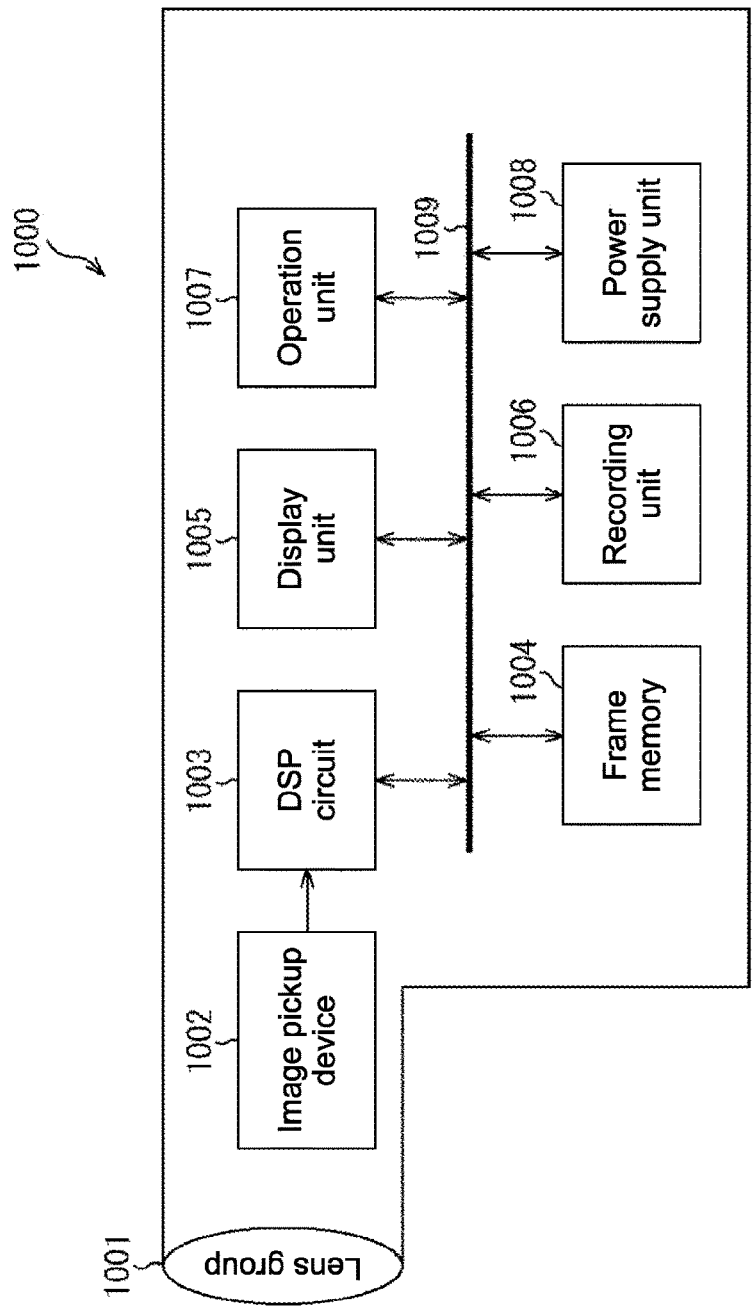
FIG. 41 is a block diagram showing a configuration example of an imaging apparatus as an electronic apparatus to which the present disclosure is applied.

4. Fourth Embodiment: Imaging Apparatus (FIG. 41)

Figure 42:
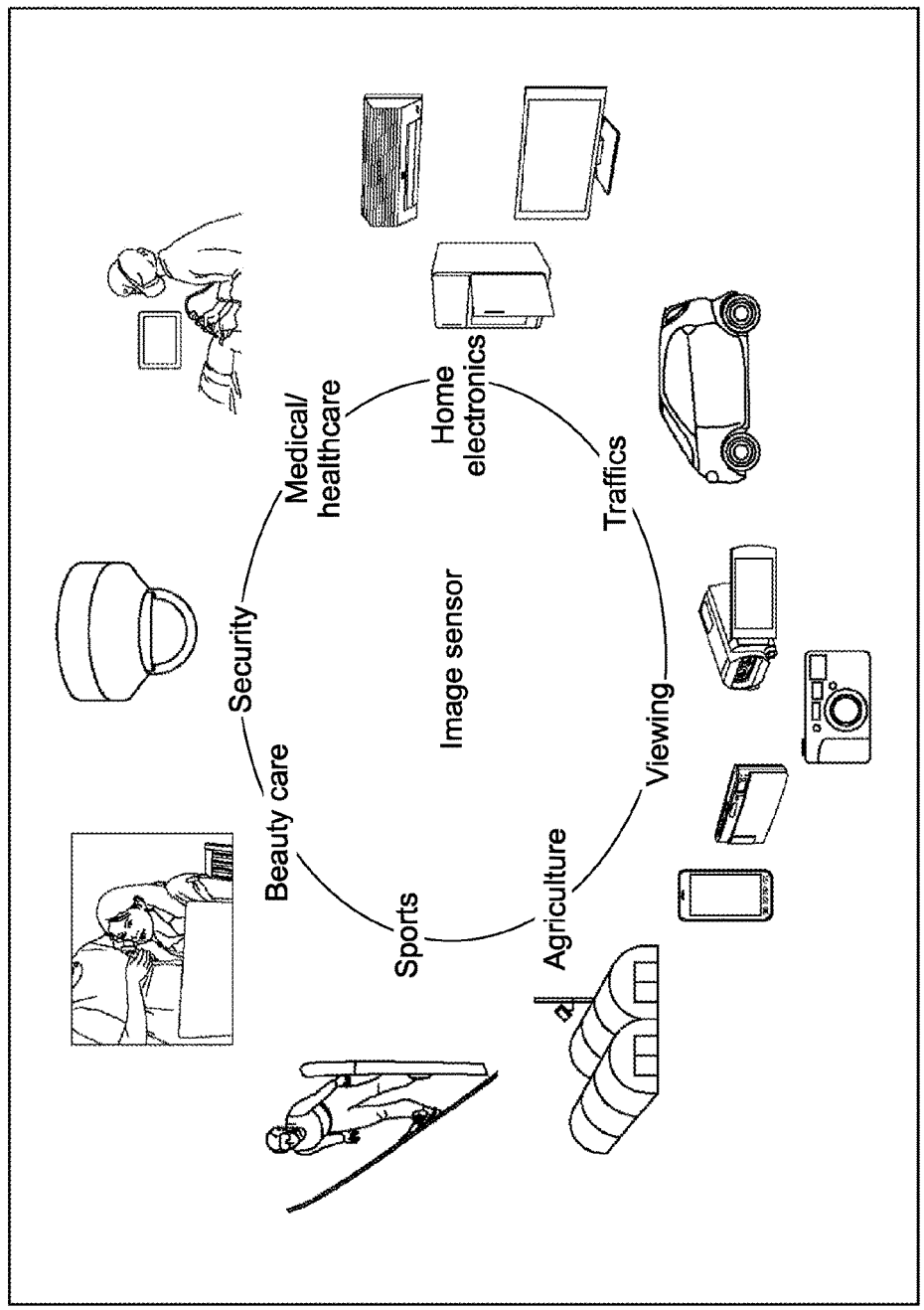
FIG. 42 is a diagram showing a use example using the above-mentioned CMOS image sensor.

5. Use Example of CMOS Image Sensor (FIG. 42)

First Embodiment (Configuration Example of First Embodiment of CMOS Image Sensor)

Figure 1:
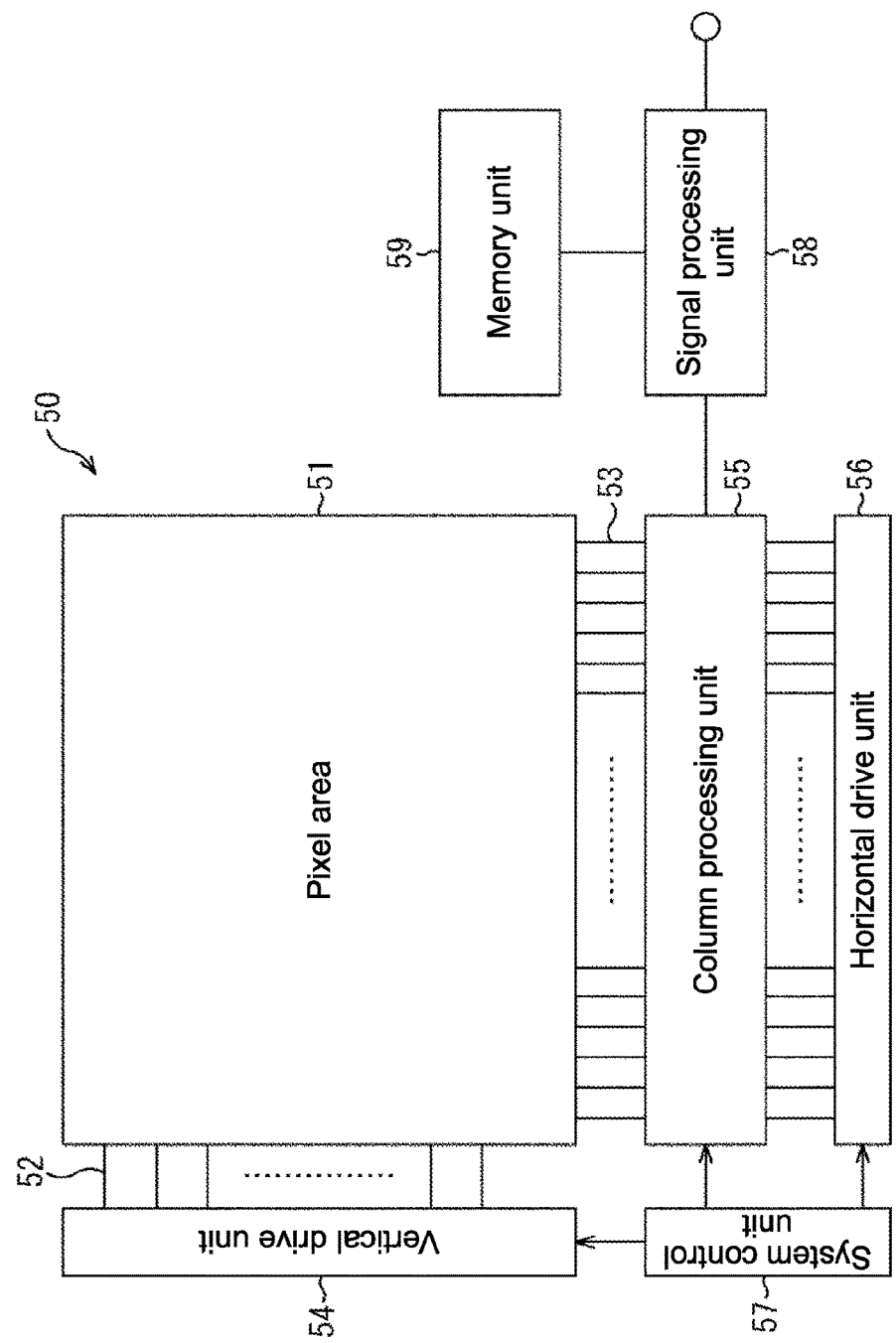
FIG. 1 is a block diagram showing a configuration example of a first embodiment of a CMOS image sensor as a solid-state image pickup device to which the present disclosure is applied.

FIG. 1 is a block diagram showing a configuration example of a first embodiment of a CMOS image sensor as a solid-state image pickup device to which the present disclosure is applied.

A CMOS image sensor 50 includes a pixel area 51, a pixel drive line 52, a vertical signal line 53, a vertical drive unit 54, a column processing unit 55, a horizontal drive unit 56, a system control unit 57, a signal processing unit 58, and a memory unit 59 that are formed on a semiconductor substrate (chip) such as a silicon substrate (not shown). The CMOS image sensor 50 is a backside illuminated CMOS image sensor in which the front surface to be irradiated with light is the back surface opposed to the front surface on which a wiring layer is provided.

On the pixel area 51 of the CMOS image sensor 50, a plurality of pixels each having a PD that photoelectrically converts light that has entered from the back surface and stores charges are two-dimensionally arranged in an array, and an image is picked up. The array of color filters of each pixel of the pixel area 51 is a Bayer array. Further, in the pixel area 51, the pixel drive line 52 is formed for every two rows with respect to the pixel, and the vertical signal line 53 is formed for every two columns.

The vertical drive unit 54 includes a shift register, an address decoder, and the like, and supplies a drive signal to the pixel drive line 52 so that the pixel signals corresponding to the charges stored in the PD of each pixel of the pixel area 51 are sequentially read from the top in units of rows in the order of the odd-numbered column and the even-numbered column.

The column processing unit 55 includes a signal processing circuit for every two columns of pixels of the pixel area 51. Each signal processing circuit of the column processing unit 55 performs signal processing such as A/D conversion processing and CDS (Correlated Double Sampling) processing on a pixel signal read from the pixel and supplied through the vertical signal line 53. The column processing unit 55 temporarily holds the pixel signal after signal processing.

The horizontal drive unit 56 includes a shift register, an address decoder, and the like, and sequentially selects the signal processing circuit of the column processing unit 55. As a result, the pixel signals processed in the respective signal processing circuits of the column processing unit 55 are sequentially output to the signal processing unit 58.

The system control unit 57 includes a timing generator that generates various timing signals, and the like, and controls the vertical drive unit 54, the column processing unit 55, and the horizontal drive unit 56 on the basis of various timing signals generated by the timing generator.

The signal processing unit 58 performs various types of signal processing on the pixel signal output from the column processing unit 55. At this time, the signal processing unit 58 stores intermediate results of signal processing, and the like in the memory unit 59 as necessary, and refers to the results at necessary timing. The signal processing unit 58 outputs the pixel signal after signal processing.

The memory unit 59 includes a DRAM (Dynamic Random Access Memory), SRAM (Static Random Access Memory), or the like.

(Circuit Configuration Example of Pixel Group)

Figure 2:
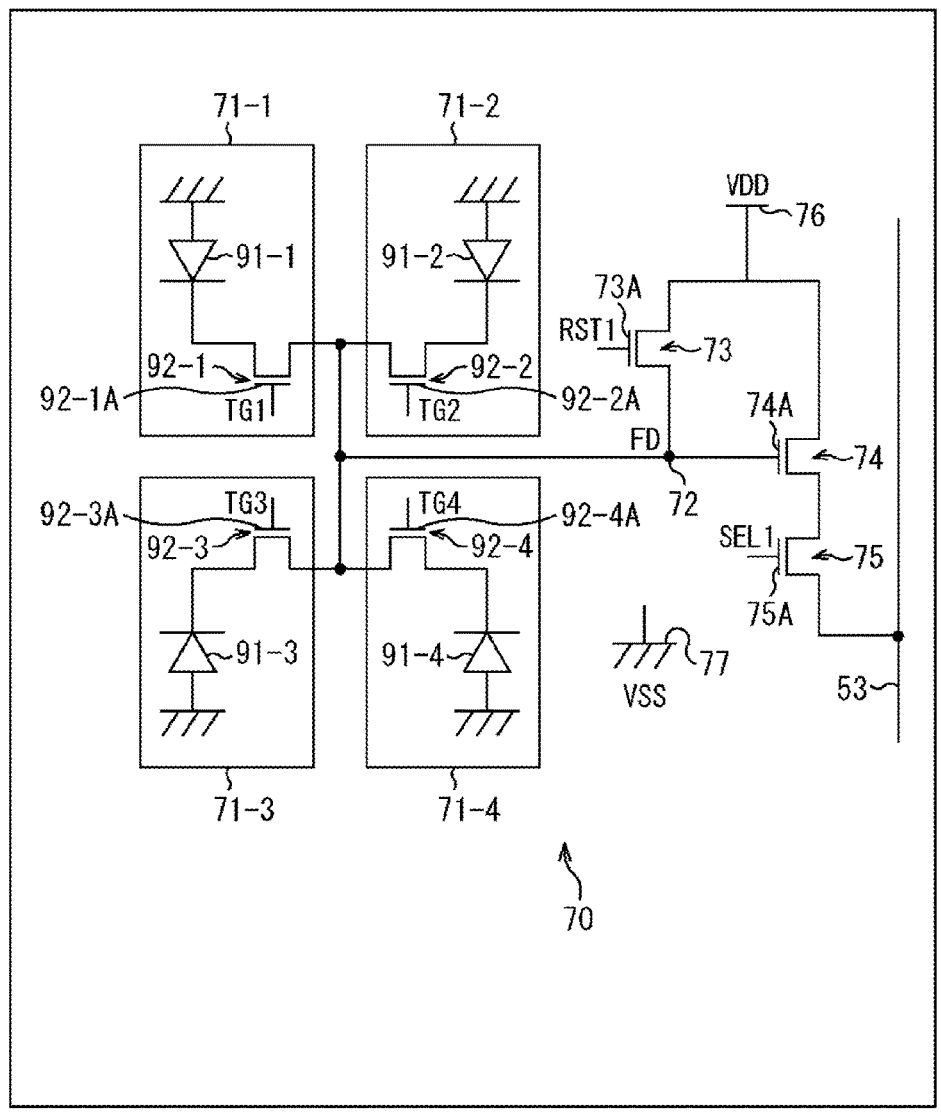
FIG. 2 is a diagram showing a circuit configuration example of a pixel group arranged in a pixel area shown in FIG. 1

FIG. 2 is a diagram showing a circuit configuration example of a pixel group consisting of 2 (horizontal)×2 (vertical) pixels among the pixels arranged in the pixel area 51 shown in FIG. 1

In the pixel area 51 shown in FIG. 1, pixel groups 70 shown in FIG. 2 are arranged in an array. Each pixel group 70 includes 2×2 pixels 71-1 to 71-4, an FD 72, a reset transistor 73, an amplification transistor 74, a selection transistor 75, a power supply electrode 76, and a well electrode 77.

The pixels 71-1 to 71-4 each include a PD and a transfer transistor. Specifically, the pixel 71-1 includes a PD 91-1 and a transfer transistor 92-1, and the pixel 71-2 includes a PD 91-2 and a transfer transistor 92-2. Further, the pixel 71-3 includes a PD 91-3 and a transfer transistor 92-3, and the pixel 71-4 includes a PD 91-4 and a transfer transistor 92-4.

Note that in the following description, when it is unnecessary to particularly distinguish the pixels 71-1 to 71-4, they are collectively referred to as the pixel 71. Similarly, the PDs 91-1 to 91-4 are collectively referred to as the PD 91, and the transfer transistors 92-1 to 92-4 are collectively referred to as the transfer transistor 92.

The PD 91 of the pixel 71 generates and stores charges corresponding to the amount of light that has entered from and received by the back surface of the CMOS image sensor 50. An anode terminal of the PD 91 is connected to the well electrode 77 whose potential is VSS (e.g., GND), and a cathode terminal of the PD 91 is connected to the FD 72 via the transfer transistor 92.

To a gate electrode 92-1A of the transfer transistor 92-1, a line TG1 formed for the pixel 71 in the odd-numbered column of the row of the pixel 71-1 (71-2) among the pixel drive lines 52 corresponding to two rows of the pixels 71 constituting the pixel group 70 is connected. Further, to a gate electrode 92-2A of the transfer transistor 92-2, a line TG2 formed for the pixel 71 in the even-numbered column of the row of the pixel 71-1 (71-2) among the pixel drive lines 52 corresponding to two rows of the pixels 71 constituting the pixel group 70 is connected.

Further, to a gate electrode 92-3A of the transfer transistor 92-3, a line TG3 formed for the pixel 71 in the odd-numbered column of the row of the pixel 71-3 (71-4) among the pixel drive lines 52 corresponding to two rows of the pixels 71 constituting the pixel group 70 is connected. Further, to a gate electrode 92-4A of the transfer transistor 92-4, a line TG3 formed for the pixel 71 in the even-numbered column of the row of the pixel 71-3 (71-4) among the pixel drive lines 52 corresponding to two rows of the pixels 71 constituting the pixel group 70 is connected. Note that in the following description, when it is unnecessary to particularly distinguish the gate electrodes 92-1A to 92-4A, they are collectively referred to as the gate electrode 92A.

To the lines TG1 to TG4, transfer signals are supplied as drive signals from the vertical drive unit 54 shown in FIG. 1. The vertical drive unit 54 sequentially turns on the transfer signals of the line TG1 to TG4 depending on the row and the odd-numbered or even-numbered column of the pixel 71 from which the pixel signal is to be read. In the case where the transfer signal input to the gate electrode 92A is turned on, the transfer transistor 92 transfers the charges stored in the PD 91 to the FD 72.

The FD 72 holds the charges read from the PD 91. The FD 72 is connected to the power supply electrode 76 whose potential is VDD via the reset transistor 73.

Further, to a gate electrode 73A of the reset transistor 73, a line RST1 formed for the pixels 71 in two rows of the pixels 71 constituting the pixel group 70 among the pixel drive lines 52 corresponding to the two rows is connected. To the line RST1, a reset signal is supplied as a drive signal from the vertical drive unit 54. The vertical drive unit 54 turns on the reset signal before newly turning on the transfer signal.

When the reset signal input to the gate electrode 73A is turned on, the reset transistor 73 discharges the charges transferred to the FD 72 to the power supply electrode 76, and resets the potential of the FD 72.

Between the power supply electrode 76 and the vertical signal line 53, the amplification transistor 74 and the selection transistor 75 are connected in series. A gate electrode 74A of the amplification transistor 74 is connected to the FD 72, and the amplification transistor 74 outputs the pixel signal corresponding to the potential of the FD 72 to the selection transistor 75 by using the power supply electrode 76.

To a gate electrode 75A of the selection transistor 75, a line SEL1 formed for the pixels 71 in two rows of the pixels 71 constituting the pixel group 70 among the pixel drive lines 52 corresponding to the two rows is connected. To the line SEL1, a selection signal is supplied as a drive signal from the vertical drive unit 54. The vertical drive unit 54 turns on the selection signal before turning on the reset signal after turning on the transfer signal.

When the selection signal input to the gate electrode 75A is turned on, the selection transistor 75 supplies the pixel signal input from the amplification transistor 74 to the column processing unit 17 via the vertical signal line 53 shown in FIG. 1.

As described above, in the CMOS image sensor 50, one FD 72 is shared between the 2×2 pixels 71 constituting the pixel group 70, and the charges stored in the PD 91 of the pixel 71 are sequentially transferred from the top to the FD 72 in units of rows in the order of the odd-numbered column and the even-numbered column.

(First Structural Example of Pixel Group)

Figure 3:
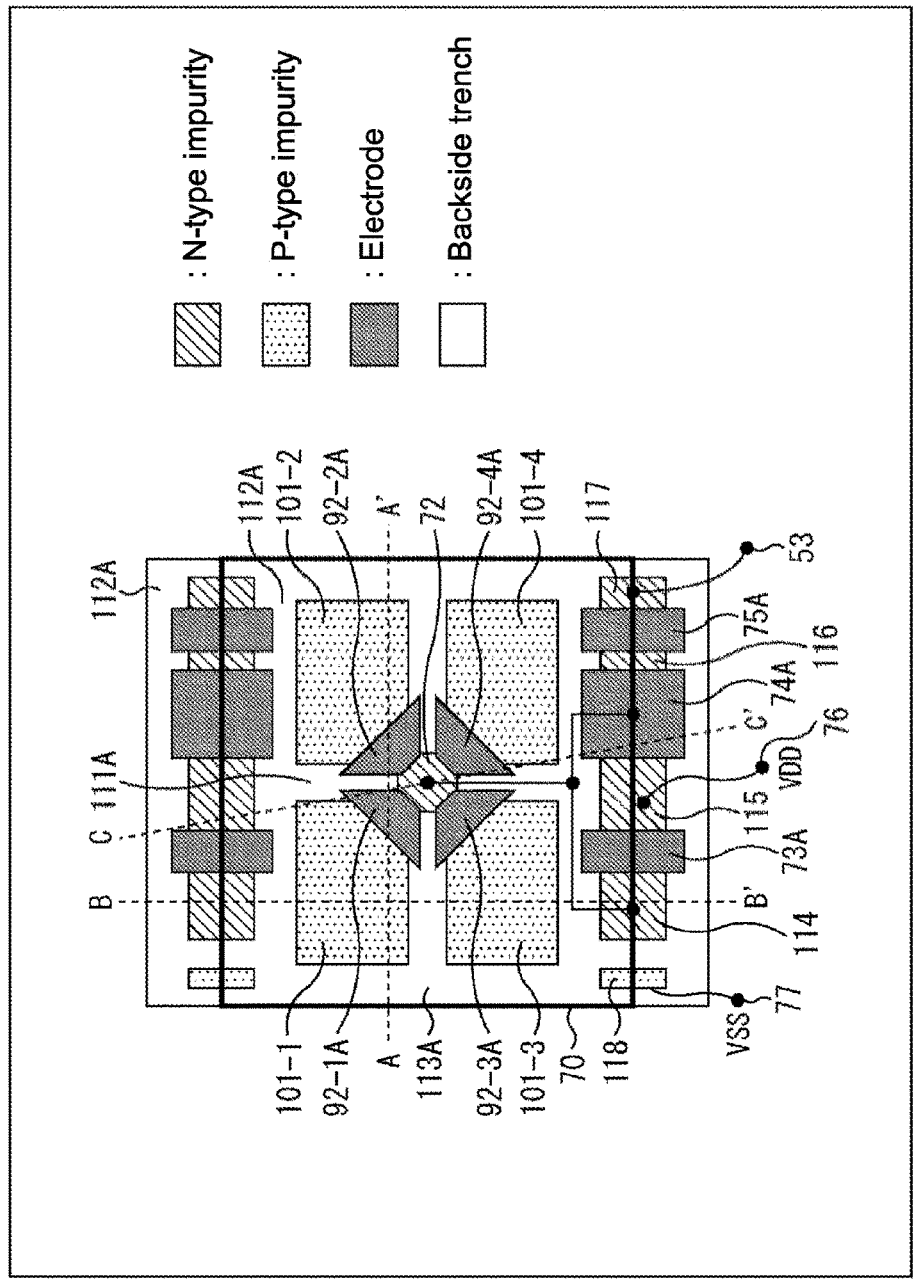
FIG. 3 is a diagram showing a first structural example of the pixel group shown in FIG. 2 as seen from the side of the front surface of the CMOS image sensor.
Figure 4:
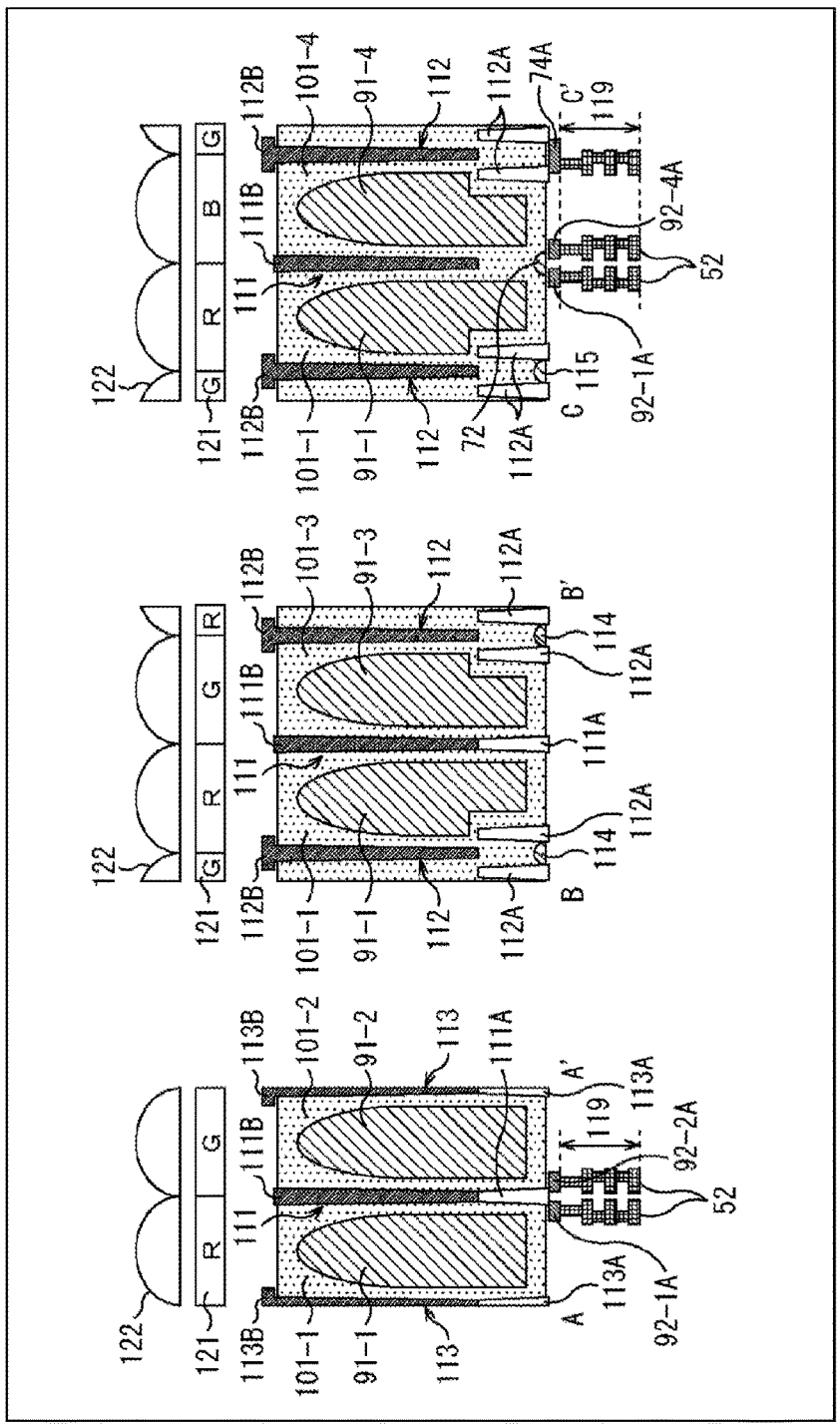
FIG. 4 is a cross-sectional view taken along the line A-A', line B-B', and line C-C' in FIG. 3.

FIG. 3 is a diagram showing a first structural example of the pixel group 70 shown in FIG. 2 as seen from the side of the front surface of the CMOS image sensor 50. FIG. 4 is a cross-sectional view taken along the line A-A', line B-B', and line C-C' in FIG. 3.

As shown in FIG. 3, a P-type impurity 101-1 that is the well in which the PD 91-1 is formed is arranged so as to be aligned in the horizontal direction (left and right direction in FIG. 3) with a P-type impurity 101-2 in which the PD 91-2 is formed, and in the perpendicular direction (upward and downward direction in FIG. 3) with a P-type impurity 101-2 in which the PD 91-3 is formed. Further, a P-type impurity 101-4 in which the PD 91-4 is formed is arranged so as to be aligned in the horizontal direction with the P-type impurity 101-3 and in the perpendicular direction with the P-type impurity 101-2. Note that in the following description, when it is unnecessary to particularly distinguish the P-type impurities 101-1 to 101-4, they are collectively referred to as the P-type impurity 101.

As shown in FIG. 4, a pixel separation wall 111 is formed between adjacent P-type impurities 101 in the same pixel group 70. The pixel separation wall 111 is formed by contact between a front-side trench 111A that is a trench formed from the front surface of the CMOS image sensor 50 and a backside trench 111B that is a trench formed from the back surface. Note that the front-side trench 111A is not formed in the central area of the P-type impurities 101-1 to 101-4 in which the FD 72 is formed among areas between adjacent P-type impurities 101 in the same pixel group 70 on the front surface of the CMOS image sensor 50.

That is, the pixel separation wall 111 is formed by contact between the front-side trench 111A formed in the area where the FD 72 is not formed among areas on the front surface between the adjacent P-type impurities 101 in the same pixel group 70, and the backside trench 111B formed in the entire area of the back surface between the P-type impurities 101.

Further, a pixel separation wall 112 is formed between the P-type impurities 101 adjacent to each other in the perpendicular direction across the pixel group 70, and a pixel separation wall 113 is formed between the P-type impurities 101 adjacent to each other in the horizontal direction.

The pixel separation wall 112 includes two front-side trenches 112A that sandwich N-type impurities 114 to 17 and a P-type impurity 118, and a backside trench 112B. The backside trench 112B is formed at a position corresponding to the N-type impurities 114 to 117 and the P-type impurity 118, which is different from those of the front-side trenches 112A.

The N-type impurity 114 is connected to the FD 72 and constitutes a source of the reset transistor 73. The N-type impurity 115 is connected to the power supply electrode 76, and constitutes drains of the reset transistor 73 and the amplification transistor 74. The N-type impurity 116 constitutes a source of the amplification transistor 74 and a drain of the selection transistor 75. The N-type impurity 117 is connected to the vertical signal line 53, and constitutes a source of the selection transistor 75. The P-type impurity 118 is a well connected to the well electrode 77.

The gate electrode 92A, the gate electrode 73A, and the gate electrode 75A are connected to the pixel drive line 52 provided in a wiring layer 119 formed on the front surface of the CMOS image sensor 50. To the gate electrode 74A, the FD 72 is connected.

Further, red (R), green (G), and blue (B) color filters 121 of the corresponding pixels 71 are formed on the side of the back surface of each P-type impurity 101, and an on-chip lens 122 is formed on the outside of each color filter 121. The PD 91 performs photoelectric conversion on light incident from the back surface of the CMOS image sensor 50 via the on-chip lens 122 and the color filter 121.

Since the front-side trench 111A and the backside trench 111B are in contact with each other in areas other than the FD 72 in the pixel separation wall 111, as described above, each PD 91 in the same pixel group 70 is completely electrically cut off in areas other than the FD 72. Further, since a front-side trench 113A and a backside trench 113B are in contact with each other in the pixel separation wall 113, the PDs 91 adjacent across the pixel group 70 are also completely electrically cut off.

Meanwhile, in the pixel separation wall 112, positions of the front-side trenches 112A and the backside trench 112B differ, and the front-side trenches 112A and the backside trench 112B are not in contact with each other. Therefore, the PD 91, the N-type impurities 114 to 117, and the P-type impurity 118 are not completely electrically cut off.

Note that the length in the depth direction perpendicular to the back surface of the front-side trench 111A (112A, 113A) and the backside trench 111B (112B, 113B) may differ depending on the position of the pixel separation wall 111 (112,113). Further, the material of at least one of the front-side trench 111A (112A, 113A) and the backside trench 111B (112B, 113B) may differ depending on the position of the pixel separation wall 111 (112, 113).

Further, one on-chip lens 122 may be provided for the pixel group 70.

(Description of Flow of Charges when Overflowing)

Figure 5:
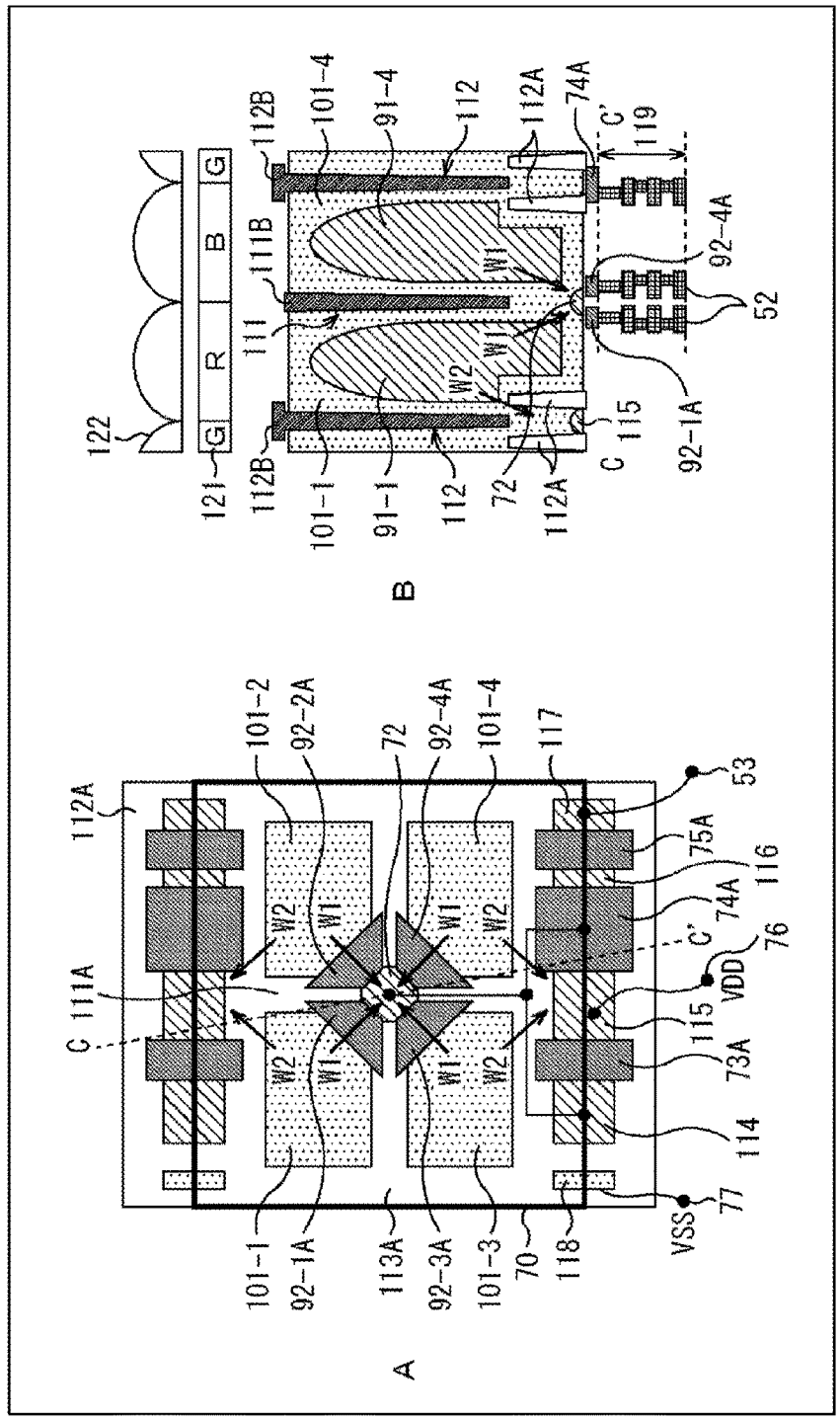
FIG. 5 is a diagram describing flow of charges when charges stored in the PD shown in FIG. 2 overflow.

FIG. 5 is a diagram describing flow of charges when charges stored in the PD 91 overflow.

Part A of FIG. 5 is a diagram showing the pixel group 70 as seen from the side of the front surface when charges stored in the PD 91 overflow, and Part B of FIG. 5 is a cross-sectional view taken along the line C-C' of Part A of FIG. 5.

Since each PD 91 is completely electrically cut off in the area other than the FD 72 as described above, it is possible to prevent charges stored in the PD 91 from leaking from the PD 91 to another adjacent PD 91 in the case where the charges overflow.

Meanwhile, in the area of the FD 72 of the pixel separation wall 111, the front-side trench 111A is not formed. Therefore, in the case where the charges stored in the PD 91 overflow, the overflowed charges leak into the FD 72 via the P-type impurities 101 through a path W1 shown in Part B of FIG. 5. However, since the FD 72 is reset before the charges are transferred from the PD 91, the influence of charge leakage from the PD 91 to the FD 72 on the imaging characteristics is small.

Further, as described above, since the front-side trenches 112A and the backside trench 112B are not in contact with each other in the pixel separation wall 112, the PD 91, the N-type impurities 114 to 117, and the P-type impurity 118 are not completely electrically cut off. Therefore, in the case where the charges stored in the PD 91 overflow, the overflowed charges can be discharged also to the power supply electrode 76 via the N-type impurity 115 through a path W2 shown in Part B of FIG. 5.

Accordingly, even in the case where the amount of charges overflowing from the PD 91 is larger than the amount of charges that can be stored in the FD 72, it is possible to prevent charges from leaking to the adjacent PD 91 by discharging the charges to the power supply electrode 76. As a result, it is possible to prevent degradation of imaging characteristics due to charge leakage to the adjacent PD 91.

Meanwhile, in the case where there is no path W2, it is necessary to sweep the charges stored in the FD 72 by turning on the reset signal before the amount of charges overflowing from the PD 91 exceeds the amount of charges that can be stored in the FD 72. Therefore, processing of the vertical drive unit 54 becomes complicated.

Note that charge leakage is performed without a physical barrier in the path W1, and leakage of electric charges is performed through the gap between a physical barrier formed of the front-side trenches 112A and the backside trench 112B in the path W2. Therefore, the leakage in the path W1 is preferentially performed as compared with the leakage in the path W2.

As described above, in the CMOS image sensor 50, the pixel separation wall 111 (112, 113) is formed by the front-side trench 111A (112A, 113A) and the backside trench 111B (112B, 113B).

Therefore, by bringing the front-side trench 113A of the pixel separation wall 113 into contact with the backside trench 113B, it is possible to cause the pixel separation wall 113 to penetrate the CMOS image sensor 50. The aspect ratio of the depth to the width of the front-side trench 113A and the backside trench 113B is smaller than that of a through trench penetrating from one of the front surface and the back surface of the CMOS image sensor 50. Therefore, the formation of the pixel separation wall 113 is easy as compared with the case where the pixel separation wall is formed by the through trench.

Further, by controlling the presence/absence and position of the front-side trenches 111A to 113A by forming a mask pattern, which is a general semiconductor process, intentional leakage and cutting off of charges can be easily realized.

Further, it is possible to enhance the compatibility with a general CMOS image sensor in which a trench for device isolation such as STI (Shallow Trench Isolation) is formed on the side of the front surface. As a result, for example, in the case where the present technology is applied to a CMOS image sensor in which a trench for device isolation such as STI is formed on the side of the front surface, the trench can be used as at least one of the front-side trenches 111A to 113A. Accordingly, it is possible to suppress the increase in the number of manufacturing steps due to the formation of the pixel separation walls 111 to 113.

(Second Structural Example of Pixel Group)

Figure 6:
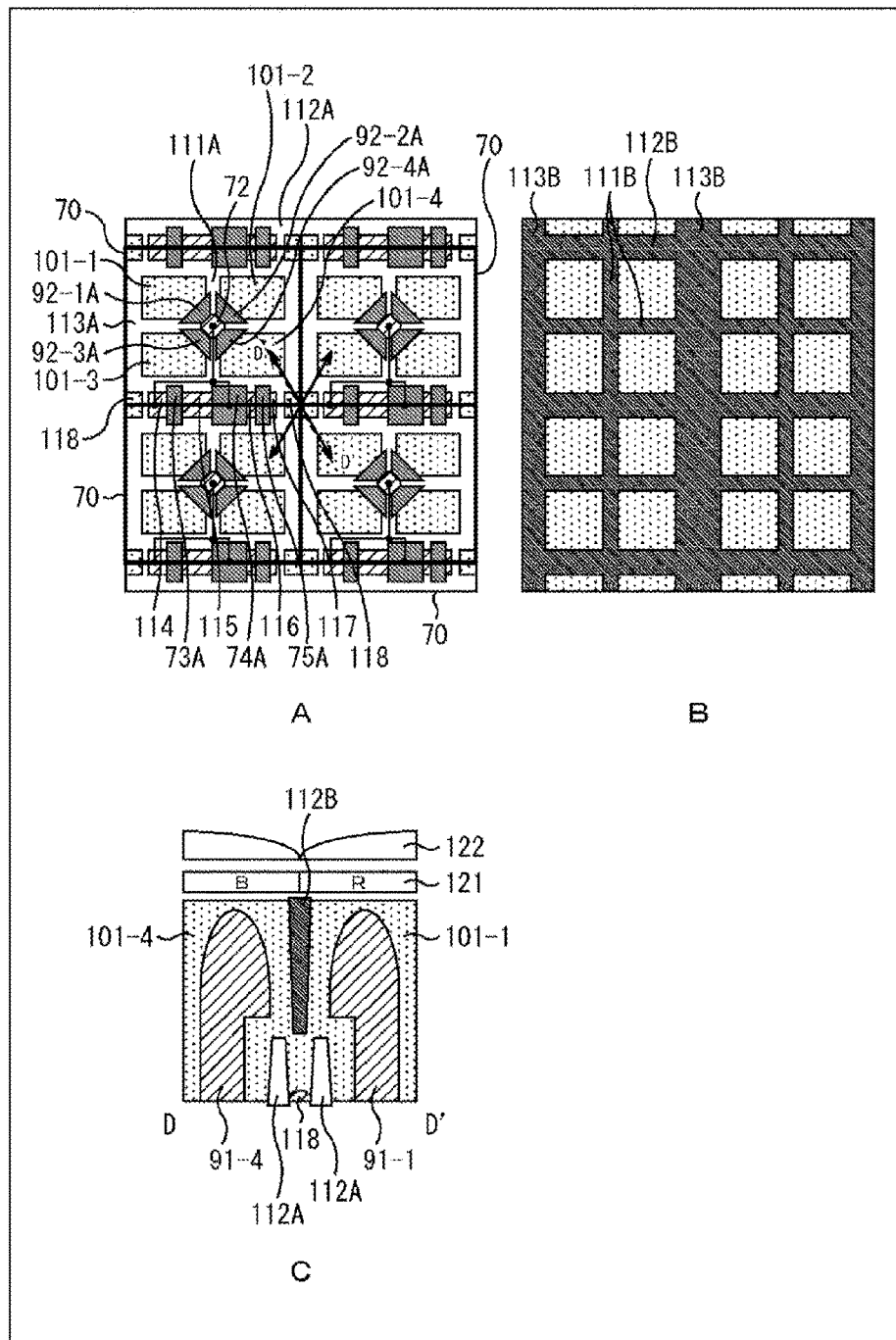
FIG. 6 is a diagram showing a second structural example of the pixel group shown in FIG. 2.

FIG. 6 is a diagram showing a second structural example of the 2×2 pixel group 70. Part A of FIG. 6 is a diagram showing a second structural example of the 2×2 pixel group 70 as seen from the side of the front surface of the CMOS image sensor 50, and Part B of FIG. 6 is a diagram as seen from the side of the back surface. Part C of FIG. 6 is a cross-sectional view taken along the line D-D' of Part A of FIG. 6. Note that in the following figures, unless otherwise noted, a color filter 231 and an on-chip lens 232 are not shown in the figure seen from the side of the back surface of the CMOS image sensor.

The same reference symbols are given to the same configurations as the configurations shown in FIGS. 3 and 4 among the configurations shown in FIG. 6. Overlapping description is omitted as appropriate.

The structure of the pixel group 70 shown in FIG. 6 is different from the structure shown in FIGS. 3 and 4 in that the P-type impurity 118 is located at the intersection point of 2×2 pixel group 70.

As shown in Part C of FIG. 6, the two front-side trenches 112A of the pixel separation wall 112 are formed so as to sandwich the P-type impurity 118, and the backside trench 112B is formed at a position corresponding to the P-type impurity 118. Specifically, the front-side trenches 112A and the backside trench 112B are not in contact with each other. Therefore, it is possible to simultaneously fix the potential of the peripheral P-type impurities 101 to the potential of the well electrode 77 via one P-type impurity 118.

Meanwhile, in the case where the front-side trenches 112A of the pixel separation wall 112 and the backside trench 112B are in contact with each other, it is necessary to form the P-type impurity 118 for each pixel 71. As a result, the area that can be allocated to the PD 91, the transfer transistor 92, the reset transistor 73, the amplification transistor 74, the selection transistor 75, and the like is decreased, which leads to deterioration of the imaging characteristics.

Further, in the example of FIG. 6, since the P-type impurity 118 is located at the intersection point of the 2×2 pixel group 70 as shown in Part A of FIG. 6, leakage of charges in the path W2 (FIG. 5) from the PD 91 to the N-type impurity 115 is likely to occur.

Second Embodiment (Configuration Example of Second Embodiment of CMOS Image Sensor)

Figure 7:
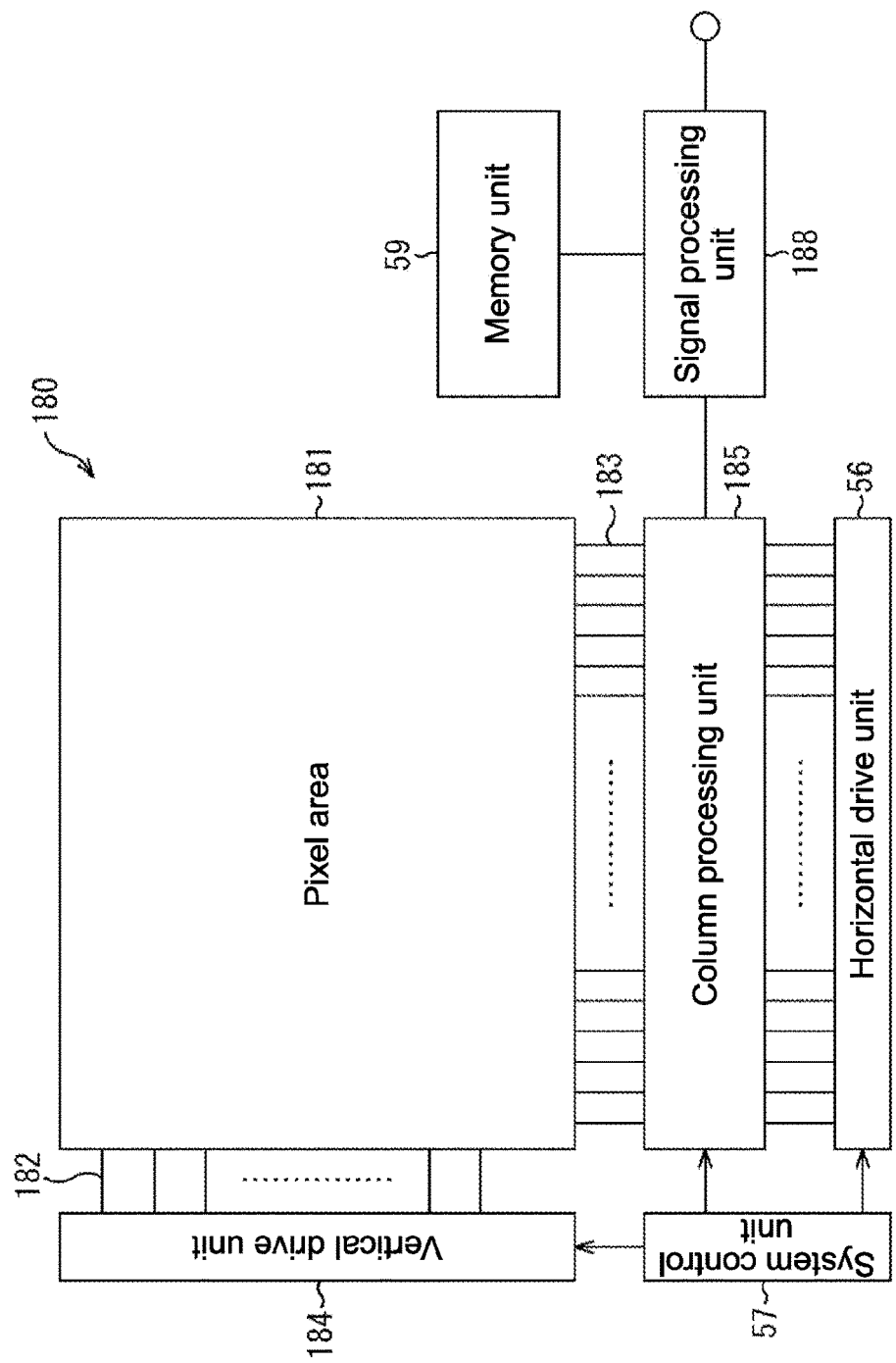
FIG. 7 is a block diagram showing a configuration example of a second embodiment of the CMOS image sensor as the solid-state image pickup device to which the present disclosure is applied.

FIG. 7 is a block diagram showing a configuration example of a second embodiment of the CMOS image sensor as the solid-state image pickup device to which the present disclosure is applied.

The same reference symbols are given to the same configurations as the configurations shown in FIG. 1 among the configurations shown in FIG. 7. Overlapping description is omitted as appropriate.

A CMOS image sensor 180 is a backside illuminated CMOS image sensor in which a pixel area 181, a pixel drive line 182, a vertical signal line 183, a vertical drive unit 184, a column processing unit 185, the horizontal drive unit 56, the system control unit 57, a signal processing unit 188, and the memory unit 59 are formed on a semiconductor substrate such as a silicon substrate (not shown).

On the pixel area 181 of the CMOS image sensor 180, a plurality of phase difference detection pixels each having two PDs that photoelectrically converts light that has entered from the back surface and stores charges are two-dimensionally arranged in an array, and an image is picked up. The array of color filters of each phase difference detection pixel of the pixel area 181 is a Bayer array. Further, in the pixel area 181, the pixel drive line 182 is formed for each row with respect to the phase difference detection pixel, and the vertical signal line 183 is formed for each column.

The vertical drive unit 184 includes a shift register, an address decoder, and the like, and supplies a drive signal to the pixel drive line 182 so that the pixel signals corresponding to the charges stored in the two PDs of each phase difference detection pixel of the pixel area 181 are sequentially read from the top in units of rows.

The column processing unit 185 includes a signal processing circuit for each column of phase difference detection pixels of the pixel area 181. Each signal processing circuit of the column processing unit 185 performs signal processing such as A/D conversion processing and CDS (Correlated Double Sampling) processing on a pixel signal read from the phase difference detection pixel and supplied through the vertical signal line 183. The column processing unit 185 temporarily holds the pixel signal after signal processing.

The signal processing unit 188 performs image plane phase difference AF and the like on the basis of the pixel signals of the two PDs of each phase difference detection pixel output from the column processing unit 185 by the selection of the horizontal drive unit 56. At this time, the signal processing unit 188 stores intermediate results of processing, and the like in the memory unit 59 as necessary, and refers to the results at necessary timing. The signal processing unit 188 outputs the processing result or the like.

(Circuit Configuration Example of Phase Difference Detection Pixel)

Figure 8:
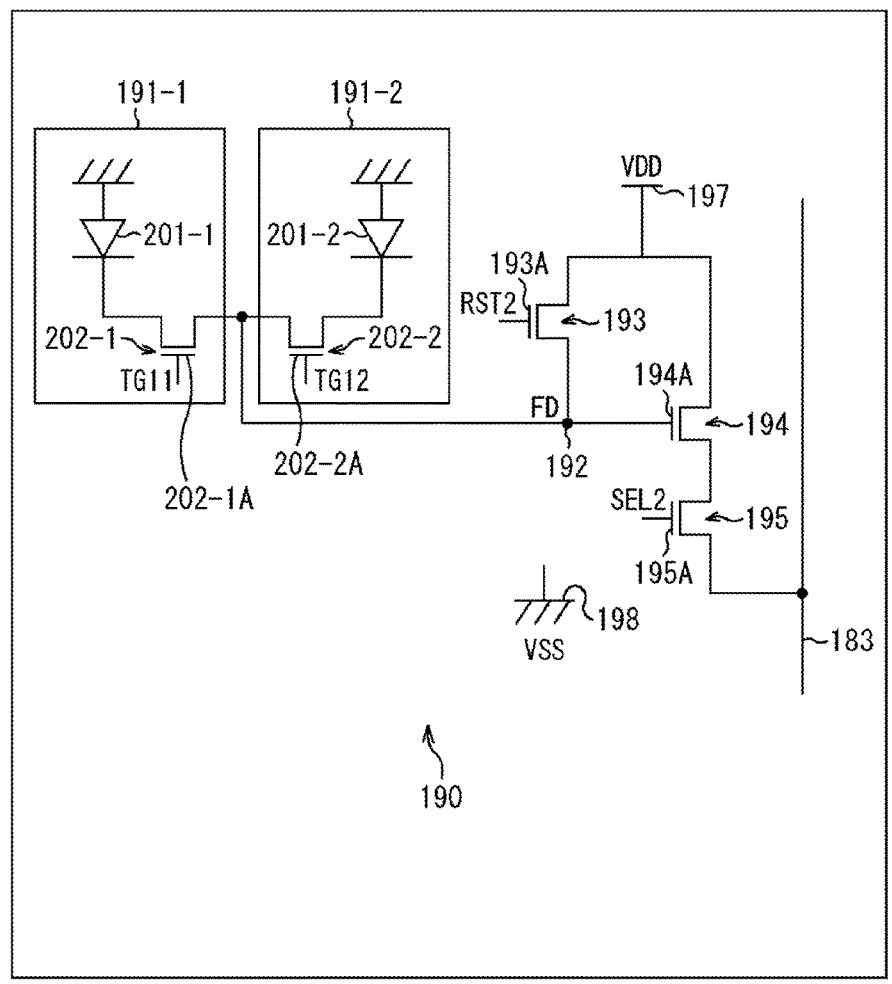
FIG. 8 is a diagram showing a circuit configuration example of a phase difference detection pixel arranged in a pixel area shown in FIG. 7.

FIG. 8 is a diagram showing a circuit configuration example of a phase difference detection pixel arranged in the pixel area 181 shown in FIG. 7.

A phase difference detection pixel 190 includes divided pixels 191-1 and 191-2, an FD 192, a reset transistor 193, an amplification transistor 194, a selection transistor 195, a power supply electrode 197, and a well electrode 198.

The divided pixel 191-1 includes a PD 201-1 and a transfer transistor 202-1, and the divided pixel 191-2 includes a PD 201-2 and a transfer transistor 202-2.

Note that in the following description, when it is unnecessary to particularly distinguish the divided pixel 191-1 and the divided pixel 191-2, they are collectively referred to as the divided pixel 191. Similarly, the PD 201-1 and the PD 201-2 are collectively referred to as the PD 201, and the transfer transistor 202-1 and the transfer transistor 202-2 are collectively referred to as the transfer transistor 202.

The PD 201 of the divided pixel 191 generates and stores charges corresponding to the amount of light that has entered from and received by the back surface of the CMOS image sensor 180. An anode terminal of the PD 201 is connected to the well electrode 198 whose potential is VSS (e.g., GND), and a cathode terminal of the PD 201 is connected to the FD 192 via the transfer transistor 202.

To a gate electrode 202-1A of the transfer transistor 202-1, a line TG11 formed for one divided pixel 191-1 constituting the phase difference detection pixel 190 among the pixel drive lines 182 corresponding to the row of the phase difference detection pixel 190 is connected. Further, to a gate electrode 202-2A of the transfer transistor 202-2, a line TG12 formed for the other divided pixel 191-2 constituting the phase difference detection pixel 190 among the pixel drive lines 182 corresponding to the row of the phase difference detection pixel 190 is connected. Note that in the following description, when it is unnecessary to particularly distinguish the gate electrode 202-1A and the gate electrode 202-2A, they are collectively referred to as the gate electrode 202A.

To the lines TG11 and TG12, transfer signals are supplied as drive signals from the vertical drive unit 184. The vertical drive unit 184 sequentially turns on the transfer signals of the lines TG11 and TG12 in the row of the phase difference detection pixel 190 from which the pixel signal is to be read. In the case where the transfer signal input to the gate electrode 202A is turned on, the transfer transistor 202 transfers the charges stored in the PD 201 to the FD 192.

The FD 192 holds the charges read from the PD 201. The FD 192 is connected to the power supply electrode 197 whose potential is VDD via the reset transistor 193.

To a gate electrode 193A of the reset transistor 193, a line RST2 formed for the phase difference detection pixel 190 in the row of the phase difference detection pixel 190 among the pixel drive line 182 corresponding to the row is connected. To the line RST2, a reset signal is supplied as a drive signal from the vertical drive unit 184. The vertical drive unit 184 turns on the reset signal before newly turning on the transfer signal.

When the reset signal input to the gate electrode 193A is turned on, the reset transistor 193 discharges the charges transferred to the FD 192 to the power supply electrode 197, and resets the potential of the FD 192.

Between the power supply electrode 197 and the vertical signal line 183, the amplification transistor 194 and the selection transistor 195 are connected in series. A gate electrode 194A of the amplification transistor 194 is connected to the FD 192, and the amplification transistor 194 outputs the pixel signal corresponding to the potential of the FD 192 to the selection transistor 195 by using the power supply electrode 197.

To a gate electrode 195A of the selection transistor 195, a line SEL2 formed for the phase difference detection pixel 190 in the row among the pixel drive lines 182 corresponding to the row of the phase difference detection pixel 190 is connected. To the line SEL2, a selection signal is supplied as a drive signal from the vertical drive unit 184. The vertical drive unit 184 turns on the selection signal before turning on the reset signal after turning on the transfer signal.

When the selection signal input to the gate electrode 195A is turned on, the selection transistor 195 supplies the pixel signal output from the amplification transistor 194 to the column processing unit 17 via the vertical signal line 183.

As described above, in the CMOS image sensor 180, one FD 192 is shared between the 2 (horizontal)×2 (vertical) divided pixels 191. Then, the charges stored in the PD 201 of each divided pixel 191 are sequentially transferred from the top to the FD 192 in units of rows of the phase difference detection pixel 190 in the order of the divided pixel 191-1 and the divided pixel 191-2.

(Structural Example of Phase Difference Detection Pixel)

Figure 9:
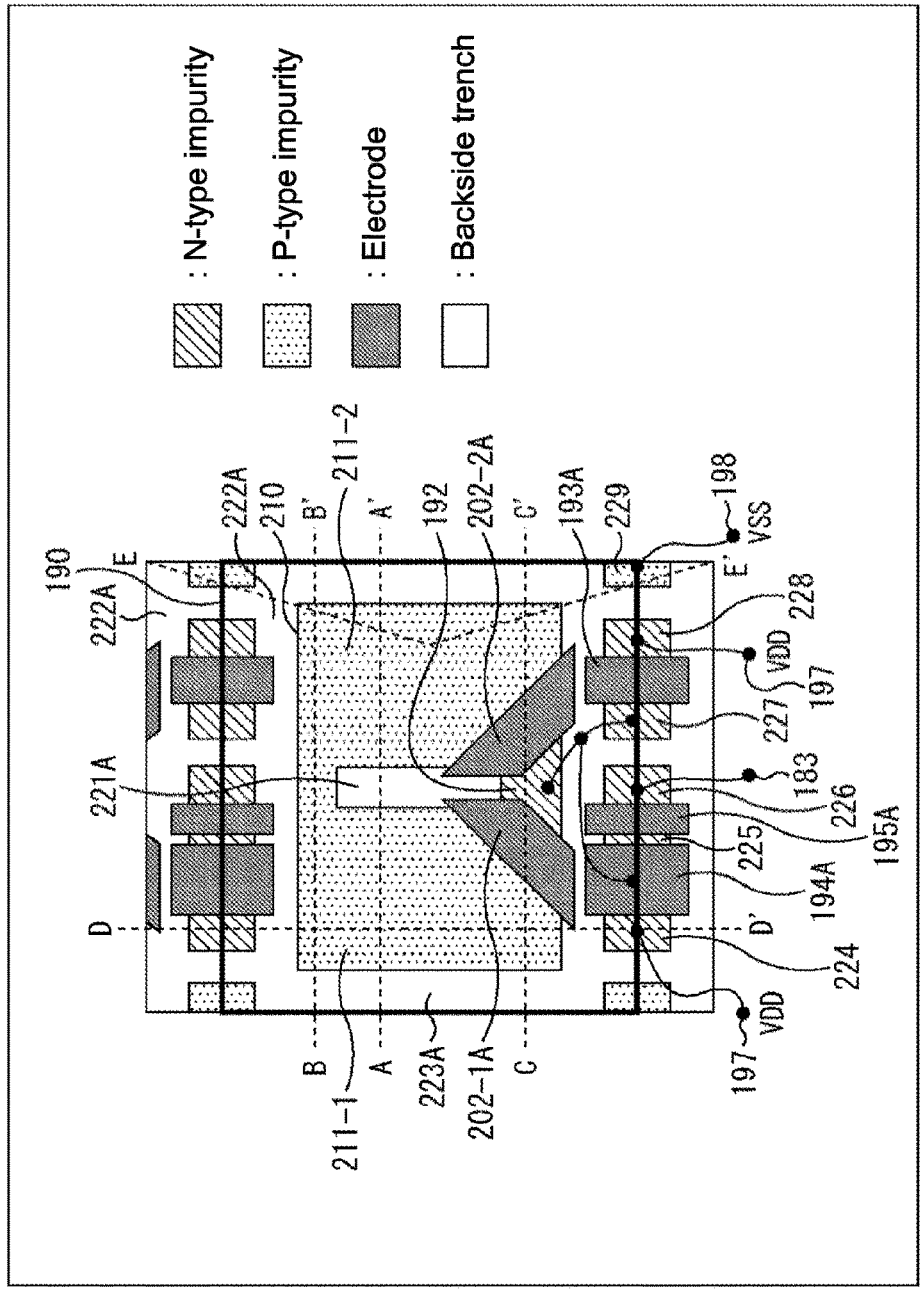
FIG. 9 is a diagram showing a structural example of the phase difference detection pixel shown in FIG. 8 as seen from the side of the front surface of the CMOS image sensor.
Figure 10:
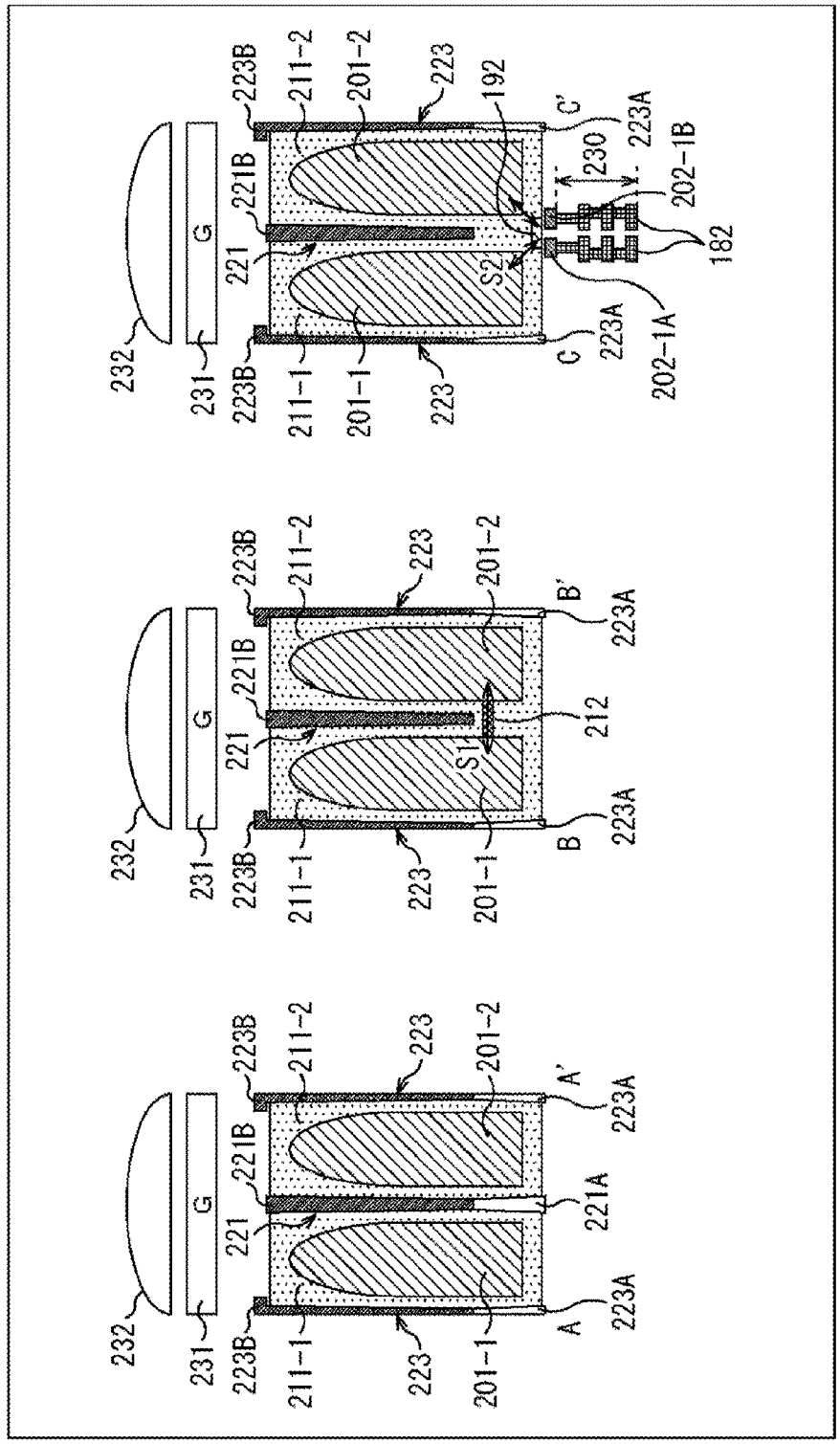
FIG. 10 is a cross-sectional view taken along the line A-A', line B-B', and line C-C' in FIG. 9.
Figure 11:
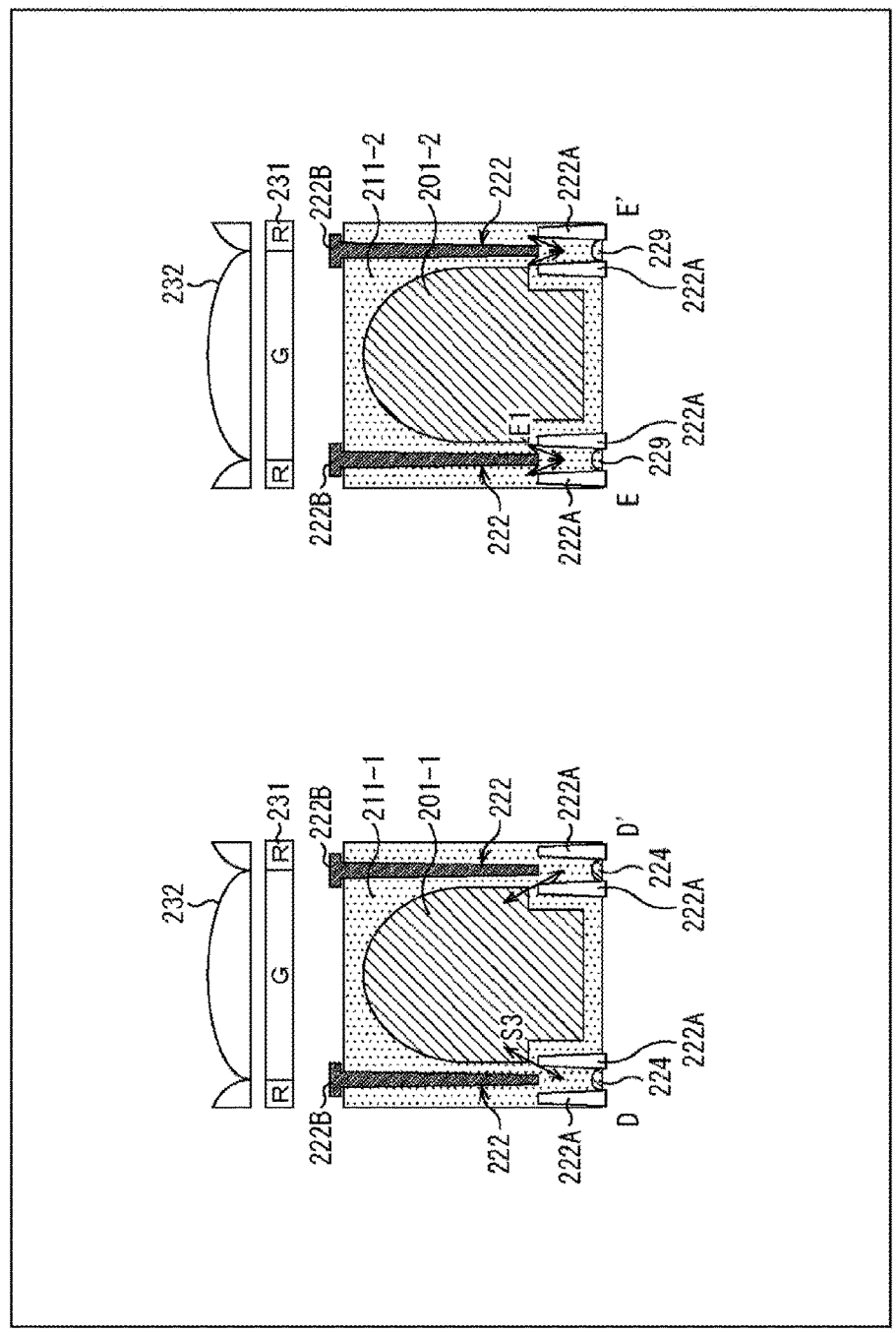
FIG. 11 is a cross-sectional view taken along the line D-D' and line E-E' in FIG. 9.

FIG. 9 is a diagram showing a structural example of the phase difference detection pixel 190 shown in FIG. 8 as seen from the side of the CMOS image sensor 180. FIG. 10 is a cross-sectional view taken along the line A-A', line B-B', and line C-C' in FIG. 9. FIG. 11 is a cross-sectional view taken along the line D-D' and line E-E' in FIG. 9.

As shown in FIG. 9, a P-type impurity 210 that is a well of the phase difference detection pixel 190 is divided into a P-type impurity 211-1 and a P-type impurity 211-2. As shown in FIG. 10 and FIG. 11, the PD 201-1 is formed in the P-type impurity 211-1, and the PD 201-2 is formed in the P-type impurity 211-2. Note that in the following description, when it is unnecessary to particularly distinguish the P-type impurity 211-1 and the P-type impurity 211-2, they are collectively referred to as the P-type impurity 211.

As shown in FIG. 9 and FIG. 10, a divided pixel separation wall 221 is formed between the P-type impurity 211-1 and the P-type impurity 211-2 in the same phase difference detection pixel 190. As shown in FIG. 10, the divided pixel separation wall 221 is formed by contact between a front-side trench 221A formed from the front surface of the CMOS image sensor 180 and a backside trench 221B formed from the back surface.

Note that the front-side trench 221A is not formed in the area where the FD 192 is formed and the end portion in the perpendicular direction opposite to the FD 192 among areas between the P-type impurities 211 adjacent to each other in the same phase difference detection pixel 190 on the front surface of the CMOS image sensor 180. That is, the divided pixel separation wall 221 is formed by contact between the front-side trench 221A formed in the area other than the area of the FD 192 and the end portion in the perpendicular direction opposite to the FD 192 among areas on the front surface between the P-type impurities 211 adjacent to each other in the same phase difference detection pixel 190, and the backside trench 221B formed in the entire area of the back surface between the P-type impurities 211.

Further, as shown in FIG. 10, on the side of the front surface of the end portion in the perpendicular direction of the divided pixel separation wall 221 opposite to the FD 192, an impurity 212 having deep potential is formed. Accordingly, in the case where charges stored in one of the PD 201-1 and the PD 201-2 overflow, it is possible to easily cause charges to leak into the other PD via the impurity 212 through a path S1 shown in FIG. 10.

A pixel separation wall 222 is formed between the P-type impurities 211 adjacent in the perpendicular direction across the phase difference detection pixel 190, and a pixel separation wall 223 is formed between the P-type impurities 211 adjacent to each other in the horizontal direction.

The pixel separation wall 222 includes two front-side trenches 222A that sandwich N-type impurities 224 to 228 and a P-type impurity 229, and a backside trench 222B. The backside trench 222B is formed at a position corresponding to the N-type impurities 224 to 228 and the P-type impurity 229, which is different from those of the two front-side trenches 222A.

The N-type impurity 224 is connected to the power supply electrode 197 and constitutes a drain of the amplification transistor 194. The N-type impurity 225 constitutes a source of the amplification transistor 194 and a drain of the selection transistor 195. The N-type impurity 226 is connected to the vertical signal line 183 and constitutes a source of the selection transistor 195.

The N-type impurity 227 is connected to the FD 192 and constitutes a source of the reset transistor 193. The N-type impurity 228 is connected to the power supply electrode 197 and constitutes a drain of the reset transistor 193. The P-type impurity 229 is a well connected to the well electrode 198.

The gate electrode 202A, the gate electrode 193A, and the gate electrode 195A are connected to the pixel drive line 182 provided in a wiring layer 230 formed on the front surface of the CMOS image sensor 180. To the gate electrode 194A, the FD 192 is connected.

Further, red (R), green (G), and blue (B) color filters 231 of the corresponding phase difference detection pixels 190 are formed on the side of the back surface of the P-type impurity 210, and the on-chip lens 232 is formed on the outside of the color filter 231.

The PD 201-1 receives light incident from the side of the back surface on the right side in FIG. 9 via the on-chip lens 232 and the color filter 231, and performs photoelectric conversion on the received light. Further, the PD 201-2 receives light incident from the side of the back surface on the left side in FIG. 9 via the on-chip lens 232 and the color filter 231, and performs photoelectric conversion on the received light.

As a result, the pixel signal read from the divided pixel 191-1 corresponds to the light incident from the right side in FIG. 9 of the phase difference detection pixel 190, and the pixel signal read from the divided pixel 191-2 corresponds to the light incident from the left side in FIG. 10 of the phase difference detection pixel 190. Therefore, the signal processing unit 188 is capable of detecting the phase in the horizontal direction and performing image plane phase difference AF and the like on the basis of the difference between the pixel signals read from the divided pixel 191-1 and the divided pixel 191-2.

As described above, the front-side trench 221A is not formed in the area of the FD 192 in the divided pixel separation wall 221. Therefore, in the case where charges stored in the PD 201 overflow, the overflowed charges leak into the FD 192 via the P-type impurity 211 through a path S2 shown in FIG. 10. However, since the FD 192 is reset before the charges are transferred from the PD 201, the influence of charge leakage from the PD 201 to the FD 192 on the imaging characteristics is small.

Meanwhile, since a front-side trench 223A and a backside trench 223B are in contact with each other in the pixel separation wall 223, the PDs 201 adjacent to each other across the phase difference detection pixel 190 are completely electrically cut off. Therefore, even in the case where the charges stored in the PD 201 overflow, no leakage of charges to other PD 201 adjacent to the PD 201 across the phase difference detection pixel 190 occurs.

Further, as shown in FIG. 11, in the pixel separation wall 222, the positions of the front-side trench 222A and the backside trench 222B differ, and the front-side trench 222A and the backside trench 222B are not in contact with each other. Therefore, the PD 201, the N-type impurities 224 to 228, and the P-type impurity 229 are not completely electrically cut off.

Therefore, in the case where charges stored in the entire PD 201 overflow, it is possible to discharge the overflowed charges also to the power supply electrode 197 via the P-type impurity 211 and the N-type impurity 224 through a path S3 shown in FIG. 11. Further, through a path E1 shown in FIG. 11, it is possible to fix the potential of the P-type impurity 211 (well) to the potential of the well electrode 198 connected to the P-type impurity 229.

Note that the length in the depth direction and the material of at least one of the front-side trench 221A (222A, 223A) and the backside trench 221B (222B, 223B) may differ depending on the position of the divided pixel separation wall 221 (the pixel separation wall 222, 223). Further, the length in the depth direction and the material of at least one of the backside trench 222B (223B) of the pixel separation wall 222 (223) and the backside trench 221B of the divided pixel separation wall 221 may differ.

(Description of Operation of CMOS Image Sensor)

Figure 12:
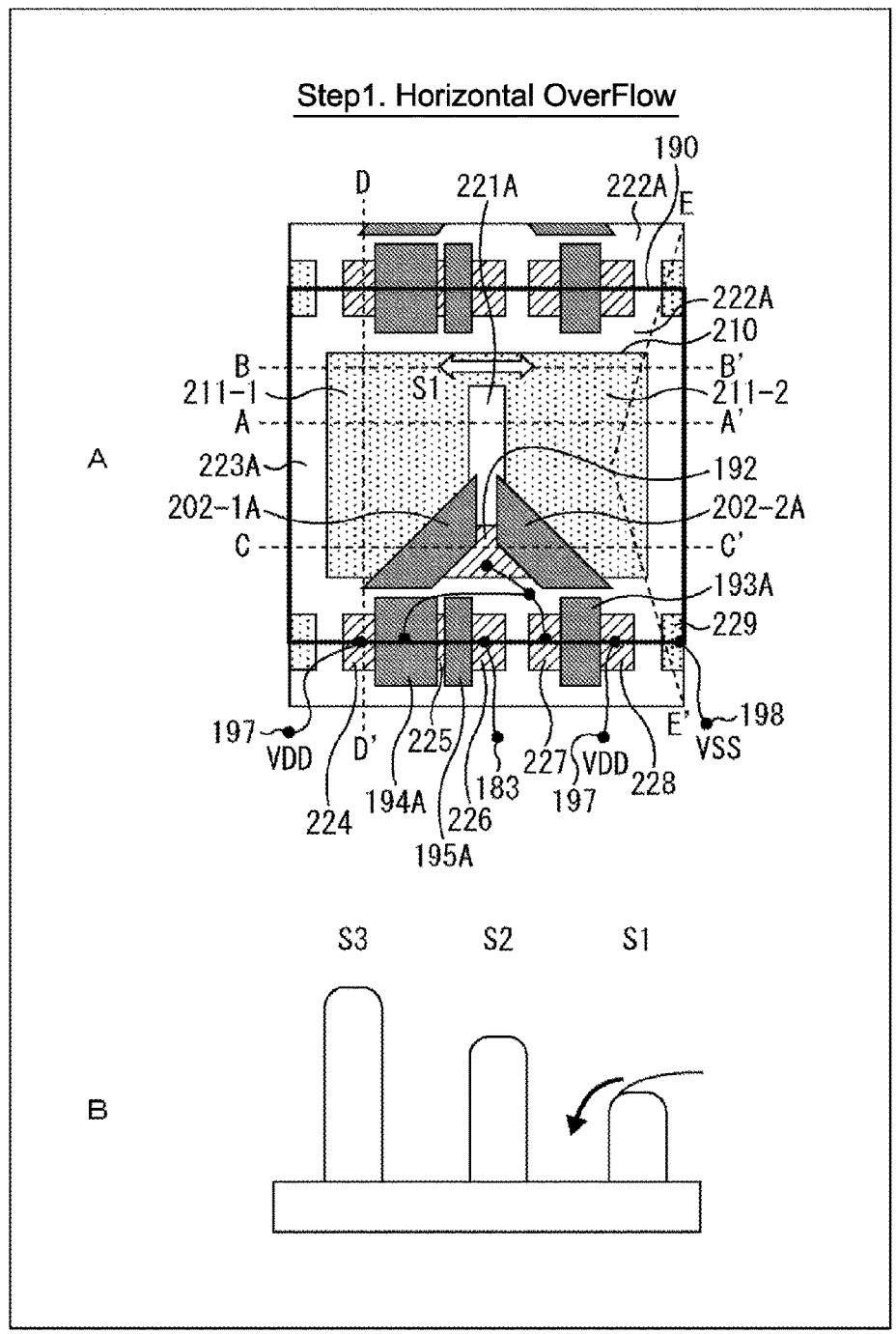
FIG. 12 is a diagram describing the operation of the CMOS image sensor shown in FIG. 7
Figure 13:
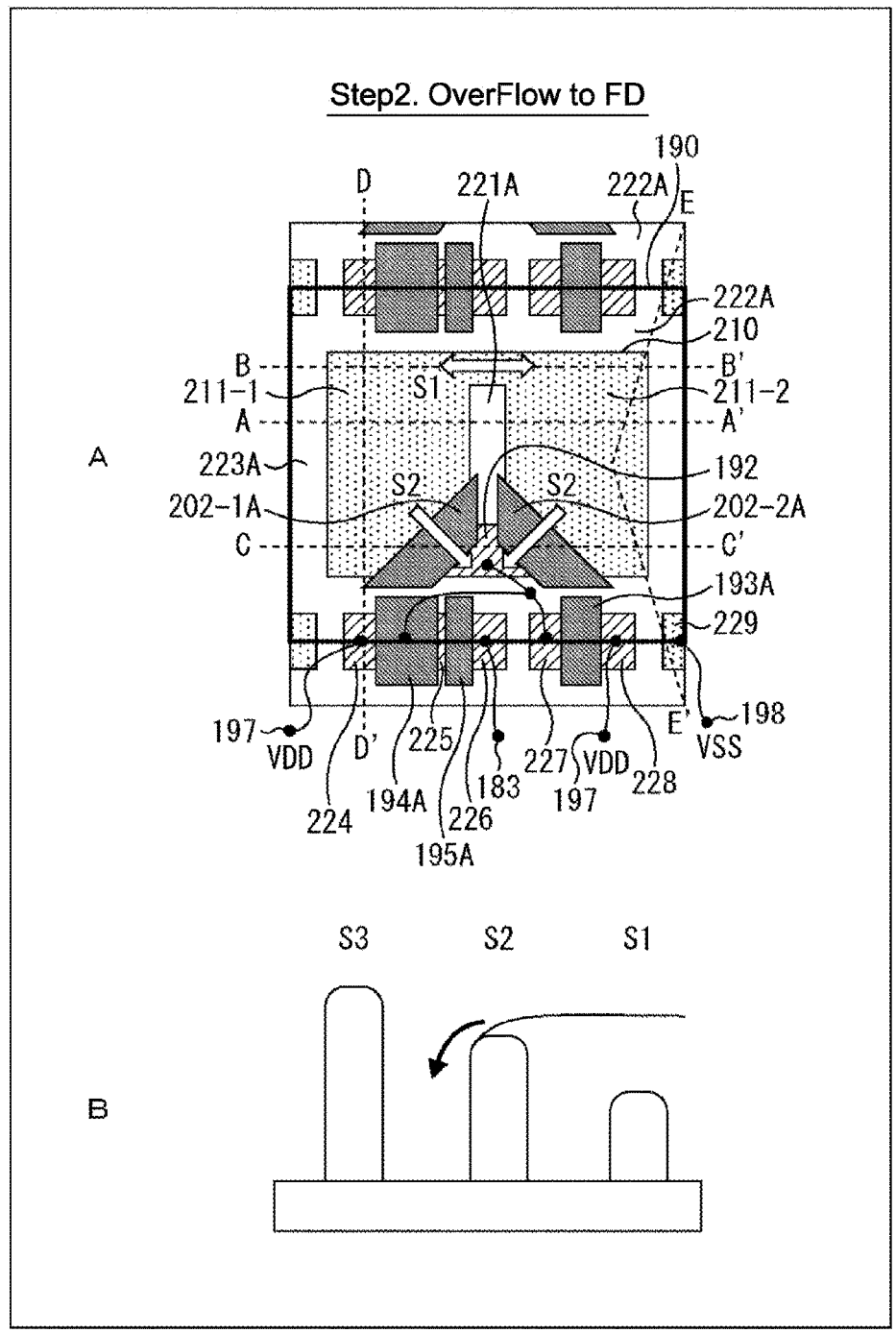
FIG. 13 is a diagram describing the operation of the CMOS image sensor shown in FIG. 7
Figure 14:
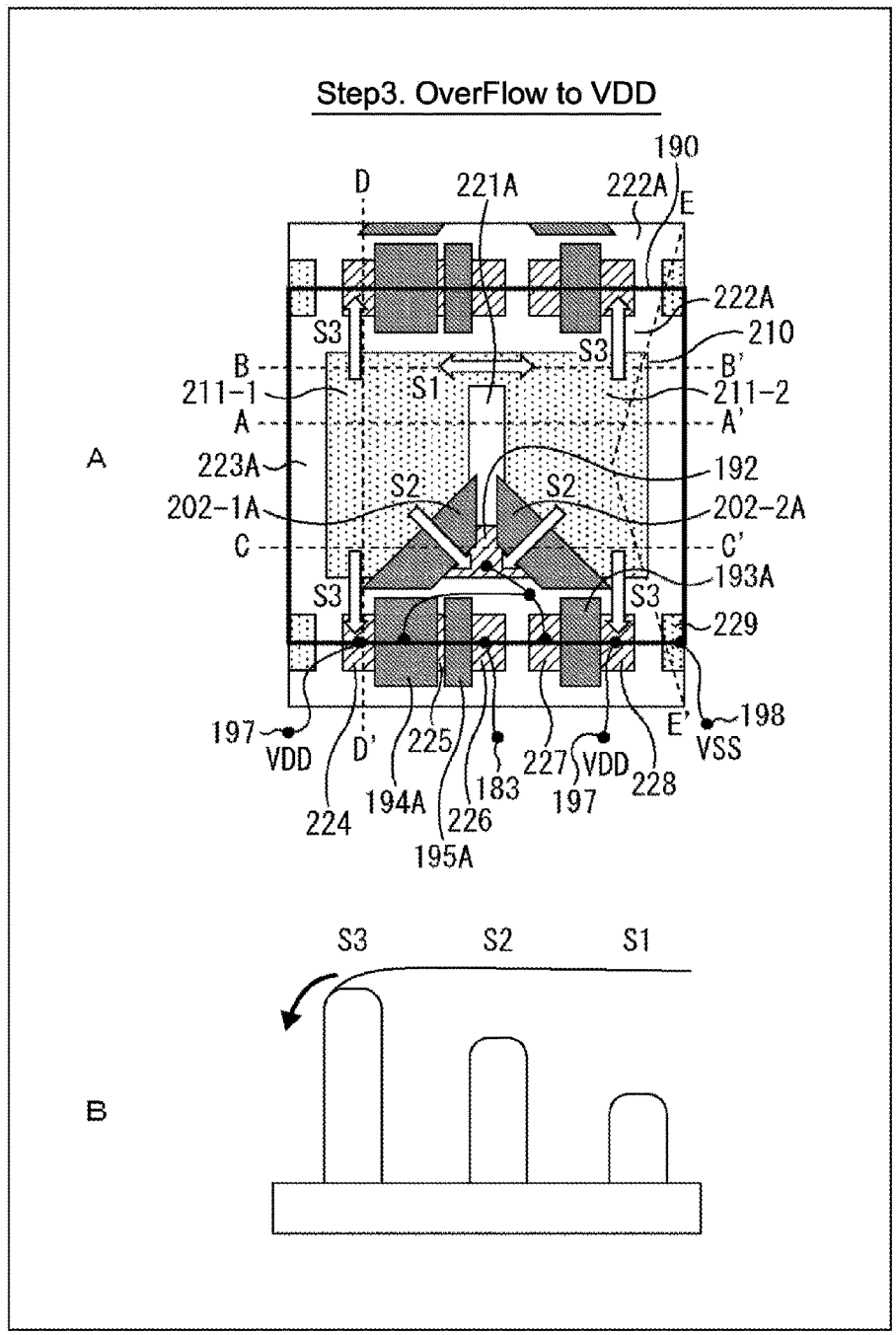
FIG. 14 is a diagram describing the operation of the CMOS image sensor shown in FIG. 7

FIG. 12 to FIG. 14 are each a diagram describing the operation of the CMOS image sensor 180 shown in FIG. 7.

As shown in Part B of FIG. 12 to Part B of FIG. 14, in the barriers of the paths S1 to S3, the barriers of the path S1 is the weakest, the barriers of the path S2 is the second weakest, and the barrier of the path S3 is the strongest.

The signal processing unit 188 detects, on the basis of the difference between the pixel signals sequentially read from the divided pixel 191-1 and the divided pixel 191-2, the phase in the horizontal direction until charges stored in any one of the PD 201-1 and the PD 201-2 overflow. Then, the signal processing unit 188 performs image plane phase difference AF on the basis of the detected phase.

When charges are further stored in the PD 201 and the charges stored in any one of the PD 201-1 and the PD 201-2 overflow, the overflowed charges start to leak into the other PD through the path S1 having the weakest barrier as shown in FIG. 12 (Step1). In this case, the signal processing unit 188 is capable of acquiring the pixel signal of the entire phase difference detection pixel 190 by summing up the pixel signals sequentially read from the PD 201-1 and the PD 201-2.

When charges are further stored in the PD 201 and the charges stored in the entire PD 201 overflow, the overflowed charges start to leak into the FD 192 through the path S2 having the second weakest barrier as shown in FIG. 13 (Step2). Since the FD 192 is reset before the charges are transferred from the PD 201, the influence of charge leakage from the PD 201 to the FD 192 on the imaging characteristics is small.

When charges are further stored in the PD 201 and the amount of charges overflown from the entire PD 201 becomes large, the charges start to leak into the N-type impurity 224 and the N-type impurity 228 through the path S3 having the strongest barrier as shown in FIG. 14 (Step3). Since the N-type impurity 224 and the N-type impurity 228 are connected to the power supply electrode 197, the charges leaked from the PD 201 are discharged to the power supply electrode 197.

As described above, in the CMOS image sensor 180, the divided pixel separation wall 221 (the pixel separation wall 222, 223) is formed by the front-side trench 221A (222A, 223A) and the backside trench 221B (222B, 223B).

Therefore, in the end portion in the perpendicular direction opposite to the FD 192 and the area of the FD 192 among the area where the divided pixel separation wall 221 is formed, the front-side trench 221A is not formed, and the impurity 212 can be formed in the end portion in the perpendicular direction opposite to the FD 192. Further, it is possible to shift the positions of the front-side trench 222A of the pixel separation wall 222 and the backside trench 222B so that the positions do not correspond to each other, and prevent the front-side trench 222A and the backside trench 222B from being in contact with each other.

In this way, it is possible to cause leakage of charges between the PD 201-1 and the PD 201-2, leakage of charges from the PD 201 to the FD 192, and discharge of charges stored in the PD 201 to the power supply electrode 197 to occur in a stepwise manner.

Further, by causing the front-side trench 223A of the pixel separation wall 223 and the backside trench 223B to be in contact with each other, it is possible to cause the pixel separation wall 223 to penetrate the CMOS image sensor 180. As a result, it is possible to prevent leakage of charges between adjacent phase difference detection pixels 190.

The aspect ratio of the depth to the width of the front-side trench 223A and the backside trench 223B is smaller than that of a through trench penetrating from one of the front surface and the back surface of the CMOS image sensor 180. Therefore, the formation of the pixel separation wall 223 is easy as compared with the case where the pixel separation wall is formed by the through trench.

Further, by controlling the presence/absence and position of the front-side trenches 221A to 223A by forming a mask pattern, which is a general semiconductor process, such stepwise occurrence and prevention of leakage can be easily realized.

Third Embodiment (Circuit Configuration Example of Phase Difference Detection Pixel of Third Embodiment of CMOS Image Sensor)

The configuration of a third embodiment of the CMOS image sensor to which the present disclosure is applied is the same as that of the CMOS image sensor 180 shown in FIG. 7 except that the phase difference detection pixel is formed by 2 (horizontal)×2 (vertical) divided pixels. Therefore, only the phase difference detection pixel will be described below.

Figure 15:
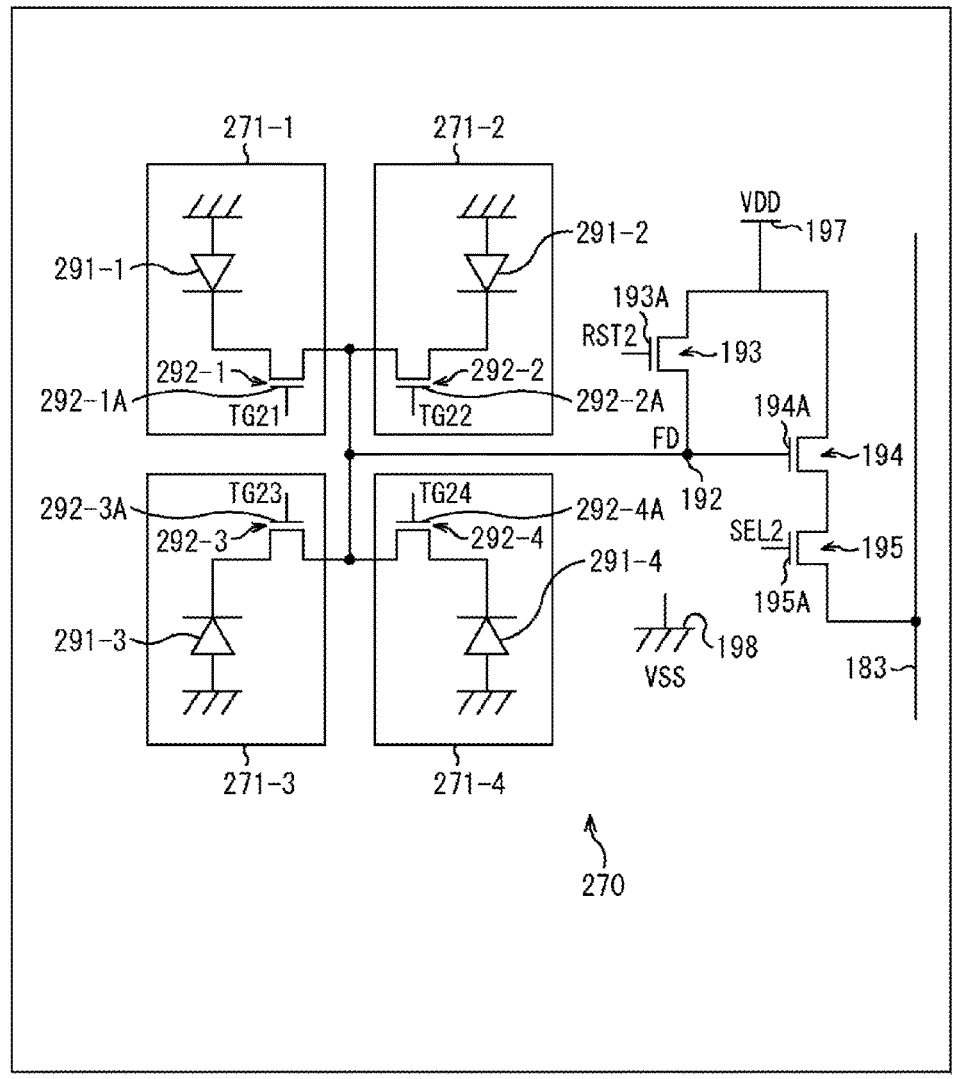
FIG. 15 is a diagram showing a circuit configuration example of a phase difference detection pixel of a third embodiment of the CMOS image sensor to which the present disclosure is applied.

FIG. 15 is a diagram showing a circuit configuration example of a phase difference detection pixel of the third embodiment of the CMOS image sensor to which the present disclosure is applied.

The same reference symbols are given to the same configurations as the configurations shown in FIG. 8 among the configurations shown in FIG. 15. Overlapping description is omitted as appropriate.

The configuration of a phase difference detection pixel 270 shown in FIG. 15 is different from the configuration of the phase difference detection pixel 190 shown in FIG. 8 in that the number of divided pixels is 2 (horizontal)×2 (vertical).

Specifically, the phase difference detection pixel 270 includes 2×2 divided pixels 271-1 to 271-4, the FD 192, the reset transistor 193, the amplification transistor 194, the selection transistor 195, the power supply electrode 197, and the well electrode 198.

The divided pixels 271-1 to 271-4 each include a PD and a transfer transistor. Specifically, the divided pixel 271-1 includes a PD 291-1 and a transfer transistor 292-1, and the divided pixel 271-2 includes a PD 291-2 and a transfer transistor 292-2. Further, the divided pixel 271-3 includes a PD 291-3 and a transfer transistor 292-3, and the divided pixel 271-4 includes a PD 291-4 and a transfer transistor 292-4.

Note that in the following description, when it is unnecessary to particularly distinguish the divided pixels 271-1 to 271-4, they are collectively referred to as the divided pixel 271. Similarly, the PDs 291-1 to 291-4 are collectively referred to as the PD 291, and the transfer transistors 292-1 to 292-4 are collectively referred to as the transfer transistor 292.

The PD 291 of the divided pixel 271 generates and stores charges corresponding to the amount of light that has entered from and received by the back surface of the CMOS image sensor. An anode terminal of the PD 291 is connected to the well electrode 198, and a cathode terminal of the PD 291 is connected to the FD 192 via the transfer transistor 292.

To a gate electrode 292-1A of the transfer transistor 292-1, a line TG21 formed for the upper left divided pixel 271-1 constituting the phase difference detection pixel 270 among the pixel drive lines 182 corresponding to the row of the phase difference detection pixel 270 is connected. Further, to a gate electrode 292-2A of the transfer transistor 292-2, a line TG22 formed for the upper right divided pixel 271-2 constituting the phase difference detection pixel 270 among the pixel drive lines 182 corresponding to the row of the phase difference detection pixel 270 is connected.

Further, to a gate electrode 292-3A of the transfer transistor 292-3, a line TG23 formed for the lower left divided pixel 271-3 constituting the phase difference detection pixel 270 among the pixel drive lines 182 corresponding to the row of the phase difference detection pixel 270 is connected. Further, to a gate electrode 292-4A of the transfer transistor 292-4, a line TG24 formed for the lower right divided pixel 271-4 constituting the phase difference detection pixel 270 among the pixel drive lines 182 corresponding to the row of the phase difference detection pixel 270 is connected. Note that in the following description, when it is unnecessary to particularly distinguish the gate electrodes 292-1A to 292-4A, they are collectively referred to as the gate electrode 292A.

To the lines TG21 to TG24, transfer signals are supplied as drive signals from the vertical drive unit 184. The vertical drive unit 184 sequentially turns on the transfer signals of the lines TG21 to TG24 in the row of the phase difference detection pixel 190 from which the pixel signal is to be read. In the case where the transfer signal input to the gate electrode 292A is turned on, the transfer transistor 292 transfers the charges stored in the PD 291 to the FD 192.

As described above, in the third embodiment of the CMOS image sensor, one FD 192 is shared between the 2×2 divided pixels 271. Then, the charges stored in the PD 291 of each divided pixel 271 are sequentially transferred from the top to the FD 192 in units of rows of the phase difference detection pixel 270 in the order of the divided pixel 271-1, the divided pixel 271-2, the divided pixel 271-3, and the divided pixel 271-4.

(First Structural Example of Phase Difference Detection Pixel)

Figure 16:
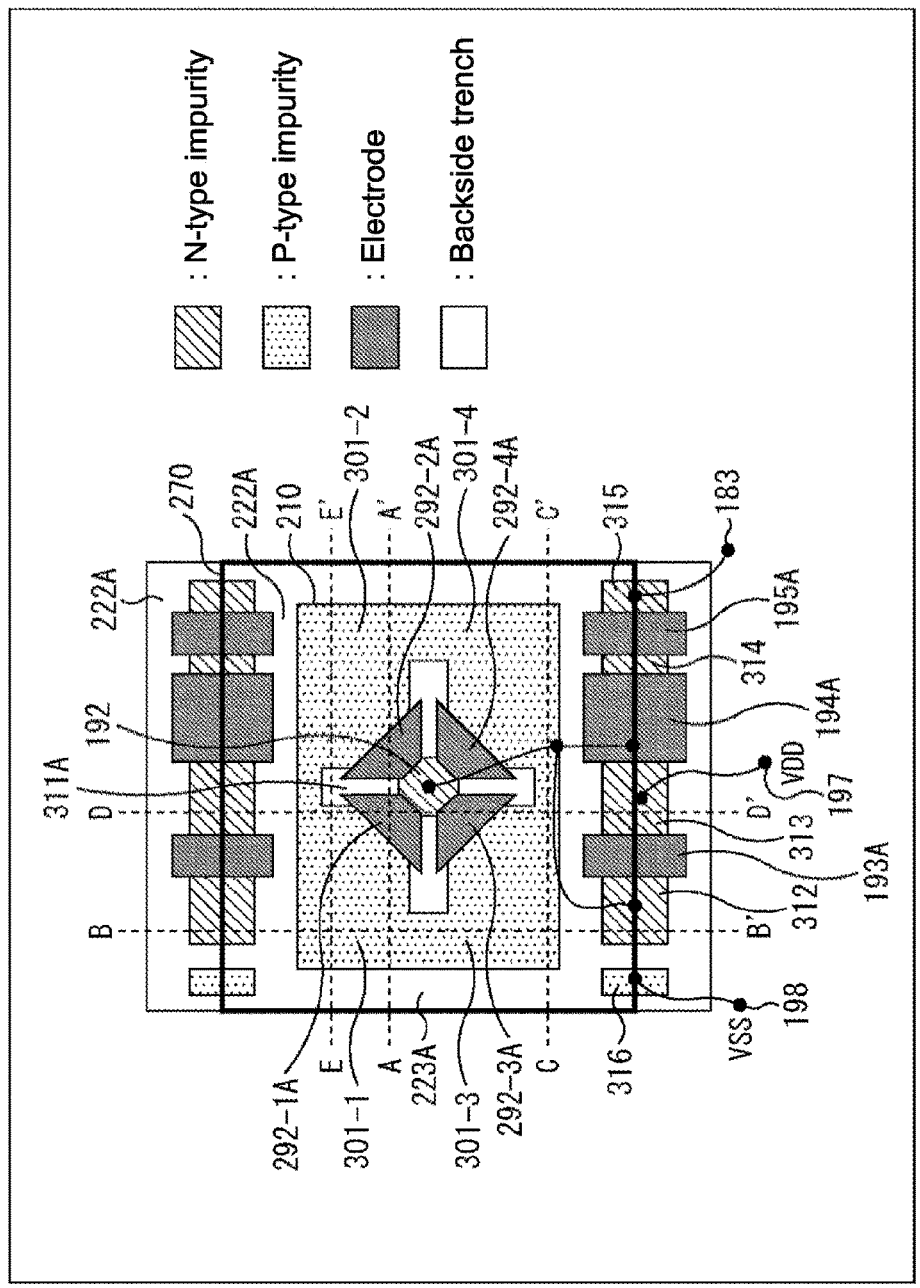
FIG. 16 is a diagram showing a first structural example of a phase difference detection pixel 270 as seen from the side of the front surface of the CMOS image sensor.
Figure 17:
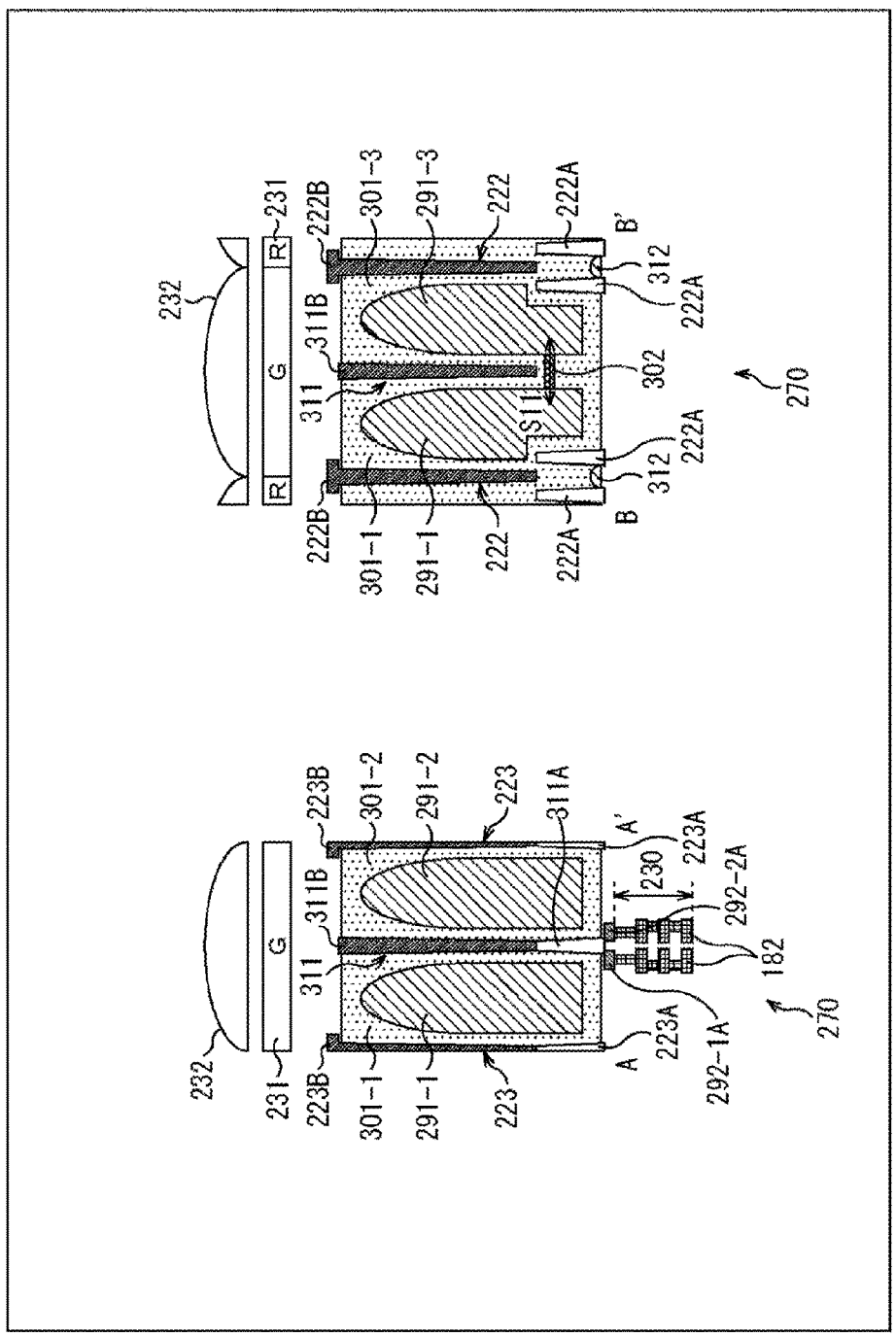
FIG. 17 is a cross-sectional view taken along the line A-A' and line B-B' in FIG. 16.
Figure 18:
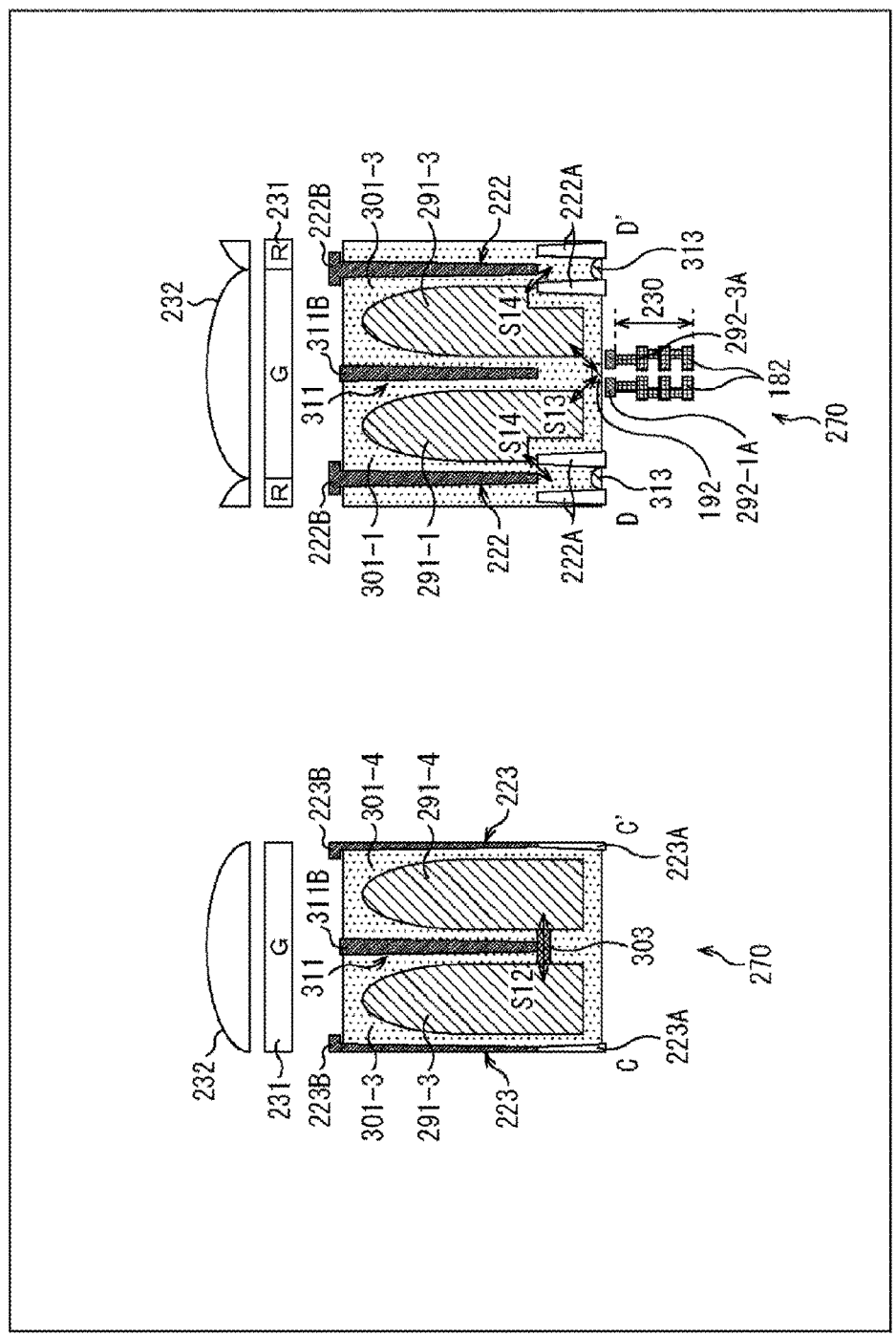
FIG. 18 is a cross-sectional view taken along the line C-C' and line D-D' in FIG. 16.

FIG. 16 is a diagram showing a first structural example of the phase difference detection pixel 270 as seen from the side of the front surface of the CMOS image sensor. FIG. 17 is a cross-sectional view taken along the line A-A' and line B-B' in FIG. 16. FIG. 18 is a cross-sectional view taken along the line C-C' and line D-D' in FIG. 16.

The same reference symbols are given to the same configurations as the configurations shown in FIGS. 9 to 11 among the configurations shown in FIGS. 16 to 18. Overlapping description is omitted as appropriate.

As shown in FIG. 16, the P-type impurity 210 of the phase difference detection pixel 270 is divided into P-type impurities 301-1 to 301-4. As shown in FIG. 17 and FIG. 18, in the P-type impurity 301-1, the P-type impurity 301-2, the P-type impurity 301-3, and the P-type impurity 301-4, the PD 291-1, the PD 291-2, the PD 291-3, and the PD 291-4 are formed, respectively. Note that in the following description, when it is unnecessary to particularly distinguish the P-type impurities 301-1 to 301-4, they are collectively referred to as the P-type impurity 301.

As shown in FIG. 16 to FIG. 18, a divided pixel separation wall 311 is formed between the P-type impurities 301 in the same phase difference detection pixel 270. As shown in FIG. 17 and FIG. 18, the divided pixel separation wall 311 is formed by contact between a front-side trench 311A formed from the front surface of the CMOS image sensor and a backside trench 311B formed from the back surface.

Note that the front-side trench 311A is not formed in the area where the FD 192 is formed and the end portion in the horizontal direction or perpendicular direction opposite to the FD 192 among areas between the P-type impurities 301 adjacent to each other in the same phase difference detection pixel 270 on the front surface of the CMOS image sensor. That is, the divided pixel separation wall 311 is formed by contact between the front-side trench 311A formed in the area other than the area of the FD 192 and the end portion in the horizontal direction or perpendicular direction opposite to the FD 192 among areas on the front surface between the P-type impurities 301 adjacent to each other in the same phase difference detection pixel 270, and the backside trench 311B formed in the entire area of the back surface between the P-type impurities 301.

Further, as shown in FIG. 17, on the side of the front surface of the end portion in the horizontal direction opposite to the FD 192 of the divided pixel separation wall 311 between the P-type impurities 301 adjacent to each other in the perpendicular direction, an impurity 302 having deep potential is formed. Accordingly, in the case where charges stored in one of the PDs 291 adjacent to each other in the perpendicular direction in the same phase difference detection pixel 270 overflow, it is possible to easily cause charges to leak into the other PD via the impurity 302 through a path S11 shown in FIG. 17.

Further, as shown in FIG. 18, on the side of the front surface of the end portion in the perpendicular direction opposite to the FD 192 of the divided pixel separation wall 311 between the P-type impurities 301 adjacent to each other in the horizontal direction, an impurity 303 that has a concentration different from that of the impurity 302 and deeper potential than that of the impurity 302 is formed. Accordingly, in the case where charges stored in one of the PDs 291 adjacent to each other in the horizontal direction in the same phase difference detection pixel 270 overflow, it is possible to easily cause charges to leak into the other PD via the impurity 303 through a path S12 shown in FIG. 18.

The front-side trenches 222A of the pixel separation wall 222 sandwich N-type impurities 312 to 315 and a P-type impurity 316. The N-type impurity 312 is connected to the FD 192 and constitutes a source of the reset transistor 193. The N-type impurity 313 is connected to the power supply electrode 197 and constitutes drains of the reset transistor 193 and the amplification transistor 194.

The N-type impurity 314 constitutes a source of the amplification transistor 194 and a drain of the selection transistor 195. The N-type impurity 315 is connected to the vertical signal line 183 and constitutes a source of the selection transistor 195. The P-type impurity 316 is a well connected to the well electrode 198. As shown in FIG. 17, to the gate electrode 292A, the pixel drive line 182 provided in the wiring layer 230 formed in the CMOS image sensor is connected.

The PD 291-1 and the PD 291-2 respectively receives light incident from the lower right in FIG. 16 and light incident from lower left in FIG. 16 via the on-chip lens 232 and the color filter 231, and perform photoelectric conversion on the light.

Further, the PD 291-3 and the PD 291-4 respectively receives light incident from the upper right in FIG. 16 and light incident from upper left in FIG. 16 via the on-chip lens 232 and the color filter 231, and perform photoelectric conversion on the light.

As a result, the pixel signal read from the divided pixel 271-1 corresponds to the light incident from the lower right in FIG. 16 of the phase difference detection pixel 270, and the pixel signal read from the divided pixel 271-2 corresponds to the light incident from the lower left in FIG. 16 of the phase difference detection pixel 270. Further, the pixel signal read from the divided pixel 271-3 corresponds to the light incident from the upper right in FIG. 16 of the phase difference detection pixel 270, and the pixel signal read from the divided pixel 271-4 corresponds to the light incident from the upper left in FIG. 16 of the phase difference detection pixel 270.

Therefore, the signal processing unit 188 is capable of detecting the phase in the horizontal direction and the perpendicular direction and performing image plane phase difference AF and the like on the basis of the difference between the pixel signals read from the divided pixels 271-1 to 271-4.

As described above, the front-side trench 311A is not formed in the area of the FD 192 in the divided pixel separation wall 311. Therefore, in the case where charges stored in the entire PD 291 overflow, the overflowed charges leak into the FD 192 via the P-type impurity 301 through a path S13 shown in FIG. 18. However, since the FD 192 is reset before the charges are transferred from the PD 291, the influence of charge leakage from the PD 291 to the FD 192 on the imaging characteristics is small.

Meanwhile, since the front-side trench 223A and the backside trench 223B are in contact with each other in the pixel separation wall 223, the PDs 291 adjacent to each other across the phase difference detection pixel 270 are completely electrically cut off. Therefore, even in the case where the charges stored in the PD 291 overflow, no leakage of charges to other PD 291 adjacent to the PD 291 across the phase difference detection pixel 270 occurs.

Further, as shown in FIG. 17 and FIG. 18, since the front-side trench 222A and the backside trench 222B are not in contact with each other in the pixel separation wall 222, the PD 291, the N-type impurities 312 to 315, and the P-type impurity 316 are not completely electrically cut off.

Therefore, in the case where the charges stored in the entire PD 291 overflow, the overflowed charges can be discharged also to the power supply electrode 197 via the P-type impurity 301 and the N-type impurity 313 through a path S14 shown in FIG. 18.

Note that the length in the depth direction of the front-side trench 311A and the backside trench 311B may differ depending on the position of the divided pixel separation wall 311. Further, the length in the depth direction of the backside trench 222B (223B) of the pixel separation wall 222 (223) and the backside trench 311B of the divided pixel separation wall 311 may differ.

(Description of Operation of CMOS Image Sensor)

FIG. 19 to FIG. 22 are each a diagram describing the operation of the third embodiment of the CMOS image sensor.

Figure 19:
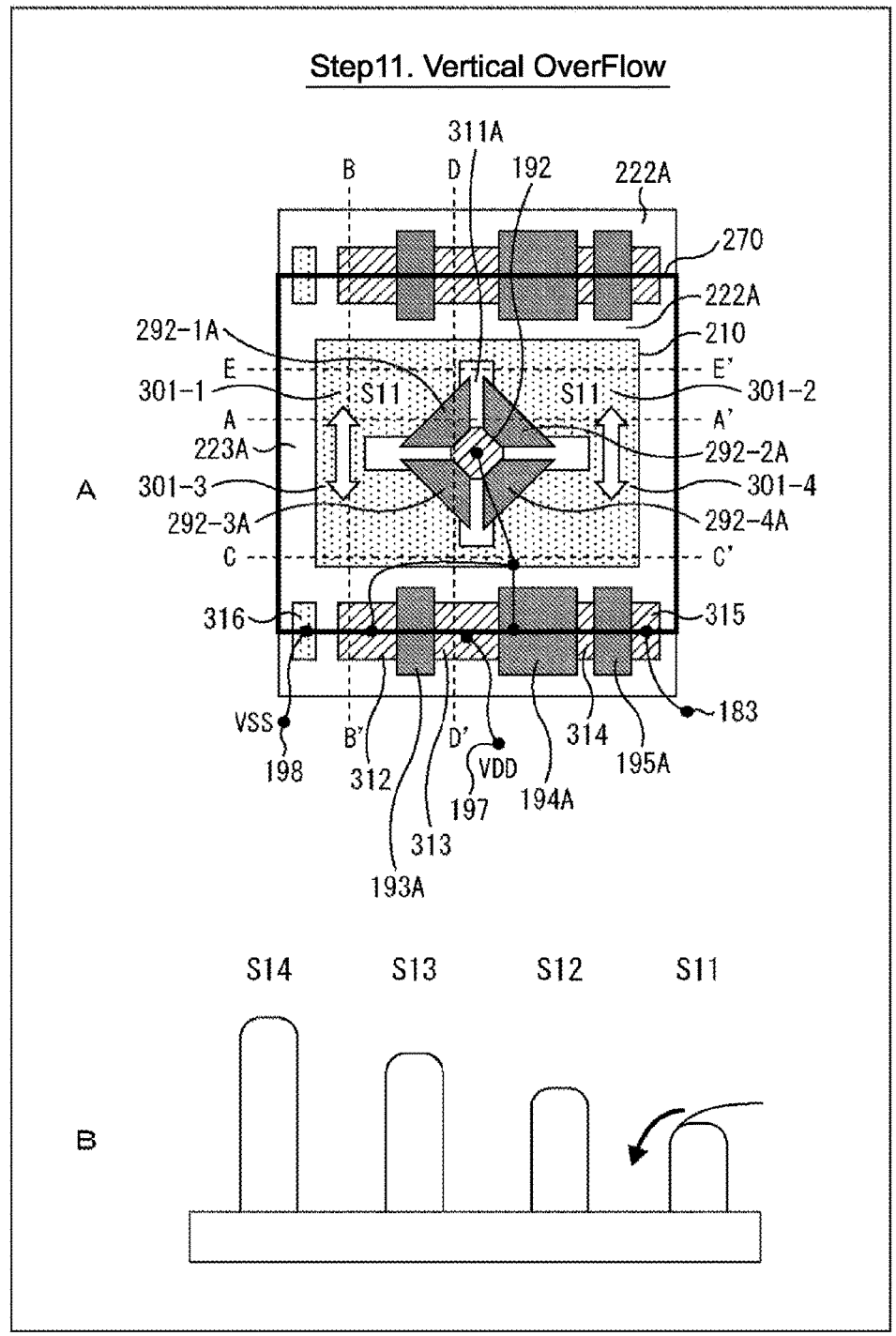
FIG. 19 is a diagram describing the operation of the third embodiment of the CMOS image sensor.
Figure 22:
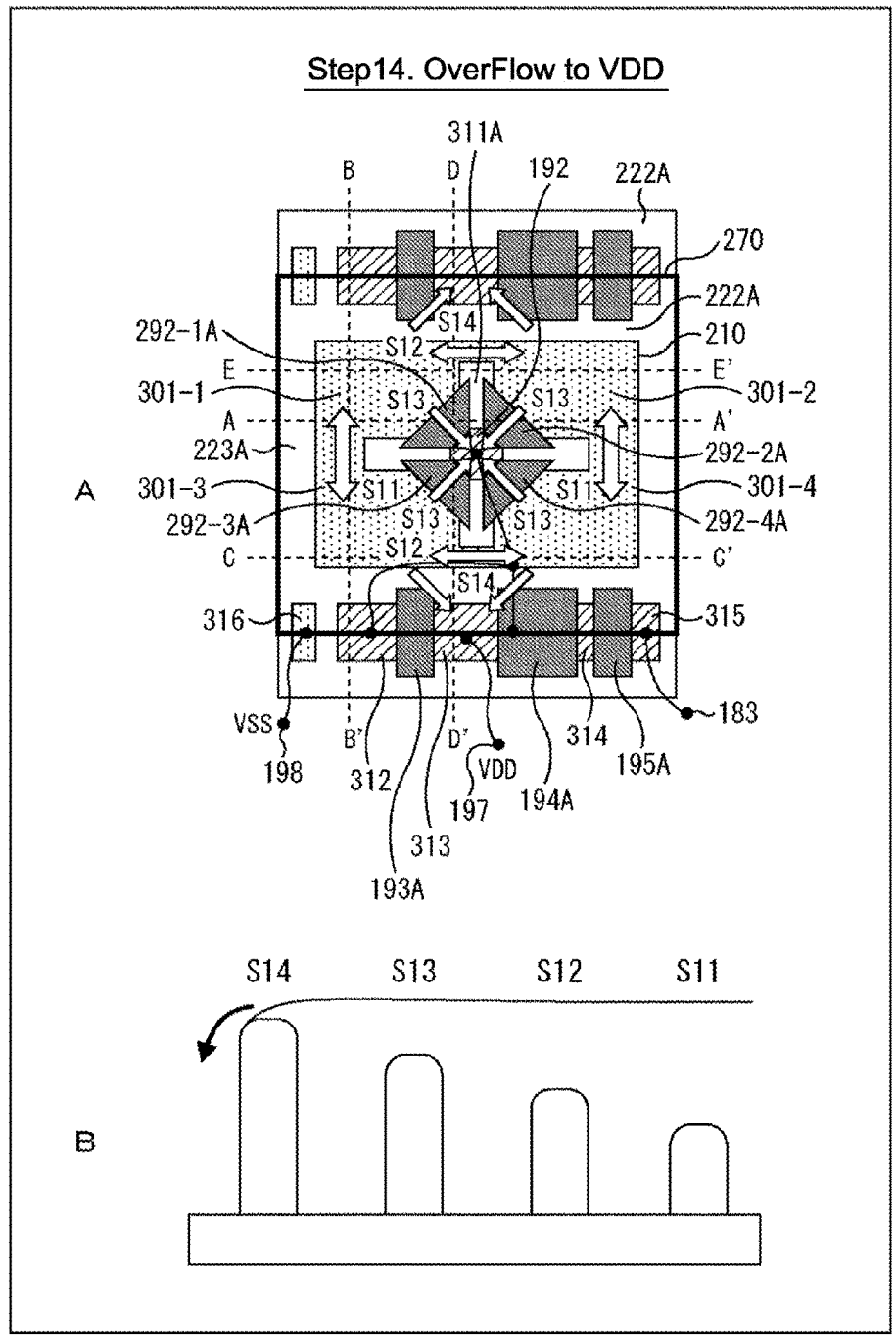
FIG. 22 is a diagram describing the operation of the third embodiment of the CMOS image sensor.

As shown in Part B of FIG. 19 to Part B of FIG. 22, in the barriers of the paths S11 to S14, the barrier of the path S11 is the weakest, the barrier of the path S12 is the second weakest, and the barrier of the path S13 is the third weakest, and the barrier of the path S14 is the strongest.

The signal processing unit 188 detects, on the basis of the difference between the pixel signals sequentially read from the divided pixels 271-1 to 271-4, the phase in the horizontal direction and the perpendicular direction until charges stored in any one of the PDs 291-1 to 291-4 overflow. Then, the signal processing unit 188 performs image plane phase difference AF on the basis of the detected phase.

When charges are further stored in the PD 291 and the charges stored in any one of the PD 291-1 to the PD 291-4 overflow, the overflowed charges start to leak into the PD 291 adjacent in the perpendicular direction through the path S11 having the weakest barrier as shown in FIG. 19 (Step11).

In this case, the signal processing unit 188 is capable of acquiring the pixel signal of the areas on the left side and the right side when dividing the phase difference detection pixel 270 in the horizontal direction by summing up the pixel signals read from the PDs 291 adjacent to each other in the perpendicular direction. Therefore, the signal processing unit 188 detects the phase in the horizontal direction on the basis of the difference between the pixel signal of the area on the left side and the pixel signal of the area on the right side, and performs image plane phase difference AF on the basis of the phase.

Figure 20:
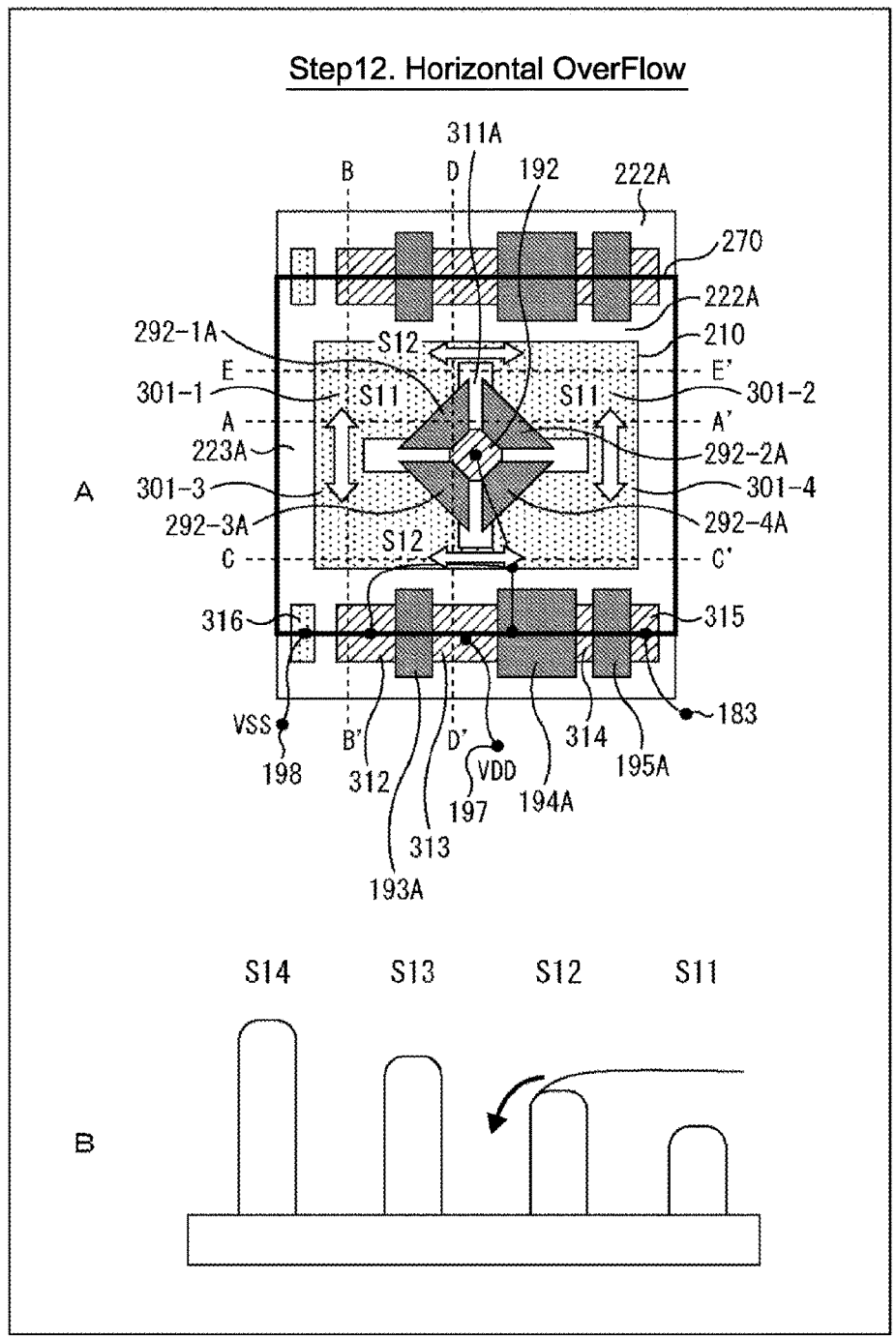
FIG. 20 is a diagram describing the operation of the third embodiment of the CMOS image sensor.

When charges are further stored in the PD 291 and the charges stored in any one of the entire PD 291 on the left side and the entire PD 291 on the right side overflow, the overflowed charges start to leak into the PD 291 adjacent in the horizontal direction through the path S12 having the second weakest barriers as shown in FIG. 20 (Step12). In this case, the signal processing unit 188 is capable of acquiring the pixel signal of the entire phase difference detection pixel 270 by summing up the pixel signals read from all the PDs 291.

Figure 21:
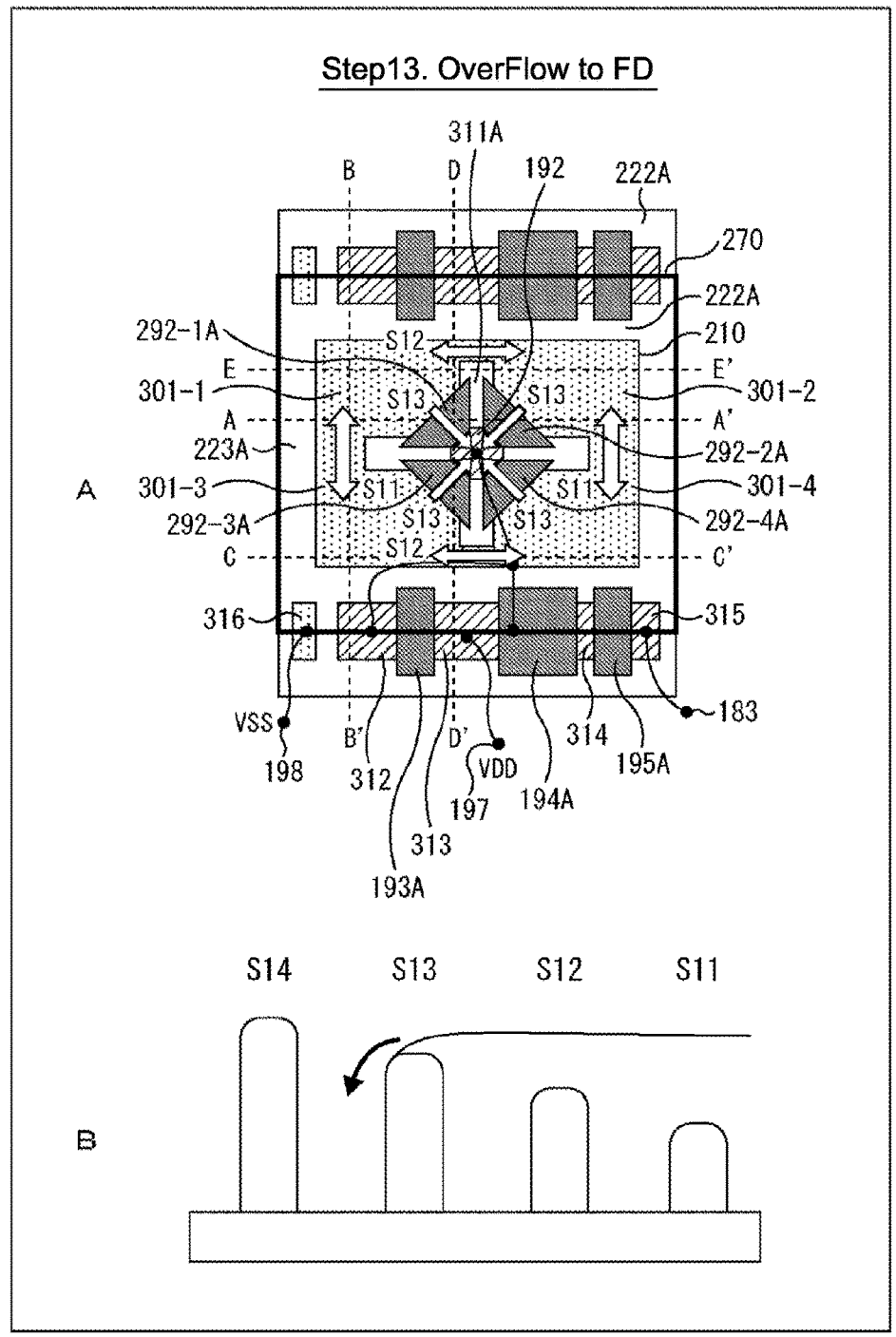
FIG. 21 is a diagram describing the operation of the third embodiment of the CMOS image sensor.

When charges are further stored in the PD 291 and the charges stored in the entire PD 291 overflow, the overflowed charges start to leak into the FD 192 through the path S13 having the third weakest barrier as shown in FIG. 21 (Step13). Since the FD 192 is reset before the charges are transferred from the PD 291, the influence of charge leakage from the PD 291 to the FD 192 on the imaging characteristics is small.

When charges are further stored in the PD 291 and the amount of charges overflown from the entire PD 291 becomes large, the charges start to leak into the N-type impurity 313 through the path S14 having the strongest barrier as shown in FIG. 22 (Step14). Since the N-type impurity 313 is connected to the power supply electrode 197, the charges leaked from the PD 291 are discharged to the power supply electrode 197.

As described above, in the third embodiment of the CMOS image sensor, the divided pixel separation wall 311 is formed by the front-side trench 311A and the backside trench 311B. Therefore, in the end portion in the horizontal direction or the perpendicular direction opposite to the FD 192 and the area of the FD 192 among the area where the divided pixel separation wall 311 is formed, the front-side trench 221A is not formed, the impurity 302 can be formed in the end portion in the horizontal direction, and the impurity 303 having deeper potential than that of the impurity 302 can be formed in the end portion in the perpendicular direction. In this way, it is possible to cause leakage of charges between the PDs adjacent to each other in the perpendicular direction and leakage of charges between the PDs adjacent to each other in the horizontal direction in a stepwise manner.

(Second Structural Example of Phase Difference Detection Pixel)

Figure 23:
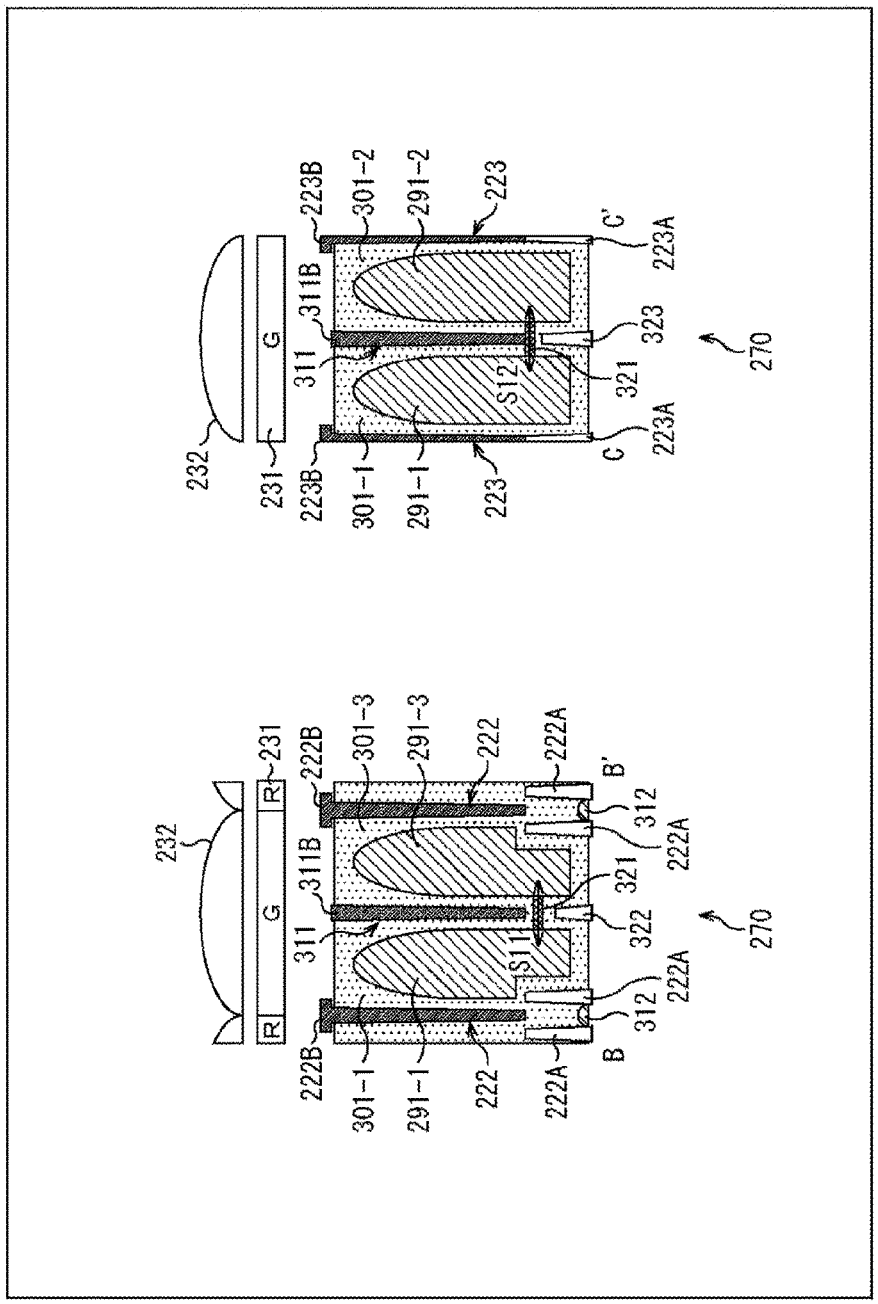
FIG. 23 is a cross-sectional view taken along the line B-B' and line C-C' in FIG. 16 of a second structural example of the phase difference detection pixel shown in FIG. 15.

FIG. 23 is a cross-sectional view taken along the line B-B' and line C-C' in FIG. 16 of a second structural example of the phase difference detection pixel 270 shown in FIG. 15.

The same reference symbols are given to the same configurations as the configurations shown in FIGS. 16 to 18 among the configurations shown in FIG. 23. Overlapping description is omitted as appropriate.

The structure of the phase difference detection pixel 270 shown in FIG. 23 is different from the structure shown in FIGS. 16 to 18 in that an impurity 321 is provided instead of the impurity 302 and the impurity 303 and a front-side trench 322 and a front-side trench 323 are newly provided. In the phase difference detection pixel 270 shown in FIG. 23, the strength of the barriers of the path S11 and the path S12 is controlled not by the concentration of the impurity but by the front-side trench 322 and the front-side trench 323.

Specifically, in the phase difference detection pixel 270 shown in FIG. 23, the impurity 321 having the same impurity concentration is formed on the side of the front surface of the end portion in the horizontal direction or the perpendicular direction opposite to the FD 192 of the divided pixel separation wall 311. Further, on the side of the front surface of the end portion in the horizontal direction, the front-side trench 322 whose length in the depth direction is shorter than the front-side trench 311A is formed. On the side of the front surface of the end portion in the perpendicular direction, the front-side trench 323 whose length in the depth direction is longer than the front-side trench 322 and shorter than the front-side trench 311A is formed.

Accordingly, the front-side trench 322 and the backside trench 311B are not in contact with each other, and the front-side trench 323 and the backside trench 311B are not in contact with each other. The distance between the front-side trench 322 and the backside trench 311B is larger than the distance between the front-side trench 323 and the backside trench 311B. Therefore, the PDs 291 in the same phase difference detection pixel 270 are not electrically cut off, and the barrier of the path S11 is weaker than the barrier of the path S12.

(Third Structural Example of Phase Difference Detection Pixel)

Figure 24:
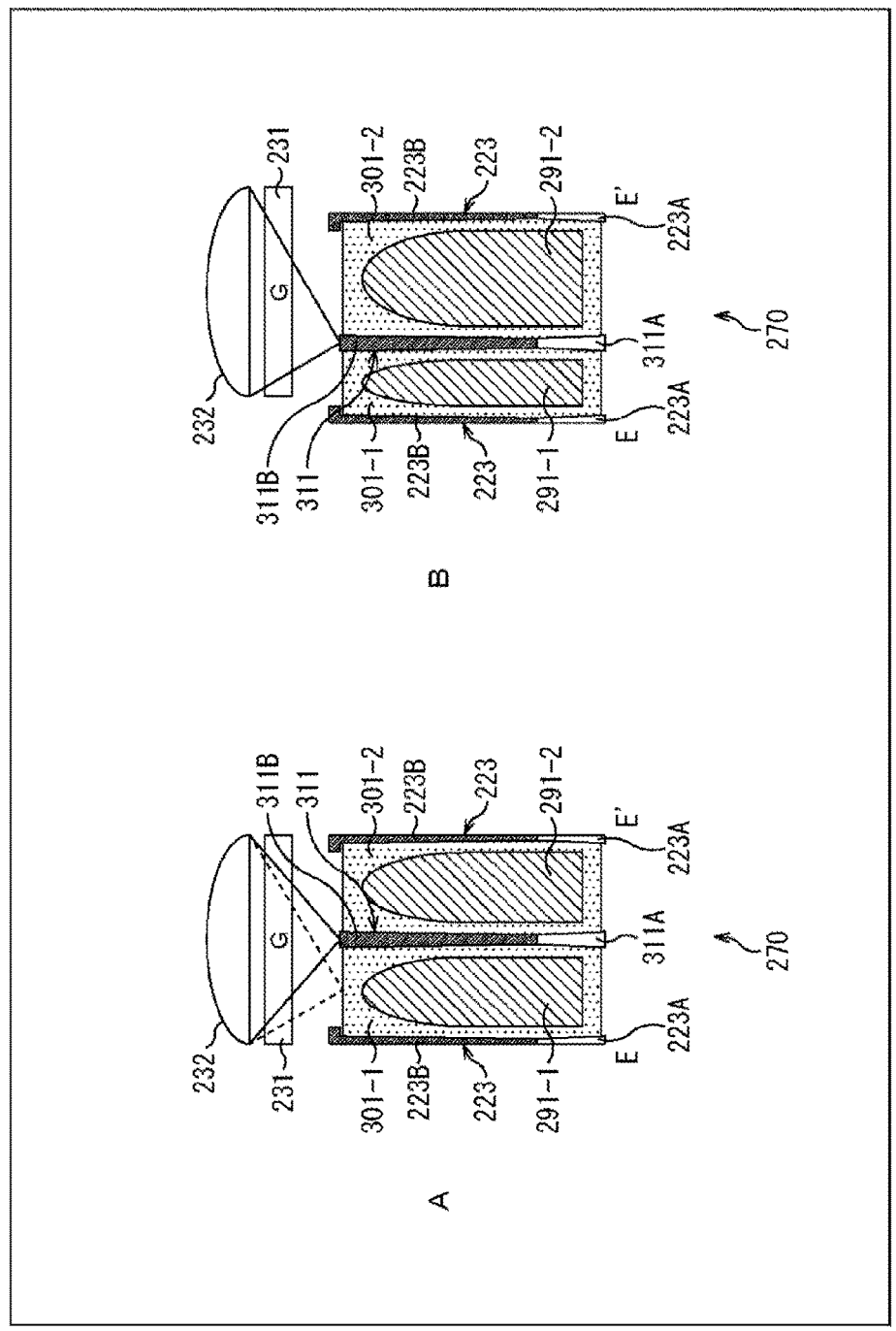
FIG. 24 is a cross-sectional view taken along the line E-E' in FIG. 16 of a third structural example of the phase difference detection pixel shown in FIG. 15.

FIG. 24 is a cross-sectional view taken along the line E-E' in FIG. 16 of a third structural example of the phase difference detection pixel 270 shown in FIG. 15.

The same reference symbols are given to the same configurations as the configurations shown in FIGS. 16 to 18 among the configurations shown in FIG. 24. Overlapping description is omitted as appropriate.

The structure of the phase difference detection pixel 270 shown in FIG. 24 is different from the structure shown in FIGS. 16 to 18 in that the positions of the divided pixel separation wall 311, the color filter 231, and the on-chip lens 232 in the phase difference detection pixel 270 differ depending on the position on the pixel area 181 of the phase difference detection pixel 270.

That is, generally, the incidence angle of light from the on-chip lens differs between the center of the angle of view of the CMOS image sensor and the end portion of the angle of view. As a result, in the pixel at the end portion, light does not sufficiently enter the PD, and the pixel signal is reduced.

Therefore, in the phase difference detection pixel 270 shown in FIG. 24, the positions of the divided pixel separation wall 311, the color filter 231, and the on-chip lens 232 in the phase difference detection pixel 270 are changed depending on the position on the pixel area 181 of the phase difference detection pixel 270.

Specifically, in the case where the position on the pixel area 181 of the phase difference detection pixel 270 is the center of the angle of view of the CMOS image sensor, the color filter 231 and the on-chip lens 232 are arranged so that the center of the P-type impurity 210 is centered as shown in Part A of FIG. 24. Further, the divided pixel separation wall 311 is formed at the center in the horizontal direction or the perpendicular direction of the P-type impurity 210.

Meanwhile, in the case where the position on the pixel area 51 of the phase difference detection pixel 270 is the end portion of the angle of view of the CMOS image sensor, the centers of the color filter 231 and the on-chip lens 232 are arranged so as to be displaced from the center of the P-type impurity 210 as shown in Part B of FIG. 24. Further, the divided pixel separation wall 311 is formed at a position displaced from the center in the horizontal direction or the perpendicular direction of the P-type impurity 210. That is, the P-type impurity 210 is unequally divided into the P-type impurities 301-1 to 301-4. In the example of FIG. 24, the size of the PD 291 differs depending on the size of the P-type impurity 301.

In this way, the pupil correction for bringing the optical center of the phase difference detection pixel 270 closer to the center of the phase difference detection pixel 270 can be performed. As a result, it is possible to reduce the difference between the pixel signals generated depending on the position on the pixel area 181 of the phase difference detection pixel 270. Further, since not only the positions of the color filter 231 and the on-chip lens 232 but also the position of the divided pixel separation wall 311 are changed, it is possible to reduce the difference between the pixel signals even in the case where the incidence angle at the end portion of the angle of view is large.

Note that although both the positions of the color filter 231 and the on-chip lens 232 and the position of the divided pixel separation wall 311 are changed depending on the position on the pixel area 181 of the phase difference detection pixel 270 in the example of FIG. 24, only one of them may be changed.

(Fourth Structural Example of Phase Difference Detection Pixel)

Figure 25:
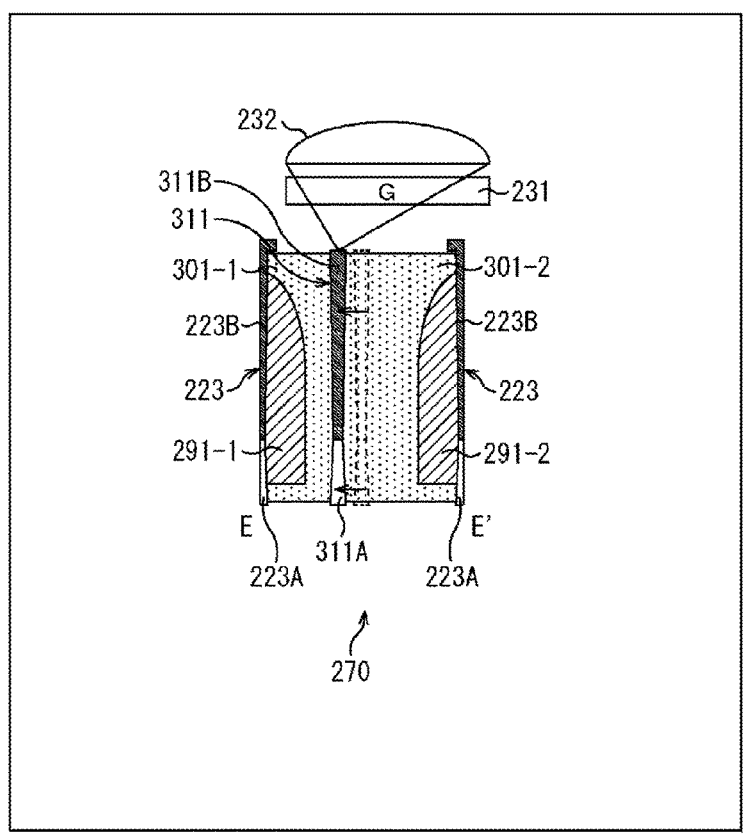
FIG. 25 is a cross-sectional view taken along the line E-E' in FIG. 16 of a fourth structural example of the phase difference detection pixel at the end portion of the angle of view of a third embodiment the CMOS image sensor.

FIG. 25 is a cross-sectional view taken along the line E-E' in FIG. 16 of a fourth structural example of the phase difference detection pixel 270 at the end portion of the angle of view of the third embodiment the CMOS image sensor.

The same reference symbols are given to the same configurations as the configurations shown in FIG. 24 among the configurations shown in FIG. 25. Overlapping description is omitted as appropriate.

The structure of the phase difference detection pixel 270 shown in FIG. 25 is different from the structure shown in FIG. 24 in that the size of the PD 291 is constant regardless of the size of the P-type impurity 301.

Specifically, in the phase difference detection pixel 270 shown in FIG. 25, the PD 291 having a size corresponding to the minimum size of the P-type impurity 301 is formed on the boundary side of the phase difference detection pixel 270. As a result, the size of each PD 291 is the same, and the saturation amount of charges stored in each divided pixel 271 is the same.

(Method of Manufacturing Fourth Structural Example of Phase Difference Detection Pixel)

Figure 26:
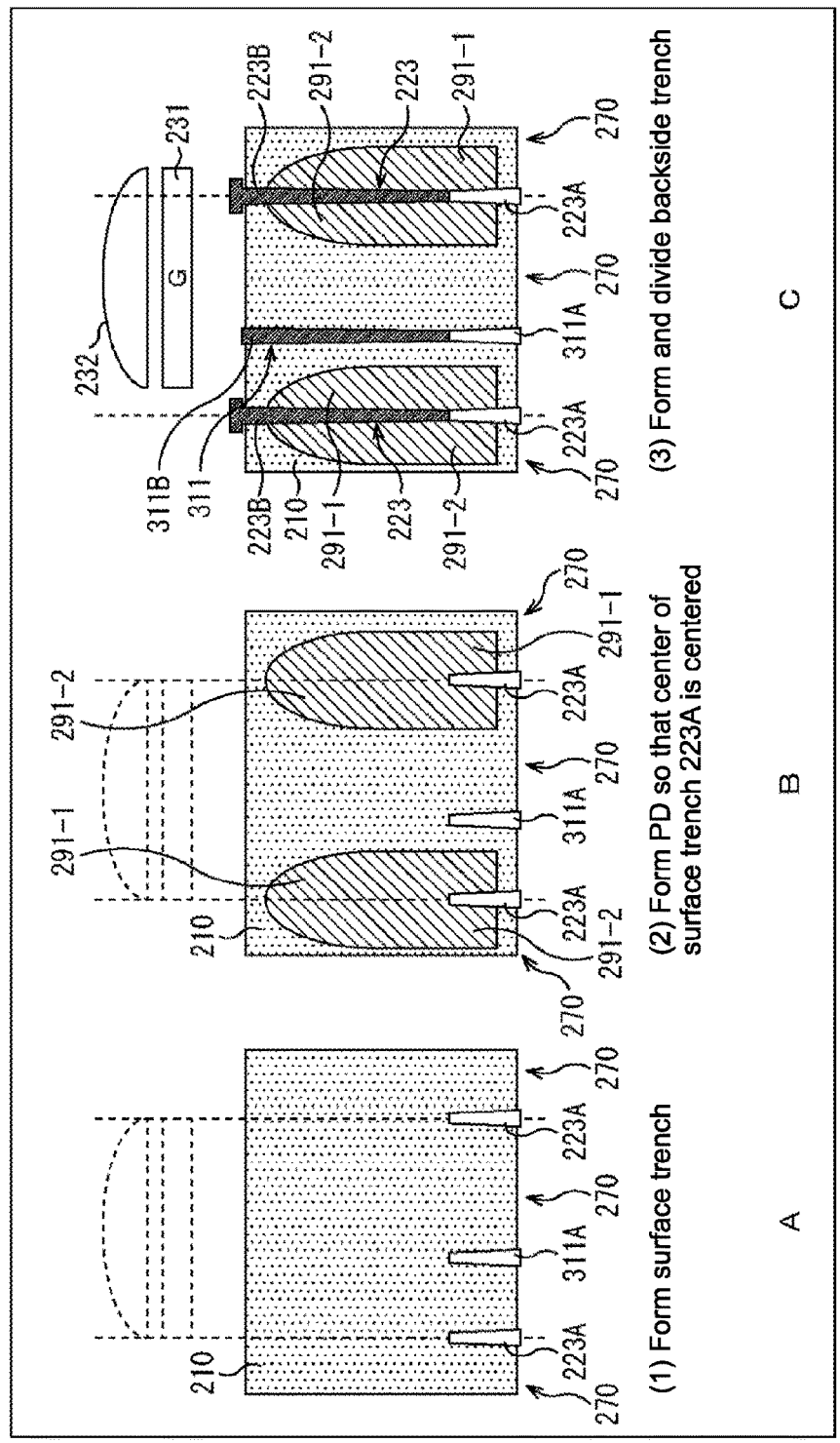
FIG. 26 is a diagram describing a method of manufacturing the PD of the phase difference detection pixel shown in FIG. 25.

FIG. 26 is a diagram describing a method of manufacturing the PD 291 of the phase difference detection pixel 270 shown in FIG. 25.

As shown in Part A of FIG. 26, first, the front-side trenches 223A are formed in the P-type impurity 210 at intervals corresponding to the size of the phase difference detection pixel 270. Further, depending on the position on the pixel area 181 of the phase difference detection pixel 270, which has the two adjacent front-side trenches 223A as boundaries with other adjacent phase difference detection pixel 270, the front-side trench 311A is formed at a position between the two front-side trench 223A.

Next, as shown in Part B of FIG. 26, a pattern corresponding to the PD 291 in the amount corresponding to two divided pixels 271 adjacent across the phase difference detection pixel 270 is formed so that the center of the front-side trench 223A is centered. Then, by injecting N-type impurities depending on the formed pattern, the PD 291 in the amount corresponding to two divided pixels 271 adjacent across the phase difference detection pixel 270 is formed.

Finally, as shown in Part C of FIG. 26, the backside trench 223B is formed so as to be in contact with the front-side trench 223A. As a result, the PD 291 in the amount corresponding to the two adjacent divided pixels 271 is divided, and the PD 291 of each divided pixel 271 is formed on the side of the pixel separation wall 223, i.e., on the boundary side of the phase difference detection pixel 270.

Further, the backside trench 311B is formed so as to be in contact with the front-side trench 311A, and the color filter 231 and the on-chip lens 232 are formed at positions depending on the position on the pixel area 181 of the phase difference detection pixel 270.

As described above, in the manufacturing method in FIG. 26, the PD 291 in the amount corresponding to two divided pixels 271 is formed once, and the PD 291 in the amount corresponding to the two divided pixels 271 is divided into the PD 291 of each divided pixel 271 by the pixel separation wall 223. Therefore, as compared with the case where the PD 291 of each divided pixel 271 is individually formed, pattern formation at the timing of forming the PD 291 can be easily performed.

Meanwhile, in the case of individually forming the PD 291 of each divided pixel 271, it is necessary to form a pattern corresponding to the PD 291 having a size corresponding to the minimum size of the P-type impurity 301, which is smaller than the normal size. Therefore, the degree of difficulty of pattern formation at the time of forming the PD 291 is high.

(Fifth Structural Example of Phase Difference Detection Pixel)

Figure 27:
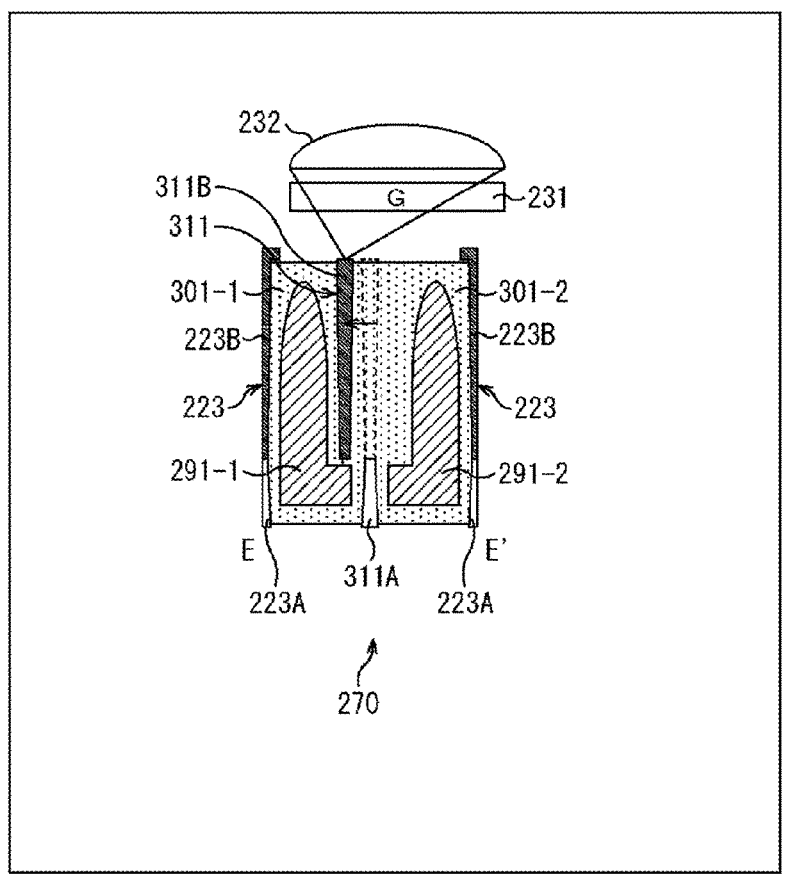
FIG. 27 is a cross-sectional view taken along the line E-E' in FIG. 16 of a fifth structural example of the phase difference detection pixel at the end portion of the angle of view of the third embodiment the CMOS image sensor to which the present disclosure is applied.

FIG. 27 is a cross-sectional view taken along the line E-E' in FIG. 16 of a fifth structural example of the phase difference detection pixel 270 at the end portion of the angle of view of the third embodiment the CMOS image sensor to which the present disclosure is applied.

The same reference symbols are given to the same configurations as the configurations shown in FIG. 25 among the configurations shown in FIG. 27. Overlapping description is omitted as appropriate.

The structure of the phase difference detection pixel 270 shown in FIG. 27 is different from the structure shown in FIG. 25 in that the front-side trench 311A is formed at the center of the phase difference detection pixel 270 regardless of the position on the pixel area 181 of the phase difference detection pixel 270, the size of the PD 291 on the side of the front surface is larger than the size on the side of the back surface, and the potential on the side of the front surface of the PD 291 is deeper than that on the side of the back surface.

Specifically, in the phase difference detection pixel 270 shown in FIG. 27, the position of the backside trench 311B differs depending on the position on the pixel area 181 of the phase difference detection pixel 270. Meanwhile, the position of the front-side trench 311A is formed at the center of the phase difference detection pixel 270 regardless of the position on the pixel area 181 of the phase difference detection pixel 270.

Therefore, as shown in FIG. 27, in the phase difference detection pixel 270 at the end portion of the angle of view, the positions of the front-side trench 311A and the backside trench 311B differ, and the front-side trench 311A and the backside trench 311B are not in contact with each other.

Further, the sizes in the horizontal direction and the perpendicular direction on the back surface of the PD 291 are respectively sizes corresponding to the minimum size in the horizontal direction and the perpendicular direction of the P-type impurity 301. Meanwhile, the sizes in the horizontal direction and the perpendicular direction on the side of the front surface of the PD 291 respectively correspond to the sizes of half the size in the horizontal direction and the perpendicular direction of the P-type impurity 210 of the phase difference detection pixel 270. The sizes of all the PDs 291 are the same. Further, the potential on the side of the front surface of the PD 291 is deeper than that on the side of the back surface.

As described above, in the phase difference detection pixel 270 shown in FIG. 27, the front-side trench 311A is formed at the center of the phase difference detection pixel 270 regardless of the position on the pixel area 181 of the phase difference detection pixel 270. Therefore, the sizes in the horizontal direction and the perpendicular direction on the side of the front surface of the PD 291 can be made to the sizes corresponding to half the sizes in the horizontal direction and the perpendicular direction of the P-type impurity 210 of the phase difference detection pixel 270, respectively. As a result, the size of the PD 291 becomes larger than that in the case of FIG. 26, and the amount of charges that can be stored in the PD 291 increases.

Further, since the size on the side of the front surface of the PD 291 is sufficiently large and the potential is deep, the amount of saturated charges of the PD 291 is large.

(Method of Manufacturing Fifth Structural Example of Phase Difference Detection Pixel)

Figure 28:
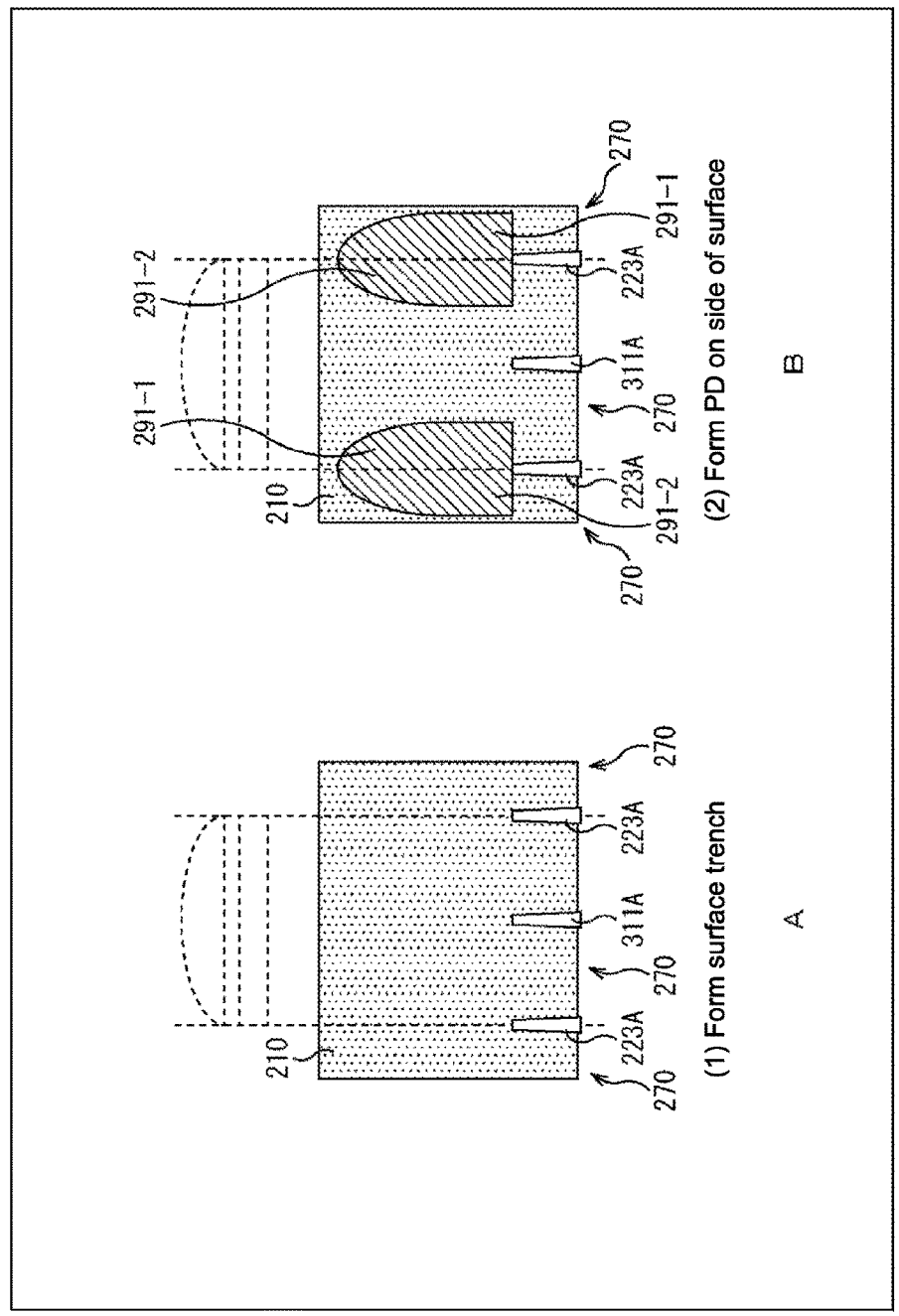
FIG. 28 is a diagram describing a method of manufacturing the PD of the phase difference detection pixel shown in FIG. 27.
Figure 29:
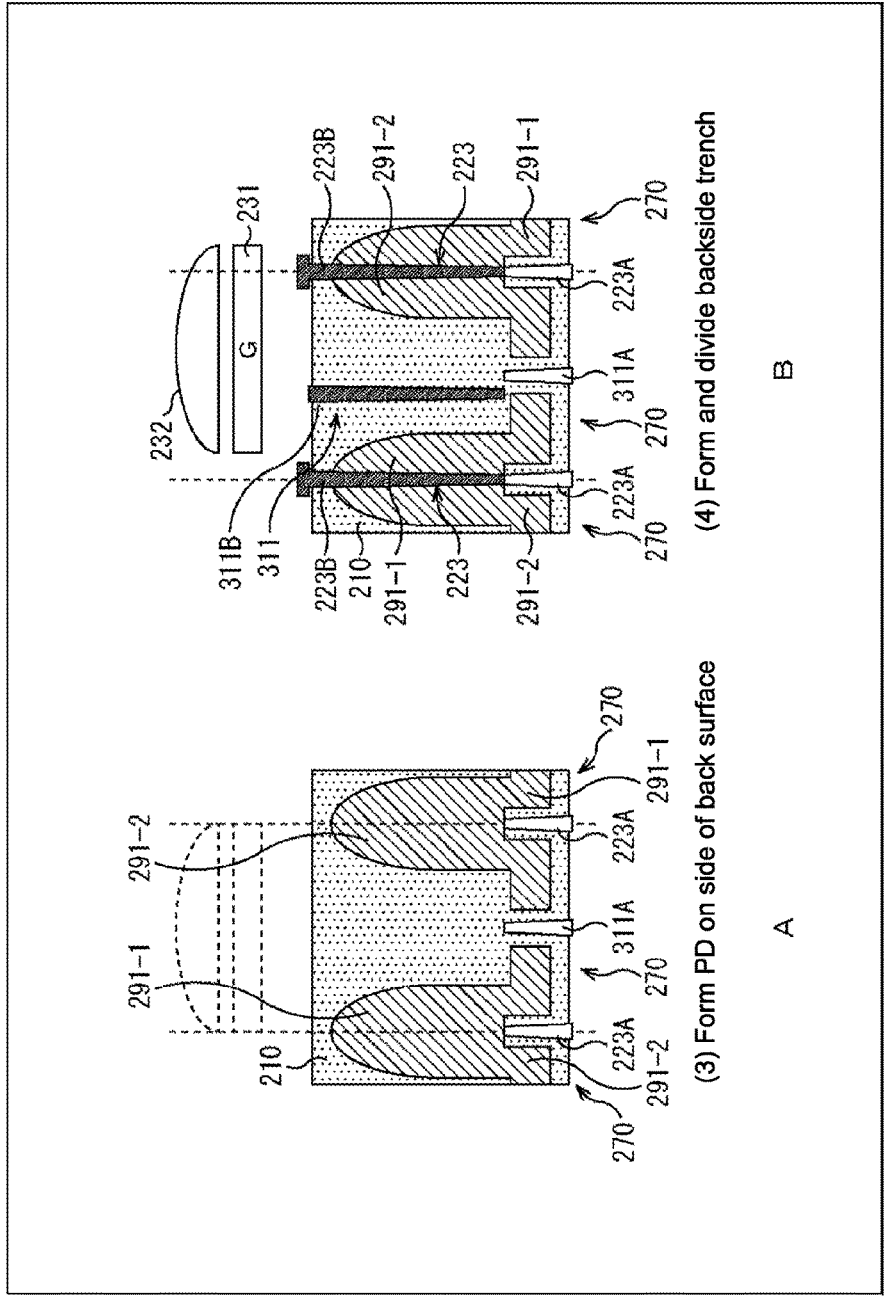
FIG. 29 is a diagram describing a method of manufacturing the PD of the phase difference detection pixel shown in FIG. 27.

FIG. 28 and FIG. 29 are each a diagram describing a method of manufacturing the PD 291 of the phase difference detection pixel 270 shown in FIG. 27.

As shown in Part A of FIG. 28, first, the front-side trench 223A is formed in the P-type impurity 210 at intervals corresponding to the size of the phase difference detection pixel 270. Further, the front-side trench 311A is formed at the center between two adjacent front-side trenches 223A.

Next, as shown in Part B of FIG. 28, a pattern corresponding to the side of the back surface of the PD 291 in the amount corresponding to two divided pixels 271 adjacent across the phase difference detection pixel 270 is formed so that the center of the front-side trench 223A is centered. Then, by injecting the N-type impurity into the side of the back surface depending on the formed pattern, the side of the back surface of the PD 291 in the amount corresponding to two divided pixels 271 adjacent across the phase difference detection pixel 270 is formed.

Then, as shown in Part A of FIG. 29, a pattern corresponding to the side of the front surface of the PD 291 of each divided pixel 271 is formed. Then, by injecting the N-type impurity into the side of the front surface depending on the formed pattern, the side of the front surface of the PD 291 of each divided pixel 271 is formed to be connected to the side of the back surface of the PD 291 in the amount corresponding to the two divided pixels 271 corresponding to the divided pixel 271.

Finally, as shown in Part B of FIG. 29, the backside trench 223B is formed to be in contact with the front-side trench 223A. Accordingly, the side of the back surface of the PD 291 in the amount corresponding to the two adjacent divided pixels 271 is divided, and the side of the back surface of the PD 291 of each divided pixel 271 is formed on the side of the pixel separation wall 223, i.e., on the boundary side of the phase difference detection pixel 270.

Further, the backside trench 311B is formed depending on the position on the pixel area 181 of the phase difference detection pixel 270 having the two adjacent front-side trenches 223A as boundaries with other adjacent phase difference detection pixel 270. Further, the color filter 231 and the on-chip lens 232 are formed at positions corresponding to the position on the pixel area 181 of the phase difference detection pixel 270.

As described above, in the manufacturing method shown in FIG. 28 and FIG. 29, the side of the back surface of the PD 291 in the amount corresponding to the two divided pixels 271 is formed once, and the side of the back surface of the PD 291 in the amount corresponding to the two divided pixels 271 is divided into the side of the back surface of the PD 291 of each divided pixel 271 by the pixel separation wall 223. Therefore, as in the case of FIG. 26, it is possible to easily perform pattern formation at the time of forming the side of the back surface of the PD 291 as compared with the case where the side of the back surface of the PD 291 of each divided pixel 271 is individually formed.

Note that although the front-side trench 311A is formed in the phase difference detection pixel 270 shown in FIG. 27, the front-side trench 311A does not necessary need to be formed.

(Sixth Structural Example of Phase Difference Detection Pixel)

Figure 30:
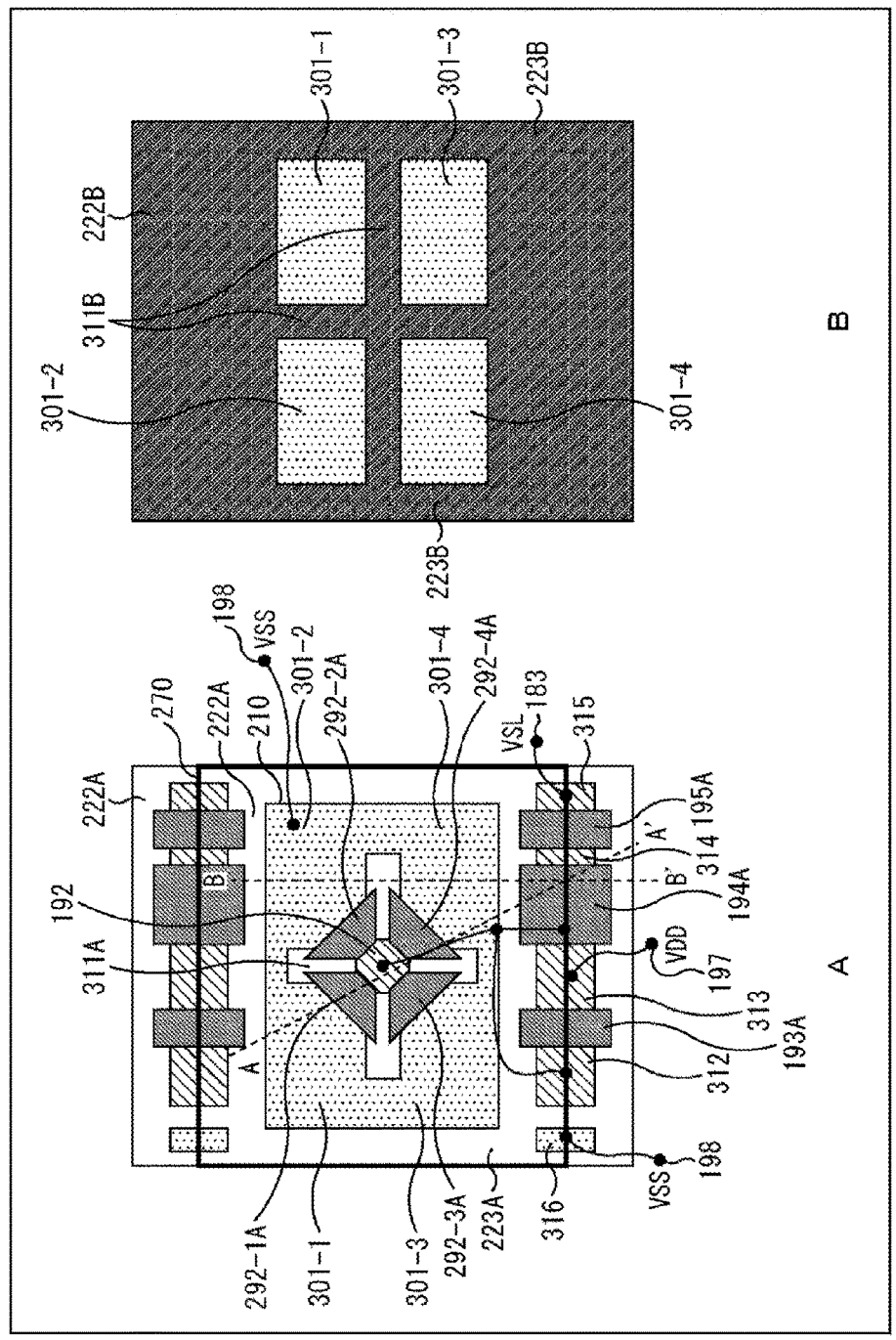
FIG. 30 is a diagram showing a sixth structural example of the phase difference detection pixel shown in FIG. 15.
Figure 31:
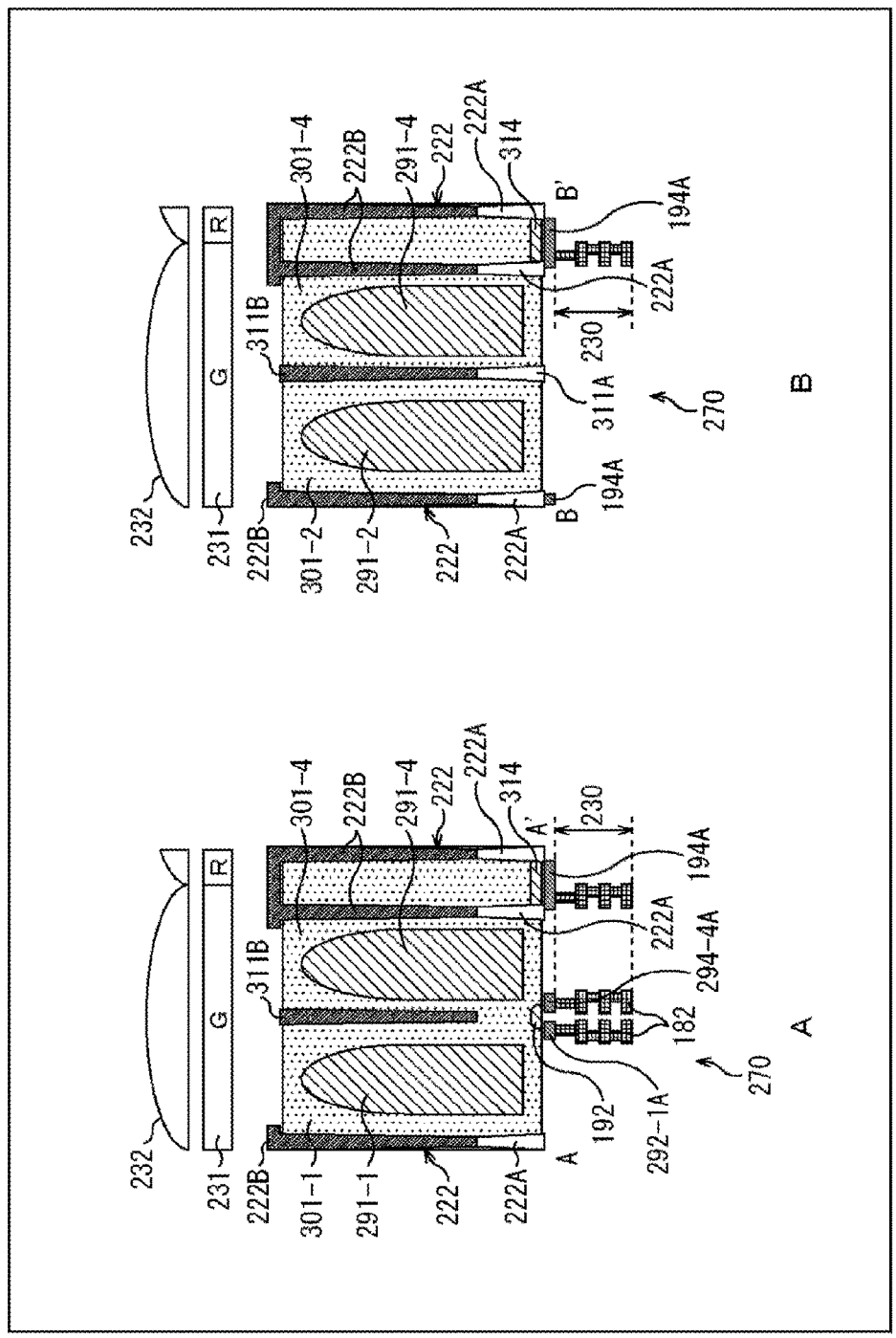
FIG. 31 is a diagram showing the sixth structural example of the phase difference detection pixel shown in FIG. 15.

FIG. 30 and FIG. 31 are each a diagram showing a sixth structural example of the phase difference detection pixel 270 shown in FIG. 15.

The same reference symbols are given to the same configurations as the configurations shown in FIGS. 16 to 18 among the configurations shown in FIG. 30 and FIG. 31. Overlapping description is omitted as appropriate.

The structure of the phase difference detection pixel 270 shown in FIG. 30 and FIG. 31 is different from that shown in FIGS. 16 to 18 in that the pixel separation wall 222 is formed by the two front-side trenches 222A sandwiching the N-type impurities 312 to 315 and the P-type impurity 316, and the respective two backside trenches 222B that are in contact with the two front-side trenches 222A, and the P-type impurity 210 is connected to the well electrode 198.

Part A of FIG. 30 and Part B of FIG. 30 are diagrams showing the phase difference detection pixel 270 as seen from the side of the front surface and back surface of the CMOS image sensor, respectively. Part A of FIG. 31 and Part B of FIG. 31 are cross-sectional views taken along the lines A-A' and B-B' in FIG. 30, respectively.

In the phase difference detection pixel 270 shown in FIG. 30 and FIG. 31, the pixel separation wall 223 is formed by the two front-side trenches 222A sandwiching the N-type impurities 312 to 315 and the P-type impurity 316, and the two backside trench 222B that are in contact with the respective two front-side trenches 222A. Accordingly, it is possible to completely electrically separately the reset transistor 193, the amplification transistor 194, the selection transistor 195, the power supply electrode 197, and the well electrode 198, and the P-type impurity 210.

As a result, it is possible to separate the power supply electrode 197 from the PD 291. Further, it is possible to suppress degradation of imaging characteristics due to leakage of charges from the PD 291 to the reset transistor 193, the amplification transistor 194, the selection transistor 195, the power supply electrode 197, or the well electrode 198. Note that since the P-type impurity 210 is directly connected to the well electrode 198, it is possible to fix the potential of the P-type impurity 210 to the potential of the well electrode 198.

Further, in the case where metal or a material having a low transmittance is used for the front-side trench 222A and the backside trench 222B, it is also possible to completely optically separate the reset transistor 193, the amplification transistor 194, the selection transistor 195, the power supply electrode 197, and the well electrode 198 from the P-type impurity 210.

(Seventh Example of Phase Difference Detection Pixel)

Figure 32:
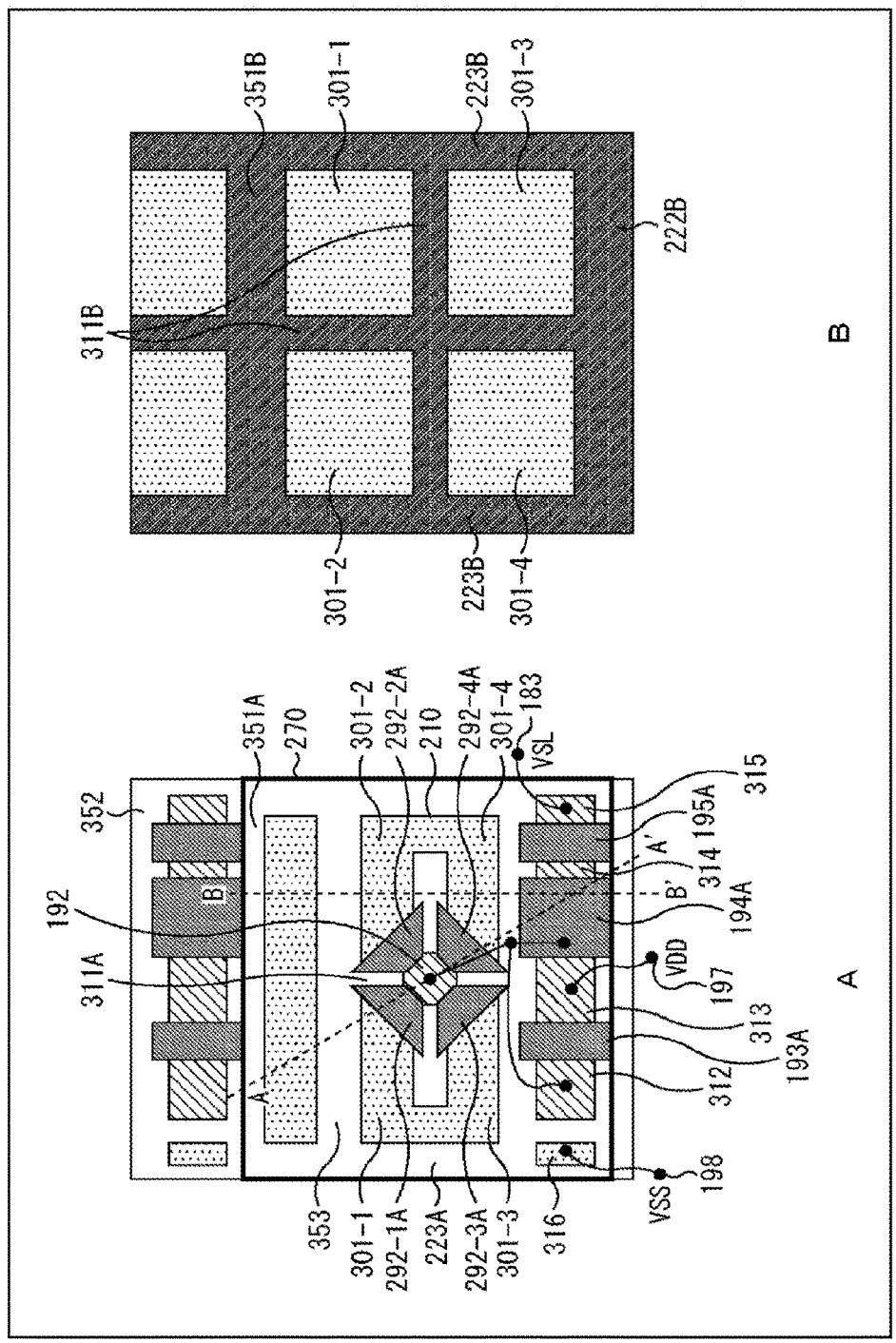
FIG. 32 is a diagram showing a seventh structural example of the phase difference detection pixel shown in FIG. 15.
Figure 33:
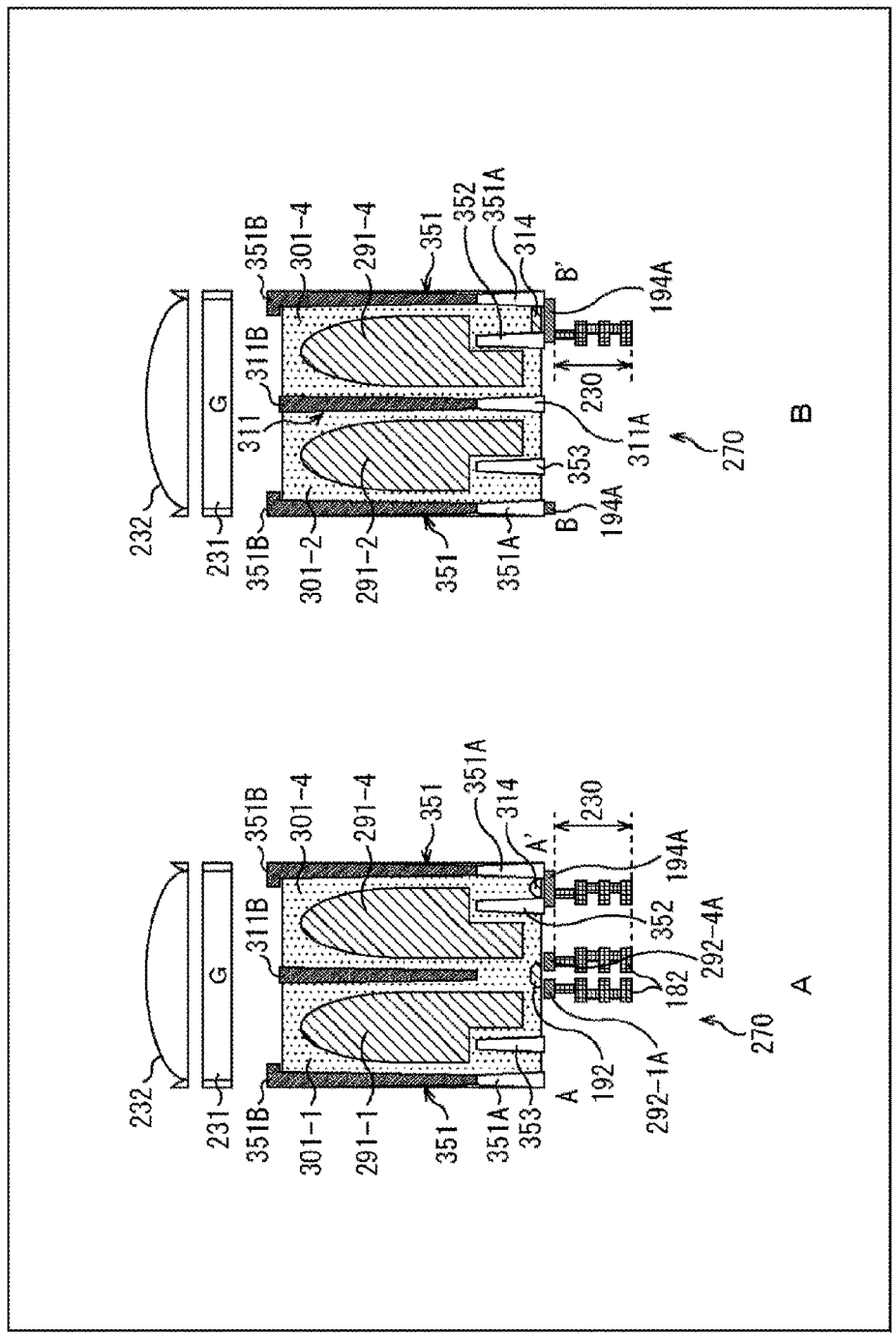
FIG. 33 is a diagram showing the seventh structural example of the phase difference detection pixel shown in FIG. 15.

FIG. 32 and FIG. 33 are each a diagram showing a seventh structural example of the phase difference detection pixel 270 shown in FIG. 15.

The same reference symbols are given to the same configurations as the configurations shown in FIGS. 16 to 18 among the configurations shown in FIGS. 32 and 33. Overlapping description is omitted as appropriate.

The structure of the phase difference detection pixel 270 shown in FIG. 32 and FIG. 33 is different from the structure shown in FIGS. 16 to 18 in that a pixel separation wall 351 is formed instead of the pixel separation wall 222 and a front-side trench 352 and a dummy front-side trench 353 are newly formed.

Part A of FIG. 32 and Part B of FIG. 32 are diagrams showing the phase difference detection pixel 270 as seen from the front surface and back surface of the CMOS image sensor. Part A of FIG. 33 and Part B of FIG. 33 cross-sectional views taken along the lines A-A' and B-B' in Part A of FIG. 32, respectively.

The phase difference detection pixel 270 shown in FIG. 32 and FIG. 33, the pixel separation wall 351 is formed between the P-type impurities 301 adjacent in the perpendicular direction across the phase difference detection pixel 270. The pixel separation wall 351 is formed by contact between a front-side trench 351A and a backside trench 351B. Accordingly, it is possible to prevent leakage of charges between the PDs 291 adjacent in the perpendicular direction across the phase difference detection pixel 190.

Further, the front-side trench 352 (electrode trench) is formed so as to sandwich the N-type impurities 312 to 315 and the P-type impurity 316 between the front-side trench 352 and the front-side trench 351A. Further, the dummy front-side trench 353 is formed at a position symmetrical to the front-side trench 352 with respect to the divided pixel separation wall 311 closest to the front-side trench 352. Accordingly, it is possible to make the size of each PD 291 the same.

That is, in the P-type impurity 301 in which the front-side trench 352 is formed, the PD 291 cannot be formed in the area of the front-side trench 352. Therefore, the size of the PD 291 formed in the P-type impurity 301 in which the front-side trench 352 is formed is smaller than the size of the PD 291 formed in the P-type impurity 301 in which the front-side trench 352 is not formed.

Therefore, in the phase difference detection pixel 270 shown in FIG. 32 and FIG. 33, in the P-type impurity 301 in which the front-side trench 352 is not formed, the dummy front-side trench 353 is formed at a position corresponding to the front-side trench 352. Accordingly, the size of the PD 291 formed in each P-type impurity 301 is the same regardless of the presence/absence of the front-side trench 352. Further, the shape of the PD 291 has symmetry.

Further, since the PD 291 can be formed on the side of the back surface of the area where the front-side trench 352 or the front-side trench 353 is formed in the P-type impurity 301, the aperture ratio of the PD 291 is large. Therefore, the sensitivity is good.

(Eighth Structural Example of Phase Difference Detection Pixel)

Figure 34:
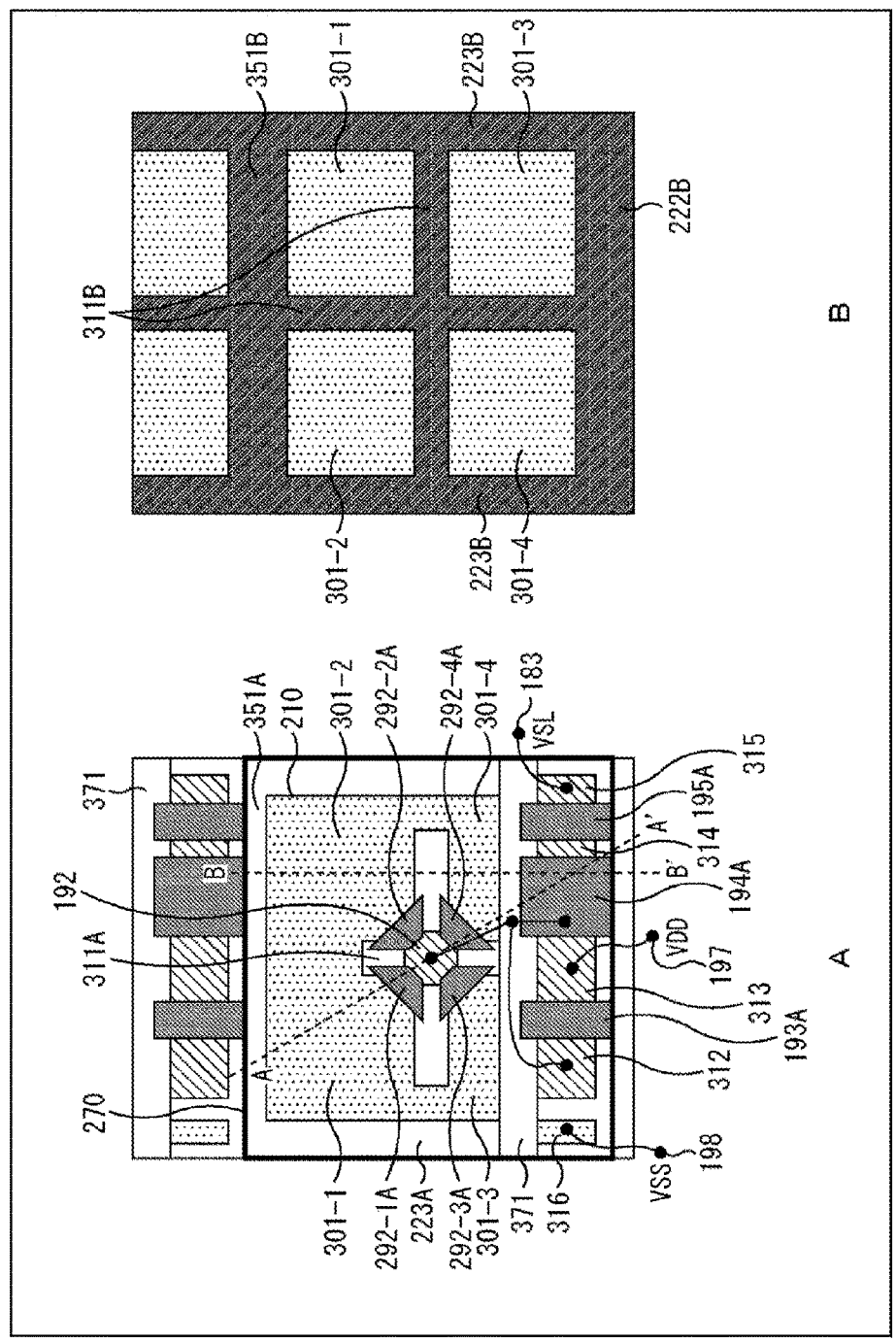
FIG. 34 is a diagram showing an eighth structural example of the phase difference detection pixel shown in FIG. 15.
Figure 35:
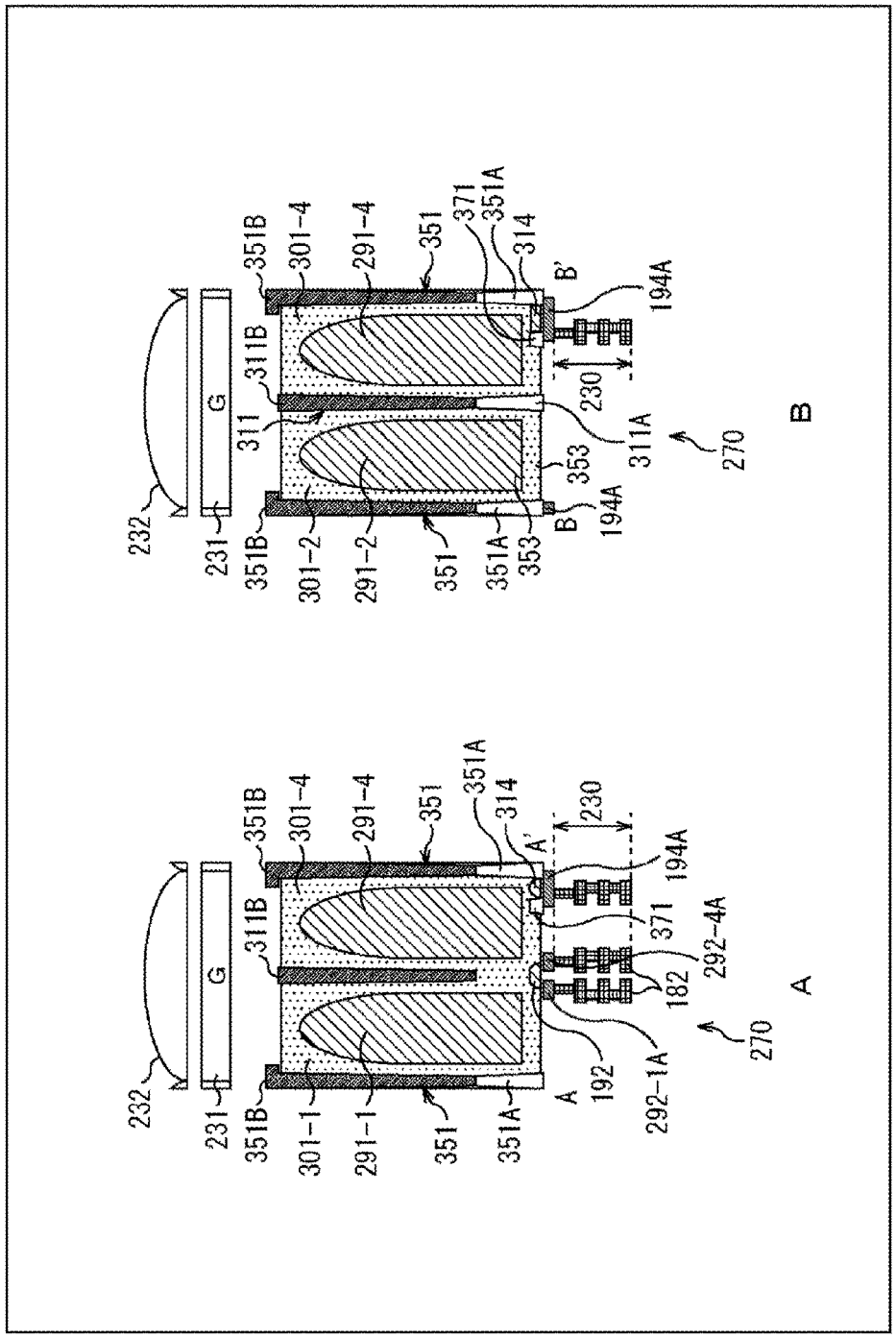
FIG. 35 is a diagram showing the eighth structural example of the phase difference detection pixel shown in FIG. 15.

FIG. 34 and FIG. 35 are each a diagram showing an eighth structural example of the phase difference detection pixel 270 shown in FIG. 15.

The same reference symbols are given to the same configurations as the configurations shown in FIGS. 32 and 33 among the configurations shown in FIGS. 34 and 35. Overlapping description is omitted as appropriate.

The structure of the phase difference detection pixel 270 shown in FIG. 34 and FIG. 35 is different from the structure shown in FIG. 32 and FIG. 33 in that a front-side trench 371 is formed instead of the front-side trench 352 and the front-side trench 353 is not formed.

Part A of FIG. 34 and Part B of FIG. 34 are diagrams showing the phase difference detection pixel 270 as seen from the front surface and back surface of the CMOS image sensor, respectively. Part A of FIG. 35 and Part B of FIG. 35 are cross-sectional views taken along the lines A-A' and B-B' of Part A of FIG. 34, respectively.

In the phase difference detection pixel 270 shown in FIG. 34 and FIG. 35, the front-side trench 371 (electrode trench) is formed so as to sandwich the N-type impurities 312 to 315 and the P-type impurity 316 between the front-side trench 371 and the front-side trench 351A. The length in the depth direction of the front-side trench 371 is sufficiently smaller than that of the front-side trench 351A.

Therefore, even in the case where the front-side trench 371 is formed in the P-type impurity 301, it is possible to form the PD 291 in the entire area on the side of the front surface. Therefore, the size of the PD 291 formed in each P-type impurity 301 can be made the same regardless of the presence/absence of the front-side trench 371. Further, the size of the PD 291 can be made sufficiently large.

Note that the front-side trench 371 can be formed by, for example, CION, STI, II separation, or the like.

(Ninth Structural Example of Phase Difference Detection Pixel)

Figure 36:
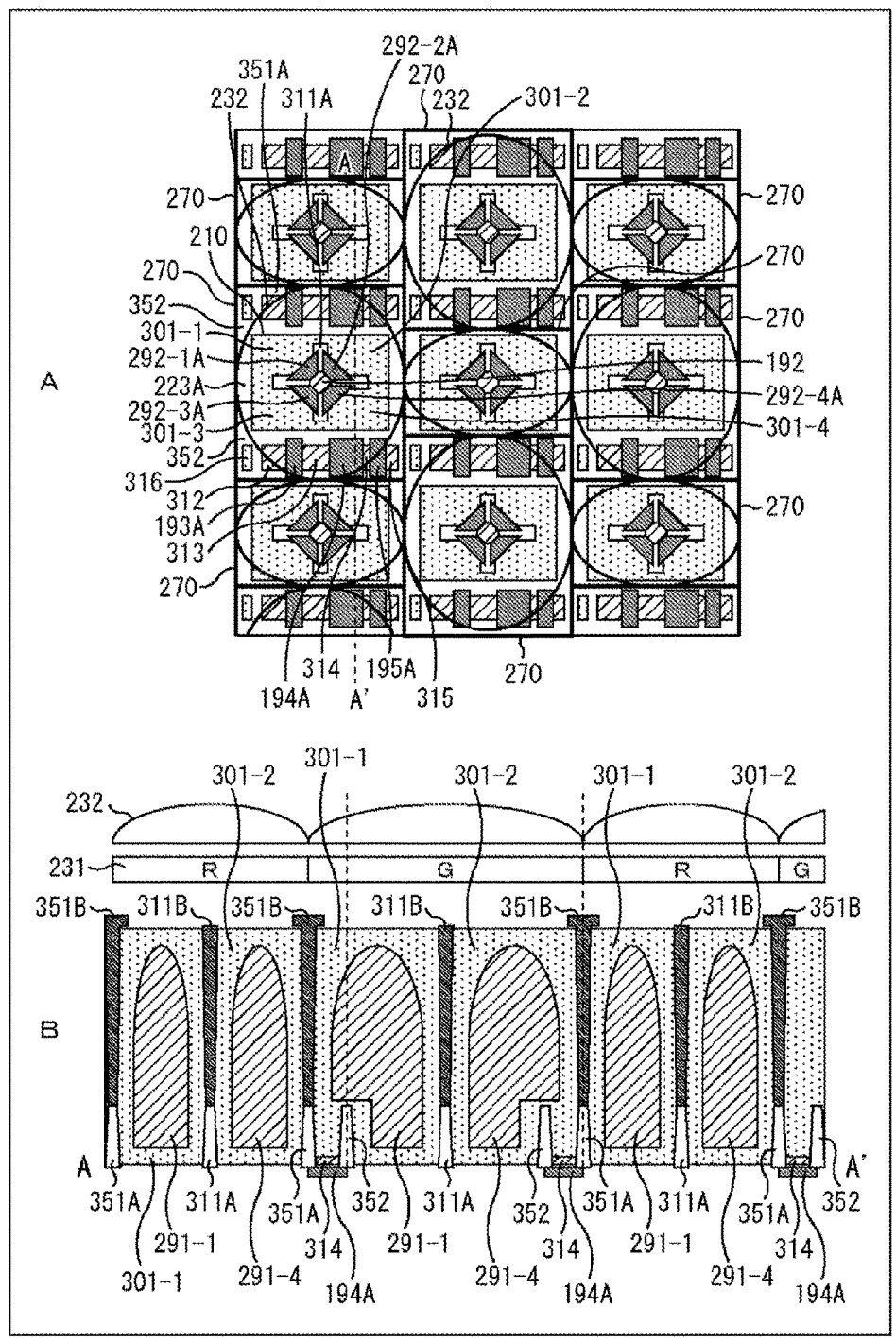
FIG. 36 is a diagram showing a ninth structural example of the phase difference detection pixel shown in FIG. 15.

FIG. 36 is a diagram showing a ninth structural example of the phase difference detection pixel 270 shown in FIG. 15.

The same reference symbols are given to the same configurations as the configurations shown in FIGS. 32 and 33 among the configurations shown in FIG. 36. Overlapping description is omitted as appropriate.

The structure of the phase difference detection pixel 270 shown in FIG. 36 is different from the structure shown in FIG. 32 and FIG. 33 in that the size of the adjacent phase difference detection pixel 270 differs.

Part A of FIG. 36 is a diagram showing 3 (horizontal)×3 (vertical) phase difference detection pixels 270 as seen from the front surface and back surface of the CMOS image sensor. Part B of FIG. 36 is a cross-sectional view taken along the line A-A' in Part A of FIG. 36. Note that in Part A of FIG. 36, the on-chip lens 232 formed on the side of the back surface is shown for convenience of description.

In FIG. 36, the phase difference detection pixel 270 having the green color filter 231 includes the N-type impurities 312 to 315 and the P-type impurity 316 of itself and those of the phase difference detection pixel 270 having the blue or red color filter 231 adjacent to the phase difference detection pixel 270. Therefore, in all the P-type impurities 301 constituting the phase difference detection pixel 270 having the green color filter 231, the front-side trench 352, the N-type impurities 312 to 315, and the P-type impurity 316 of the phase difference detection pixel 270 or those of the phase difference detection pixel 270 adjacent thereto are formed.

Therefore, in all the P-type impurities 301, the PD 291 is not formed in the area of the front-side trench 352 on the side of the front surface, and the size of the PD 291 formed in each P-type impurity 301 is the same. Further, the shape of each PD 291 has symmetry.

Meanwhile, the phase difference detection pixel 270 having the blue or red color filter 231 does not include the N-type impurities 312 to 315 and the P-type impurity 316. Therefore, in all the P-type impurities 301 constituting the phase difference detection pixels 270 having the blue and red color filters 231, the front-side trench 352 is not formed.

Therefore, it is possible to form the PD 291 on the entire area on the side of the front surface in all the P-type impurities 301, and the size of the PD 291 formed in each P-type impurity 301 is the same. Further, the shape of each PD 291 has symmetry.

It is thus possible to increase the size of the PD 291 of the phase difference pixel 270 having the green color filter 231 as compared with the size of the PD 291 of the phase difference detection pixel 270 having the red or blue color filter 231, and improve the sensitivity.

As a result, for example, by acquiring a pixel signal having a high S/N ratio only for many phase difference detection pixel 270 having a high sensitivity and the green color filters 231, it is possible to acquire a color image having a wide dynamic range. Specifically, by combining brightness information having a wide dynamic range acquired from a pixel signal having a large SN ratio of the phase difference detection pixel 270 having the green color filter and color information acquired by processing color information of another phase difference detection pixel 270, it is possible to acquire a color image having a wide dynamic range.

Note that although the color filter 231 and the on-chip lens 232 is formed in the area on the front surface corresponding to each phase difference detection pixel 270 in the example shown in FIG. 36, the sizes of the color filter 231 and the on-chip lens 232 may be the same in all the phase difference detection pixels 270.

The material or structure of the front-side trench 111A (112A, 113A, 221A, 222A, 223A, 311A, 322, 323, 351A) and the backside trench 111B (112B, 113B, 221B, 222B, 223B, 311B, 351B) constituting the above-mentioned one pixel separation wall 111 (112, 113, 222, 223,351) or the divided pixel separation wall 221 (311) may be the same or differ.

Further, the material or structure of the front-side trench 111A (112A, 113A, 222A, 223A, 351A) and the backside trench 111B (112B, 113B, 222B, 223B, 351B) constituting the pixel separation wall 111 (112, 113, 222, 223, 351) may be the same as or different from the material or structure of the front-side trench 221A (311A, 322, 323) and the backside trench 221B (311B) constituting the divided pixel separation wall 221 (311). The material or structure can be determined by the incidence angle of light, the size of the pixel 71 (the phase difference detection pixel 190, 270), and the like. For example, the materials of the backside trench 223B and the backside trench 311B may have different refractive indices or the like.

Figure 37:
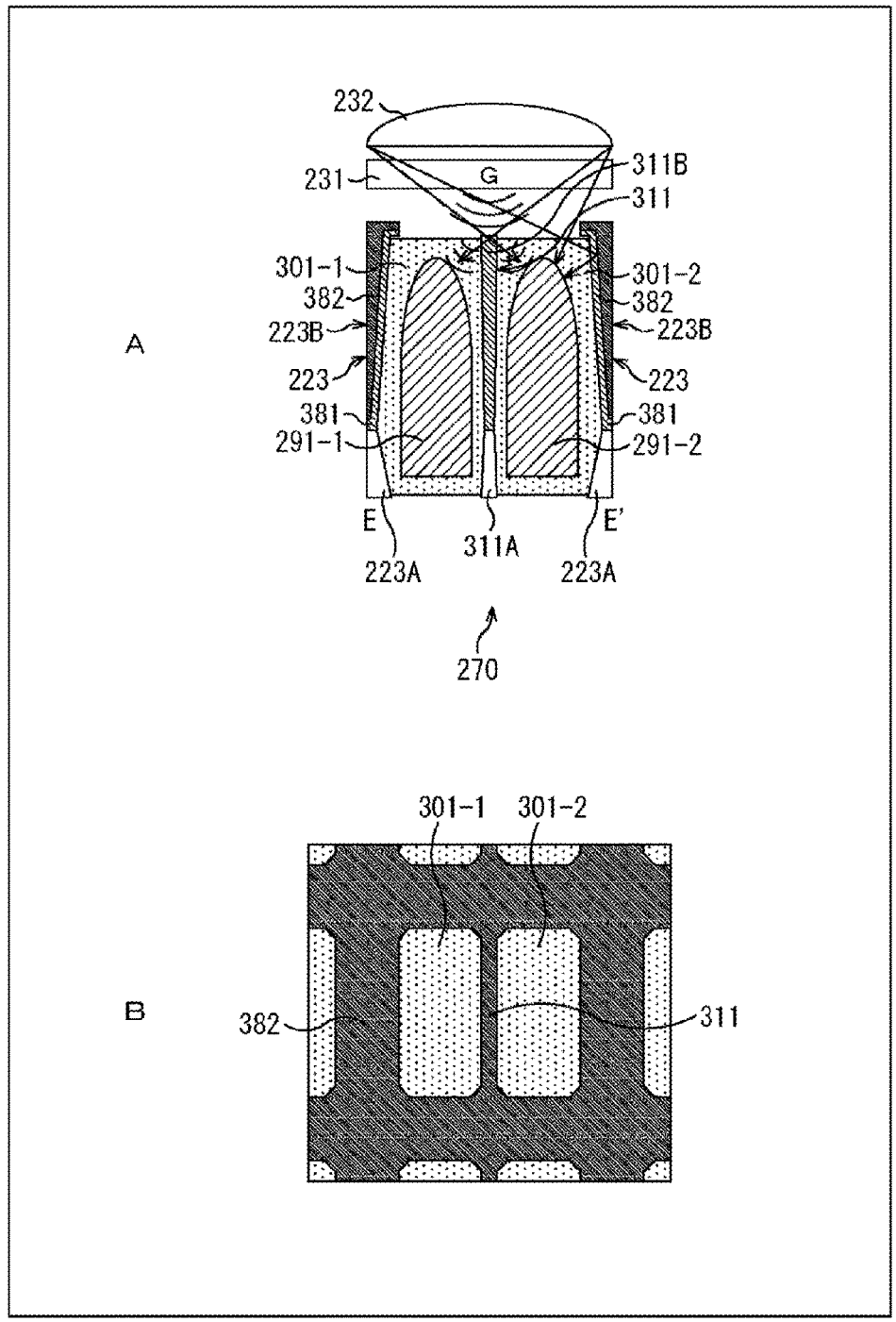
FIG. 37 is a diagram showing another structural example of the phase difference detection pixel.

Further, for example, as shown in FIG. 37, the backside trench 223B between the PDs 291 of the adjacent phase difference detection pixels 270 having the color filters 231 of different colors may be formed of a metal 382. In the case where the backside trench 223B is formed of a conductor such as the metal 382 and an impurity-doped Poly, an insulating film 381 such as an oxide film and a nitride film is formed between the conductor and a semiconductor substrate (P-type impurity 301) in order to prevent the conductor and the semiconductor substrate (P-type impurity 301) from short-circuiting. Meanwhile, the backside trench 311B between the PDs 291 having the color filters 231 of the same color in the same phase difference detection pixel 270 may be formed of a material having a high transmittance such as an oxide film to be thinner than the backside trench 223B.

Note that Part A of FIG. 37 is a cross-sectional view taken along the line E-E' in FIG. 16 of the phase difference detection pixel 270. Further, Part B of FIG. 37 is a diagram as seen from the side of the back surface of the CMOS image sensor 180.

By configuring the backside trench 223B and the backside trench 311B as shown in FIG. 37, the light that obliquely enters and is collected on the periphery of the backside trench 223B passes through the P-type impurity 301 and is reflected by the metal 382 of the backside trench 223B. Therefore, it is possible to suppress color mixing. Further, the light collected on the periphery of the backside trench 311B is not reflected by the backside trench 311B and enters the PD 291. Therefore, it is possible to suppress loss of sensitivity.

Meanwhile, in the case where the backside trench 311B includes metal similarly to the backside trench 223B, the light collected on the periphery of the backside trench 311B is reflected by the backside trench 311B and does not enter the PD 291. Therefore, loss of sensitivity occurs.

Note that it is desirable that the width of the backside trench 311B (length in the direction horizontal to the semiconductor substrate) is sufficiently small with respect to the wavelength of the incident light. In the case where the width of the backside trench 311B is sufficiently small with respect to the incident light, the light that enters the backside trench 311B formed of an oxide film or the like, which has a refractive index different from that of silicon (Si) that is a material of the semiconductor substrate, diffracts, is divided, and enters each PD 291. Therefore, it is possible to further suppress loss of sensitivity.

Further, the backside trench 223B may contain a material having a low transmittance such as polysilicon other than metal.

Figure 38:
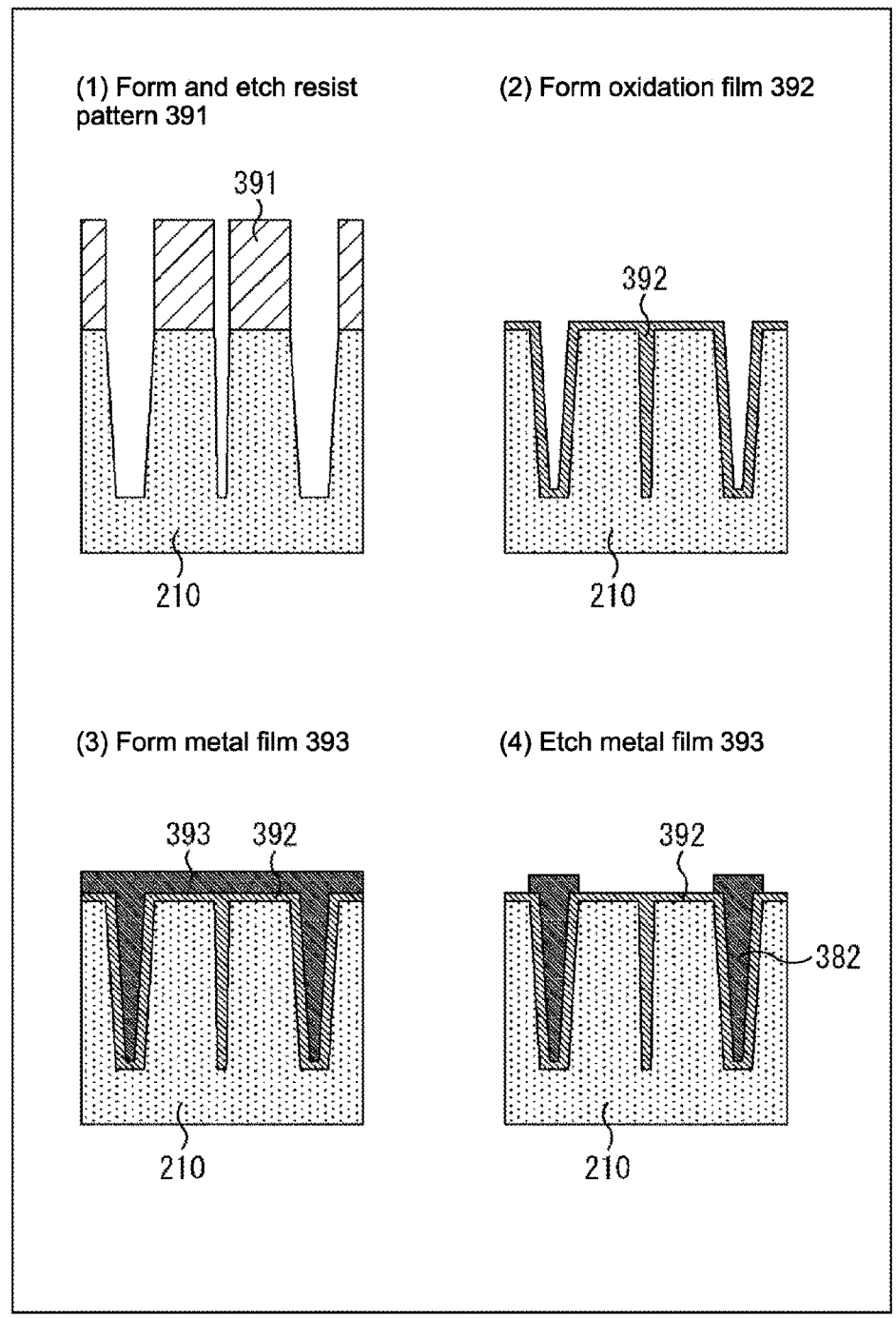
FIG. 38 is a diagram describing a method of manufacturing a backside trench shown in FIG. 37.

FIG. 38 is a diagram describing a method of manufacturing the backside trench 223B and the backside trench 311B shown in FIG. 37.

As shown in FIG. 38, in the first step, a resist pattern 391 is formed in the P-type impurity 210, and the P-type impurity 210 in the area corresponding to the backside trench 223B and the backside trench 311B is etched. Then, the resist pattern 391 is peeled off.

In the second step, a thin insulating film 392 such as an oxide film is formed in the P-type impurity 210. Here, as described above, the backside trench 311B is thinner than the backside trench 223B. That is, the width of the area corresponding to the etched backside trench 311B is narrower than the width of the area corresponding to the etched backside trench 223B. Therefore, although the area corresponding to the etched backside trench 311B is filled with the insulating film 392, the area corresponding to the etched backside trench 223B is not filled with the insulating film 392.

In the third step, a metal film (metal) 393 is formed on the insulating film 392. At this time, since the area corresponding to the backside trench 311B is filled with the insulating film 392, the metal film 393 is not embedded in the area corresponding to the backside trench 311B. However, since the area corresponding to the backside trench 223B is filled with the insulating film 392, also the metal film 393 is embedded in the area.

In the fourth step, the unnecessary metal film 393 is etched, and the metal 382 of the backside trench 223B is formed. After that, the unnecessary oxide film 392 is etched, and the insulating film 381 of the backside trench 223B and the backside trench 311B are formed.

As described above, since the widths of the backside trench 223B and the backside trench 311B differ, the materials of the backside trench 223B and the backside trench 311B can be made different only by forming the metal film 393 after forming the oxide film 392. As a result, it is possible to suppress the large increase in the number of manufacturing steps due to the different materials of the backside trench 223B and the backside trench 311B.

Figure 39:
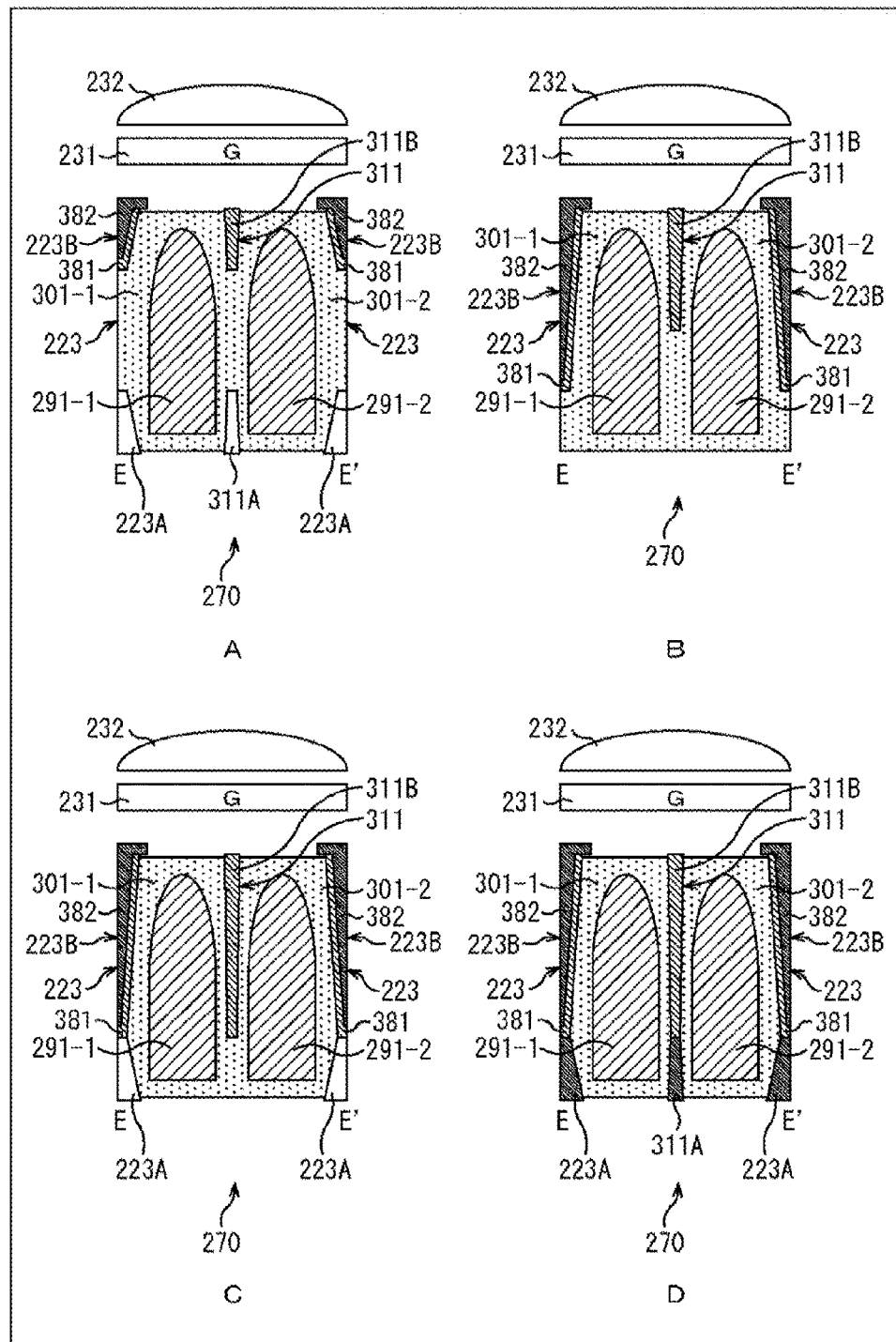
FIG. 39 is a diagram showing another structural example of the backside trench shown in FIG. 37.

Note that although the backside trench 223B (311B) is in contact with the front-side trench 223A (311A) in the example shown in FIG. 37, it does not necessarily need to be in contact with the front-side trench 223A (311A) as shown in Part A of FIG. 39. As shown in Part A of FIG. 39, in the case where the length in the direction perpendicular to the back surface of the backside trench 223B and the backside trench 311B are short, the manufacturing is easy and damage to semiconductor substrate is less. Further, in Part A of FIG. 39, the front-side trench 223A and the front-side trench 311A do not necessarily need to be formed.

Further, as shown in Part B of FIG. 39, the front-side trench 223A and the front-side trench 311A are not formed, and the length in the depth direction of the backside trench 223B and the backside trench 311B may differ. In this case, the separation performance of the backside trench 223B and the backside trench 311B can be made different.

Further, as shown in Part C of FIG. 39, the front-side trench 311A does not necessarily need to be formed. In this case, the PDs 291 having the color filters 231 of the same color in the same phase difference detection pixel 270 are not completely separated. Further, it does not necessarily need to form not only the front-side trench 223A but also the front-side trench 331A.

Further, as shown in Part D of FIG. 39, the front-side trench 223A and the front-side trench 311A may be formed of metal. In this case, the light that is transmitted through the oxide film of the backside trench 223B (311B) is reflected by the front-side trench 223A (311A), and the loss of sensitivity is further suppressed.

Note that in the case where the front-side trench 111A (112A, 113A, 222A, 223A, 351A) and the backside trench 111B (112B, 113B, 222B, 223B, 351B) are formed of a material having a low transmittance such as a metal-based material and polysilicon, a connecting portion for fixing the potential is provided in the front-side trench 111A (112A, 113A, 222A, 223A, 351A) and the backside trench 111B (112B, 113B, 222B, 223B, 351B).

Further, although the phase difference detection pixels 190(270) are arranged in an array in the pixel area 181 in the second and third embodiments, not only the phase difference detection pixels 190 (270) but also normal pixels may be arranged.

Figure 40:
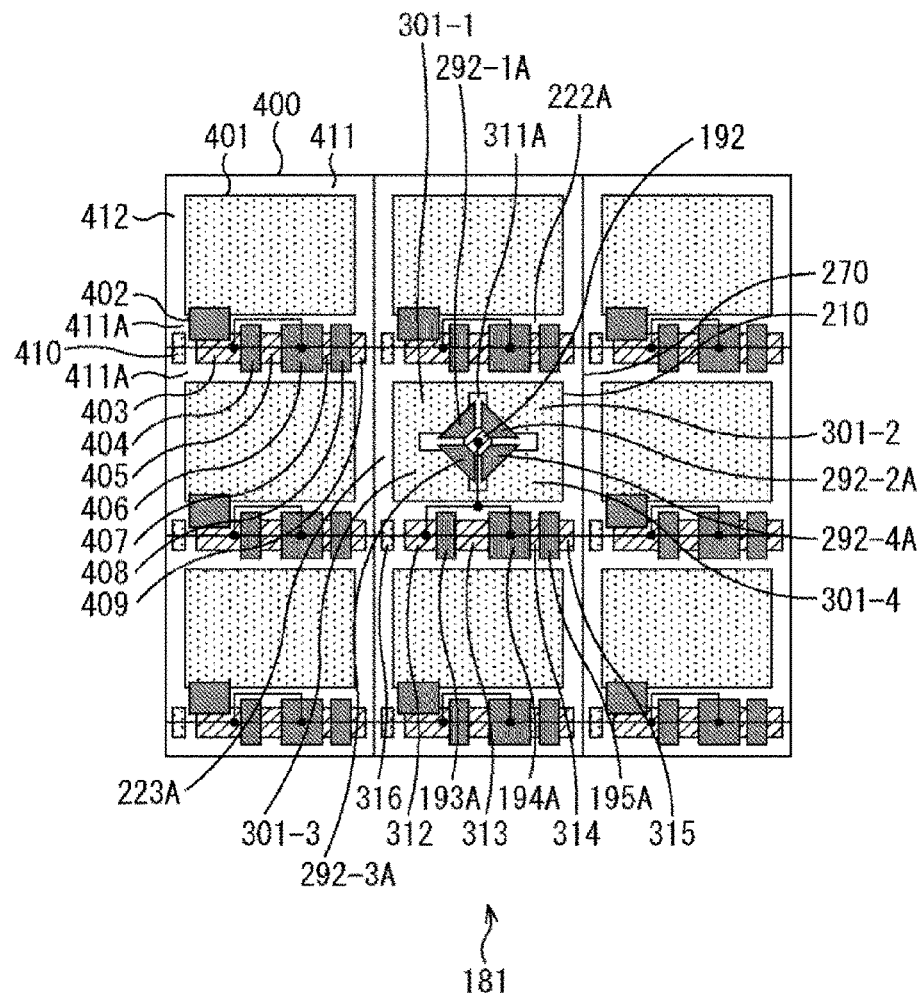
FIG. 40 is a diagram showing another configuration example of the pixel area as seen from the side of the front surface of the CMOS image sensor.

For example, as shown in FIG. 40, the phase difference detection pixel 270 may be arranged only at the center of the pixel area 181, and normal pixels 400 may be arranged in another area. Note that FIG. 40 is a diagram showing 3×3 pixels 400 with the center of the pixel area 181 as the center or the area the phase difference detection pixel 270 as seen from the side of the front surface of the CMOS image sensor.

In a P-type impurity 401 that is a well of the normal pixel 400, a PD is formed. The P-type impurity 401 is connected to a PD 403 formed of an N-type impurity via a gate electrode 402 of a transfer transistor. The PD 403 is connected to an N-type impurity 405 that is connected to a power supply electrode via a gate electrode 404 of a reset transistor, and is connected to a gate electrode 406 of an amplification transistor.

The N-type impurity 405 is connected to an N-type impurity 407 that forms a drain of a selection transistor via a gate electrode 406 of an amplification transistor, and the N-type impurity 407 is connected to an N-type impurity 409 connected to the vertical signal line 183 via a gate electrode 408 of a selection transistor. Further, in the pixel 400, a P-type impurity 410 connected to a well electrode is formed.

Between the P-type impurities 401 adjacent in the perpendicular direction across the pixel 400, a pixel separation wall 411 that sandwich the FD 403, the N-type impurity 405, the N-type impurity 407, the N-type impurity 409, and the P-type impurity 410 is formed. Further, between the P-type impurities 401 adjacent in the horizontal direction, a pixel separation wall 412 is formed.

The pixel separation wall 411 is configured similarly to the above-mentioned pixel separation wall 112 (222, 351), and the pixel separation wall 412 is configured similarly to the above-mentioned pixel separation wall 113 (223), for example.

The reading of the phase difference detection pixel 270 is performed in units of PDs 291 with the reading of the other pixels 400 in the row of the phase difference detection pixel 270. Therefore, by performing image plane phase difference AF on the basis of the pixel signal of each PD 291 and summing up the pixel signals of all the PDs 291 when acquiring the pixel signal of the pixel 400, it is possible to acquire the pixels signal of the entire phase difference detection pixel 270.

Note that the sizes of the P-type impurity 210 and the P-type impurity 401 are the same. Then, in the phase difference detection pixel 270, the PD 291 is formed for each area obtained by dividing the P-type impurity 210 into four areas. In the pixel 400, the PD is formed as it is in the P-type impurity 210.

Therefore, the size of the entire PD 291 of the phase difference detection pixel 270 is smaller than the size of the PD of the pixel 400, and the amount of saturated charges in the phase difference detection pixel 270 is smaller than that in the pixel 400. Therefore, in the phase difference detection pixel 270, color mixture is more likely to occur than the pixel 400, but the color mixture is prevented by the pixel separation wall 222 and the pixel separation wall 223.

Fourth Embodiment (Configuration Example of One Embodiment of Imaging Apparatus)

FIG. 41 is a block diagram showing a configuration example of an embodiment of an imaging apparatus as an electronic apparatus to which the present disclosure is applied.

An imaging apparatus 1000 shown in FIG. 41 is a video camera, a digital still camera, or the like. The imaging apparatus 1000 includes a lens group 1001, a solid-state image pickup device 1002, a DSP circuit 1003, a frame memory 1004, a display unit 1005, a recording unit 1006, an operation unit 1007, and a power supply unit 1008. The DSP circuit 1003, the frame memory 1004, the display unit 1005, the recording unit 1006, the operation unit 1007, and the power supply unit 1008 are connected to each other via a bus line 1009.

The lens group 1001 takes in incident light (image light) from a subject and images it on an image pickup surface of the solid-state image pickup device 1002. The solid-state image pickup device 1002 is formed of the first to third embodiment of the above-mentioned image sensor. The solid-state image pickup device 1002 converts an amount of incident light imaged on the image pickup surface by the lens group 1001 into electric signals in a pixel unit and supplies the signals as pixel signals to the DSP circuit 1003.

The DSP circuit 1003 performs predetermined image processing on the pixel signal supplied from the solid-state image pickup device 1002, supplies the image signal after the image processing to the frame memory 1004 in units of frames, and causes the frame memory 1004 to temporarily store the image signal.

The display unit 1005 is constituted of a panel-type display apparatus such as a liquid crystal panel and an organic EL (Electro Luminescence) panel, and displays images on the basis of the pixel signal in units of frames temporarily stored in the frame memory 1004.

The recording unit 1006 is formed of, a DVD (Digital Versatile Disk), a flash memory, or the like, and reads and records the pixel signal in units of frames temporarily stored in the frame memory 1004.

The operation unit 1007 outputs operation instructions on various functions of the imaging apparatus 1000 on the basis of user operations. The power supply unit 1008 supplies power supply to the DSP circuit 1003, the frame memory 1004, the display unit 1005, the recording unit 1006, and the operation unit 1007 as appropriate.

The electronic apparatus to which the present technology is applied only needs to be an apparatus using a CMOS image sensor as an image capturing unit (photoelectric conversion unit), and is applicable to a portable terminal apparatus having an imaging function, a copier using a CMOS image sensor as an image reading unit, and the like, in addition to the imaging apparatus 1000.

<Use Example of CMOS Image Sensor>

FIG. 42 is a diagram showing a use example using the above-mentioned CMOS image sensor.

The above-mentioned CMOS image sensor can be used in various cases of sensing light such as visible light, infrared light, ultraviolet light, and X-rays as follows.

- An apparatus for photographing images to be viewed, such as a digital camera and a camera-equipped mobile apparatus
- An apparatus used for traffic purposes, such as a car-mounted camera that photographs front/rear/periphery/inside of an automobile, a surveillance camera that monitors running vehicles and roads, and a distance measurement sensor that measures distances among vehicles, for safe driving such as automatic stop, recognition of a driver's state, and the like An apparatus used in home electronics such as a TV, a refrigerator, and an air conditioner, for photographing gestures of users and executing apparatus operations according to the gestures An apparatus used for medical and healthcare purposes, such as an endoscope and an apparatus that performs blood vessel photographing by receiving infrared light An apparatus used for security purposes, such as a surveillance camera for crime-prevention purposes and a camera for person authentication purposes An apparatus used for beauty care purposes, such as a skin measurement apparatus that photographs skins and a microscope that photographs scalps An apparatus used for sports purposes, such as an action camera and a wearable camera for sports purposes An apparatus for agriculture purposes, such as a camera for monitoring a state of fields and crops Note that the effects described herein are merely examples and are not limited, and additional effects may be provided.

Further, embodiments of the present disclosure are not limited to the above-mentioned embodiments and various modifications can be made without departing from the essence of the present disclosure.

For example, although a well is a P-type impurity in the present specification, it may be an N-type impurity.

Further, the pixel separation walls 111 to 113 in the first embodiment may be respectively configured similarly to the divided pixel separation wall 221 (311), the pixel separation wall 222 (351), and the pixel separation wall 223 in the second or third embodiment.

It should be noted that the present technology may take the following configurations.

(1)

A solid-state image pickup device, including:

a plurality of pixels that perform photoelectric conversion on light, the light entering the respective pixels from a back surface of the solid-state image pickup device via different lenses for each pixel;

a pixel separation wall formed between the pixels adjacent to each other; and a wiring layer provided on a front surface of the solid-state image pickup device, in which the pixel separation wall includes a front-side trench formed from the front surface and a backside trench formed from the back surface.

(2)

The solid-state image pickup device according to (1) above, in which at least a part of the front-side trench and at least a part of the backside trench of the pixel separation wall are in contact with each other.

(3)

The solid-state image pickup device according to (1) or (2) above, in which lengths of the front-side trench and the backside trench in a direction perpendicular to the back surface differ depending on a position of the pixel separation wall including the corresponding front-side trench and the corresponding backside trench.

(4)

The solid-state image pickup device according to any one of (1) to (3) above, in which a material of at least one of the front-side trench and the backside trench differs depending on a position of the pixel separation wall including the corresponding front-side trench and the corresponding backside trench.

(5)

The solid-state image pickup device according to any one of (1) to (4) above, in which the pixel separation wall between the pixels adjacent in a predetermined direction includes two front-side trenches and the backside trench, the two front-side trenches sandwiching a well electrode, no floating diffusion being shared by the pixels, and a position on the back surface of the backside trench corresponds to a position of the well electrode.

(6)

The solid-state image pickup device according to any one of (1) to (4) above, in which the pixel separation wall between the pixels adjacent in a predetermined direction includes two front-side trenches and the backside trench, the two front-side trenches sandwiching a power supply electrode, no floating diffusion being shared by the pixels, and a position on the back surface of the backside trench corresponds to a position of the power supply electrode.

(7)

The solid-state image pickup device according to any one of (1) to (4) above, in which the pixel separation wall between the pixels sharing a floating diffusion includes the front-side trench and the backside trench, the front-side trench being formed in an area on the front surface between the pixels, no floating diffusion being formed in the area, the backside trench being formed in the entire area on the back surface between the pixels, and the front-side trench and the backside trench are in contact with each other.

(8)

The solid-state image pickup device according to (1) above, in which at least a part of the plurality of pixels is divided into a plurality of divided pixels for each pixel, each divided pixel including a photoelectric conversion device that performs photoelectric conversion on light, the light entering the respective divided pixels from the back surface via the same lens, and a divided pixel separation wall including a front-side trench formed from the front surface and a backside trench formed from the back surface is formed between the adjacent divided pixels.

(9)

The solid-state image pickup device according to (8) above, in which lengths of the front-side trench and the backside trench in a direction perpendicular to the back surface differ depending on a position of the pixel separation wall or the divided pixel separation wall including the corresponding front-side trench and the corresponding backside trench.

(10)

The solid-state image pickup device according to (8) or (9) above, in which lengths of the backside trench of the pixel separation wall and the backside trench of the divided pixel separation wall in a direction perpendicular to the back surface differ.

(11)

The solid-state image pickup device according to any one of (8) to (10) above, in which a material of at least one of the front-side trench and the backside trench differs depending on a position of the pixel separation wall or the divided pixel separation wall including the corresponding front-side trench and the corresponding backside trench.

(12)

The solid-state image pickup device according to any one of (8) to (11) above, in which materials of the backside trenches of the pixel separation wall and the divided pixel separation wall differ.

(13)

The solid-state image pickup device according to any one of (8) to (12) above, in which the front-side trench of the divided pixel separation wall is formed only in a part of areas on the front surface between the adjacent divided pixels, the backside trench is formed in the entire area on the back surface between the adjacent divided pixels, the backside trench and the front-side trench of the divided pixel separation wall are in contact with each other, and a floating diffusion is formed in an area on the front surface between the adjacent divided pixels, no front-side trench being formed in the area.

(14)

The solid-state image pickup device according to any one of (8) to (12) above, in which the front-side trench of the divided pixel separation wall is formed in an area on the front surface between the adjacent divided pixels, no floating diffusion being formed in the area, the backside trench is formed in the entire area of the back surface between the adjacent divided pixels, a part of the front-side trench and the backside trench of the divided pixel separation wall are in contact with each other, and a length of a different part of the front-side trench of the divided pixel separation wall in a direction perpendicular to the back surface is shorter than that of the part of the front-side trench.

(15)

The solid-state image pickup device according to any one of (8) to (14) above, in which the pixel separation wall between the pixels adjacent in a predetermined direction includes two front-side trenches and two backside trenches, the two front-side trenches sandwiching a power supply electrode, the two backside trenches being in contact with the corresponding front-side trenches.

(16)

The solid-state image pickup device according to any one of (8) to (14) above, further including:

an electrode trench that is a front-side trench formed to sandwich a power supply electrode between the front-side trench itself and the front-side trench of the pixel separation wall between the pixels adjacent in a predetermined direction; and a dummy trench that is a dummy front-side trench formed at a position symmetrical to the electrode trench with respect to the divided pixel separation wall closest to the electrode trench, in which the front-side trench is in contact with the backside trench to form the pixel separation wall.

(17)

The solid-state image pickup device according to any one of (8) to (16) above, in which a position of the divided pixel separation wall in the pixel in which the divided pixel separation wall is formed differs depending on a position of the pixel.

(18)

The solid-state image pickup device according to (17) above, in which a position of the backside trench of the divided pixel separation wall in the pixel in which the divided pixel separation wall is formed differs depending on the position of the pixel, a position of the front-side trench of the divided pixel separation wall in the pixel in which the divided pixel separation wall is formed is the same regardless of the position of the pixel, and a size on the side of the front surface of the photoelectric conversion device of the divided pixel is larger than that on the side of the back surface.

(19)

The solid-state image pickup device according to any one of (8) to (14) above, further including an electrode trench that is a front-side trench formed to sandwich a power supply electrode between the front-side trench itself and the front-side trench of the pixel separation wall between the pixels adjacent in a predetermined direction, in which one of the adjacent pixels includes the electrode trench of the pixel itself and the other pixel, and the front-side trench is in contact with the backside trench to form the pixel separation wall.

(20)

An electronic apparatus, including:

a solid-state image pickup device including a plurality of pixels that perform photoelectric conversion on light, the light entering the respective pixels from a back surface of the solid-state image pickup device via different lenses for each pixel, a pixel separation wall formed between the pixels adjacent to each other, and a wiring layer provided on a front surface of the solid-state image pickup device, in which the pixel separation wall includes a front-side trench formed from the front surface and a backside trench formed from the back surface.

REFERENCE SIGNS LIST

50 CMOS image sensor
71-1 to 71-4 pixel
72 FD
76 power supply electrode
77 well electrode
111 to 113 pixel separation wall
111A to 113A front-side trench
111B to 113B backside trench
119 wiring layer
122 on-chip lens
180 CMOS image sensor
190 phase difference detection pixel
191-1, 191-2 divided pixel
192 FD
197 power supply electrode
198 well electrode
201-1, 201-2 PD
221 divided pixel separation wall
221A front-side trench
221B backside trench
222, 223 pixel separation wall 222A, 223A front-side trench
222B, 223B backside trench
230 wiring layer
232 on-chip lens
271-1 to 271-4 pixel
291-1 to 291-4 PD
311 divided pixel separation wall
311A front-side trench
311B backside trench
322, 323 front-side trench
351 pixel separation wall
351A front-side trench
352 front-side trench
352, 353 front-side trench

The invention claimed is:

1. A solid-state image pickup device, comprising:
a plurality of pixels that perform photoelectric conversion on light, the light entering the respective pixels from a back surface of the solid-state image pickup device via different lenses for each pixel, wherein at least some of the pixels in the plurality of pixels are phase difference detection pixels;
a wiring layer provided on a front surface of the solid-state image pickup device, wherein each phase difference detection pixel includes:
a first photoelectric conversion device;
a second photoelectric conversion device;
a divided pixel separation wall extending between at least portions of the first photoelectric conversion device and the second photoelectric conversion device; and
a floating diffusion,
wherein the divided pixel separation wall includes a front-side trench formed from the front surface and a backside trench formed from the back surface.

2. The solid-state image pickup device according to claim 1, wherein at least a part of the front-side trench and at least a part of the backside trench of the divided pixel separation wall are in contact with each other.

3. The solid-state image pickup device according to claim 1, wherein lengths of the front-side trench and the backside trench in a direction perpendicular to the back surface differ depending on a position of the divided pixel separation wall including the corresponding front-side trench and the corresponding backside trench.

4. The solid-state image pickup device according to claim 1, wherein a material of at least one of the front-side trench and the backside trench differs depending on a position of the pixel separation wall including the corresponding front-side trench and the corresponding backside trench.

5. The solid-state image pickup device according to claim 1, further comprising:
a pixel separation wall formed between adjacent pixels, wherein the pixel separation wall between the adjacent pixels, in a predetermined direction, includes two front-side trenches and the backside trench, the two front-side trenches sandwiching a well electrode, no floating diffusion being shared by the pixels, and a position on the back surface of the backside trench corresponds to a position of the well electrode.

6. The solid-state image pickup device according to claim 1, further comprising:
a pixel separation wall formed between adjacent pixels, wherein the pixel separation wall between the adjacent pixels in a predetermined direction, includes two front-side trenches and the backside trench, the two front-side trenches sandwiching a power supply electrode, no floating diffusion being shared by the pixels, and a position on the back surface of the backside trench corresponds to a position of the power supply electrode.

7. The solid-state image pickup device according to claim 1, wherein the front-side trench is not formed in an area including the floating diffusion.

8. The solid-state image pickup device according to claim 1, wherein lengths of the front-side trench and the backside trench in a direction perpendicular to the back surface differ depending on a position of a pixel separation wall between adjacent pixels or the divided pixel separation wall including the corresponding front-side trench and the corresponding backside trench.

9. The solid-state image pickup device according to claim 1, wherein lengths of the backside trench of the pixel separation wall and the backside trench of the divided pixel separation wall in a direction perpendicular to the back surface differ.

10. The solid-state image pickup device according to claim 1, wherein a material of at least one of the front-side trench and the backside trench differs depending on a position of the pixel separation wall or the divided pixel separation wall including the corresponding front-side trench and the corresponding backside trench.

11. The solid-state image pickup device according to claim 1, wherein materials of the backside trenches of the pixel separation wall and the divided pixel separation wall differ.

12. The solid-state image pickup device according to claim 1, wherein
the front-side trench of the divided pixel separation wall is formed only in a part of areas on the front surface between the adjacent divided pixels,
the backside trench is formed in the entire area on the back surface between the adjacent divided pixels,
the backside trench and the front-side trench of the divided pixel separation wall are in contact with each other, and
a floating diffusion is formed in an area on the front surface between the adjacent divided pixels, no front-side trench being formed in the area.

13. The solid-state image pickup device according to claim 1, wherein
the front-side trench of the divided pixel separation wall is formed in an area on the front surface between the adjacent divided pixels, no floating diffusion being formed in the area,
the backside trench is formed in the entire area of the back surface between the adjacent divided pixels,
a part of the front-side trench and the backside trench of the divided pixel separation wall are in contact with each other, and
a length of a different part of the front-side trench of the divided pixel separation wall in a direction perpendicular to the back surface is shorter than that of the part of the front-side trench.

14. The solid-state image pickup device according to claim 1, wherein a pixel separation wall between pixels adjacent in a predetermined direction includes two front-side trenches and two backside trenches, the two front-side trenches sandwiching a power supply electrode, the two backside trenches being in contact with the corresponding front-side trenches.

15. The solid-state image pickup device according to claim 1, further comprising:

an electrode trench that is a front-side trench formed to sandwich a power supply electrode between the front-side trench itself and the front-side trench of the pixel separation wall between pixels adjacent in a predetermined direction; and a dummy trench that is a dummy front-side trench formed at a position symmetrical to the electrode trench with respect to the divided pixel separation wall closest to the electrode trench, wherein the front-side trench is in contact with the backside trench to form the pixel separation wall.

16. The solid-state image pickup device according to claim 1, wherein a position of the divided pixel separation wall in the pixel in which the divided pixel separation wall is formed differs depending on a position of the pixel.

17. The solid-state image pickup device according to claim 16, wherein
a position of the backside trench of the divided pixel separation wall in the pixel in which the divided pixel separation wall is formed differs depending on the position of the pixel,
a position of the front-side trench of the divided pixel separation wall in the pixel in which the divided pixel separation wall is formed is the same regardless of the position of the pixel, and
a size on the side of the front surface of the photoelectric conversion device of the divided pixel is larger than that on the side of the back surface.

18. The solid-state image pickup device according to claim 1, further comprising
an electrode trench that is a front-side trench formed to sandwich a power supply electrode between the front-side trench itself and the front-side trench of the pixel separation wall between the pixels adjacent in a predetermined direction, wherein
one of the adjacent pixels includes the electrode trench of the pixel itself and the other pixel, and
the front-side trench is in contact with the backside trench to form the pixel separation wall.

19. The solid-state image pickup device according to claim 1, each phase difference detection pixel further comprising:
a shared on-chip lens.

20. An electronic apparatus, comprising:
a solid-state image pickup device including
a plurality of pixels that perform photoelectric conversion on light, the light entering the respective pixels from a back surface of the solid-state image pickup device via different lenses for each pixel,
wherein at least some of the pixels in the plurality of pixels are phase difference detection pixels; and
a wiring layer provided on a front surface of the solid-state image pickup device, wherein each phase difference detection pixel includes:

a first photoelectric conversion device;
a second photoelectric conversion device;
a divided pixel separation wall extending between at least portions of the first photoelectric conversion device and the second photoelectric conversion device; and
a floating diffusion, wherein the divided pixel separation wall includes a front-side trench formed from the front surface and a backside trench formed from the back surface.

21. A solid-state image pickup device, comprising:
a plurality of pixels that perform photoelectric conversion on light, the light entering the respective pixels from a back surface of the solid-state image pickup device via different lenses for each pixel;
a pixel separation wall formed between the pixels adjacent to each other; and
a wiring layer provided on a front surface of the solid-state image pickup device, wherein
the pixel separation wall includes a front-side trench formed from the front surface and a backside trench formed from the back surface, wherein the pixel separation wall between the pixels adjacent in a predetermined direction includes two front-side trenches and the backside trench, the two front-side trenches sandwiching a well electrode, no floating diffusion being shared by the pixels, and a position on the back surface of the backside trench corresponds to a position of the well electrode.

22. A solid-state image pickup device, comprising:
a plurality of pixels that perform photoelectric conversion on light, the light entering the respective pixels from a back surface of the solid-state image pickup device via different lenses for each pixel;
a pixel separation wall formed between the pixels adjacent to each other; and
a wiring layer provided on a front surface of the solid-state image pickup device, wherein
the pixel separation wall includes a front-side trench formed from the front surface and a backside trench formed from the back surface, wherein at least a part of the plurality of pixels is divided into a plurality of divided pixels for each pixel, each divided pixel including a photoelectric conversion device that performs photoelectric conversion on light, the light entering the respective divided pixels from the back surface via the same lens, and a divided pixel separation wall including a front-side trench formed from the front surface and a backside trench formed from the back surface is formed between the adjacent divided pixels.

* * * * *